United States Patent
Ushiku et al.

(10) Patent No.: US 7,413,914 B2
(45) Date of Patent: Aug. 19, 2008

(54) METHOD AND APPARATUS FOR MANUFACTURING SEMICONDUCTOR DEVICE, METHOD AND APPARATUS FOR CONTROLLING THE SAME, AND METHOD AND APPARATUS FOR SIMULATING MANUFACTURING PROCESS OF SEMICONDUCTOR DEVICE

(75) Inventors: Yukihiro Ushiku, Yokohama (JP); Mitsutoshi Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 10/108,790

(22) Filed: Mar. 29, 2002

(65) Prior Publication Data
US 2002/0180449 A1 Dec. 5, 2002

(30) Foreign Application Priority Data
Mar. 30, 2001 (JP) ............................. 2001-102459

(51) Int. Cl.
*H01L 21/66* (2006.01)
*G01R 31/26* (2006.01)
(52) U.S. Cl. .................... 438/14; 438/765; 118/665; 118/677; 257/E21.552; 257/E21.529
(58) Field of Classification Search ................... 438/14, 438/16, 765; 374/9, 132, 126; 118/665, 118/588, 677, 712, 641, 64; 257/E21.552; 257/E21.529
See application file for complete search history.

(56) References Cited

U.S. PATENT DOCUMENTS

| | | | | | |
|---|---|---|---|---|---|
| 5,659,467 A | * | 8/1997 | Vickers | .................. | 364/138 |
| 5,691,895 A | * | 11/1997 | Kurtzberg et al. | ............. | 700/29 |
| 5,710,700 A | * | 1/1998 | Kurtzberg et al. | ............. | 700/29 |
| 5,967,661 A | * | 10/1999 | Renken et al. | ............. | 374/126 |
| 6,056,434 A | * | 5/2000 | Champetier | .................. | 374/126 |
| 6,496,749 B1 | * | 12/2002 | Yamaguchi et al. | ......... | 700/121 |
| 6,587,744 B1 | * | 7/2003 | Stoddard et al. | ............ | 700/121 |
| 6,627,463 B1 | * | 9/2003 | Sarfaty | .......................... | 438/7 |
| 6,783,080 B2 | * | 8/2004 | Antoniou et al. | .......... | 236/78 D |
| 2001/0042509 A1 | * | 11/2001 | Wollesen | ..................... | 118/715 |
| 2003/0055523 A1 | * | 3/2003 | Bunkofske et al. | .......... | 700/108 |

FOREIGN PATENT DOCUMENTS

| | | |
|---|---|---|
| JP | 03-171301 | 7/1991 |
| JP | 08-017743 | 1/1996 |

(Continued)

OTHER PUBLICATIONS

Notification of Reasons for Rejection in JP Patent App. No. 2001-102459, Notice Date of Jun. 12, 2006.

(Continued)

*Primary Examiner*—Caridad Everhart
(74) *Attorney, Agent, or Firm*—Finnegan, Henderson, Farabow, Garrett & Dunner, L.L.P.

(57) ABSTRACT

A process of manufacturing a semiconductor device utilizing a thermo-chemical reaction is started based on preset initial settings, a state function of an atmosphere associated with the thermo-chemical reaction is measured, a state of the atmosphere and a change thereof are analyzed based on measurement data obtained by the measurement, and then, analysis data obtained by the analysis is fed back to a manufacturing process.

53 Claims, 26 Drawing Sheets

FOREIGN PATENT DOCUMENTS

| | | |
|---|---|---|
| JP | 8-55145 | 2/1996 |
| JP | 08031707 A * | 2/1996 |
| JP | 11-40321 | 2/1999 |
| JP | 11-286782 | 10/1999 |
| JP | 11-288856 | 10/1999 |
| JP | 2000-349076 | 12/2000 |

OTHER PUBLICATIONS

Notification of Reasons for Rejection in JP Patent App. No. 2001-102459, Notice Date of Sep. 7, 2006.

* cited by examiner

METHOD AND APPARATUS FOR MANUFACTURING SEMICONDUCTOR DEVICE, METHOD AND APPARATUS FOR CONTROLLING THE SAME, AND METHOD AND APPARATUS FOR SIMULATING MANUFACTURING PROCESS OF SEMICONDUCTOR DEVICE

CROSS-REFERENCE TO RELATED APPLICATIONS

This application is based upon and claims the benefit of priority from the prior Japanese Patent Application No. 2001-102459, filed Mar. 30, 2001, the entire contents of which are incorporated herein by reference.

BACKGROUND OF THE INVENTION

1. Field of the Invention

The present invention relates to a so-called hot process technique utilizing a thermo-chemical reaction of a manufacturing process of a semiconductor device. More particularly, the present invention relates to an apparatus for manufacturing a semiconductor device for use in a hot process, for example, an apparatus for manufacturing a semiconductor device such as an oxidization furnace, an annealing furnace, a CVD furnace, or an RTP furnace and an apparatus and method of controlling the same, a method of manufacturing a semiconductor device using the same, and a method and apparatus for simulating a manufacturing process of a semiconductor device.

2. Description of the Related Art

In recent years, with the miniaturization of a variety of electronic circuits provided in a semiconductor device, there has been a growing demand for improvement of precision in a process of manufacturing a semiconductor device. In particular, higher precision is demanded in a manufacturing process utilizing a thermo-chemical reaction generally called a hot process. This hot process includes the step of forming a variety of thin films such as an insulating film, or alternatively, adjusting a scattering length of distribution of impurities when the impurities are implanted in a semiconductor.

As an example of a general hot process, an oxidizing process carried out when a thin film such as an insulating film is formed on a semiconductor substrate will be described with reference to a flow chart shown in FIG. 32.

First, as initial settings, a variety of parameters such as, gas temperature, gas flow rate and oxidization time when oxidization processing is carried out are inputted to a control computer for controlling a state of the inside an oxidization furnace that serves as a processing chamber in which oxidization processing is carried out. After these parameters have been inputted, a start signal is inputted to the control computer, whereby the start signal is transmitted from the control computer to the oxidization furnace. Then, oxidization processing is started based on the initial settings. Specifically, a series of processes such as bringing a substrate into the oxidization furnace, increasing a temperature, maintaining a temperature, introducing oxidization gas, gas change, reducing a temperature, and bringing a substrate to the outside the oxidization furnace is carried out in accordance with the initial setting values and preset process sequence.

Having checked that these processes have been carried out smoothly in accordance with the process sequence, the control computer transmits a stop signal to the oxidization furnace. The oxidization furnace having received the stop signal terminates oxidization processing. Then, a film thickness monitor installed inside or outside the oxidization furnace checks whether or not the thus-formed thin film has a desired film thickness. When the thin film is formed to have the desired film thickness, next processing is carried out based on the initial settings identical to the previous settings. Otherwise, the previous initial settings are modified, and next processing is carried out.

In general, as the control precision for executing the hot process is higher, it becomes more difficult to ignore the effects of turbulence of the atmosphere inside or outside the processing chamber in which the hot process is carried out, which is a so called disturbance on precision of control. Namely, in order to execute the hot process to be controlled with high precision, it is required to properly set the process to a normal state considering an effect caused by such disturbance. The disturbance used here includes, for example, change in pressure, temperature, or humidity outside the processing chamber as well as change in pressure, temperature, or humidity of the inside the processing chamber to which the semiconductor device is exposed.

However, as described previously, an effect caused by such disturbance is not considered at all in settings to be provided in accordance with the process sequence in which a series of processes is predetermined. For example, when a series of oxidization processes is repeatedly carried out based on the same settings, i.e., when a series of oxidization processings is carried out in a so-called batch scheme, an effect of the previous batch processing upon the next batch processing is not considered at all. For example, the temperature in the oxidization furnace after the previous patch processing has an effect on a work of increasing or reducing the temperature of the inside the oxidization furnace when the next batch processing is carried out. Specifically, due to the heat remaining in the oxidization furnace after the previous batch processing, the actual temperature in the oxidization furnace while the next batch processing is carried out deviates from a target temperature initially set when the next batch processing is started.

In addition, irrespective of a processing scheme, if a voltage applied to the control computer slightly changes, a flow rate of gas to be introduced into the oxidization furnace is different from the set quantity. It is generally impossible to precisely control the above disturbance by using a control computer. In the above settings, a dispersion in film thickness caused by an uncontrollable disturbance of the inside the oxidization furnace is not considered at all. Similarly, a dispersion in film thickness caused by an uncontrollable disturbance of the outside the oxidization furnace such as atmospheric pressure is not considered at all.

In order to consider the effect of the disturbance on the film thickness of an insulating film or scattering of impurities, it is required to carry out computation or simulation concerning an oxidization reaction or deposition process, or alternatively, process of scattering impurities. As the art concerning a simulation apparatus for carrying out such simulation, there is disclosed the art of comparing actual manufacturing data with simulation data in inventions proposed in Jpn. Pat. Appln. KOKAI Publication No. 8-55145, or alternatively, in Jpn. Pat. Appln. KOKAI Publication No. 11-288856.

However, an object of comparing manufacturing data with simulating data carried out in the inventions of Jpn. Pat. Appln. KOKAI Publication No. 8-55145 or No. 11-288856 is to provide simulation itself with high precision or to obtain correlation with actual manufacturing data. Namely, both of these inventions are not considered in view of improving the precision of process control such as modifying the manufacturing conditions or manufacturing parameters in order to execute the manufacturing process in a normal state. In addition, neither of these inventions carries out computation assuming disturbance. Thus, it is impossible to carry out computation considering a dispersion caused by disturbance or an error caused by such disturbance. Therefore, of course, the inventions of Jpn. Pat. Appln. KOKAI Publication No. 8-55145 and No. 11-288856 fail to disclose a method of modifying a dispersion or error in film thickness caused by an uncontrollable disturbance inside or outside a processing system as a dispersion or error of each process.

BRIEF SUMMARY OF THE INVENTION

According to one aspect of the present invention, there is provided a semiconductor device manufacturing method comprising:

starting a process of manufacturing a semiconductor device utilizing a thermo-chemical reaction in a predetermined initial setting;

measuring a state function of an atmosphere associated with the thermo-chemical reaction;

analyzing a state of the atmosphere and a change thereof based on measurement data obtained by such measurement; and feeding analysis data obtained by such analysis back to the manufacturing process.

According to another aspect of the present invention, there is provided a semiconductor device manufacturing apparatus comprising:

a process carrying out section which carries out a process of manufacturing a semiconductor device utilizing a thermo-chemical reaction;

a process carrying out section controlling device which controls an operational state of the process carrying out section;

a measuring instrument which measures a state function of an atmosphere associated with the thermo-chemical reaction; and a process controlling device which analyzes the state of the atmosphere and a change thereof based on measurement data obtained by the measurement and which feeds analysis data obtained by the analysis back to the process carrying out section controlling device.

According to still another aspect of the present invention, there is provided a method of controlling a semiconductor device manufacturing apparatus comprising:

controlling a process carrying out section which carries out a process of manufacturing a semiconductor device utilizing a thermo-chemical reaction, thereby starting the manufacturing process based on predetermined initial settings, followed by feeding back to a control of the process carrying out section the measurement data obtained by measuring a state function of an atmosphere associated with the thermo-chemical reaction and the analysis data obtained by analyzing the state of the atmosphere and a change thereof based on the measurement data.

According to yet another aspect of the present invention, there is provided an apparatus for controlling a semiconductor device manufacturing apparatus comprising:

a process carrying out section controlling device which controls an operational state of a process carrying out section for carrying out a process of manufacturing the semiconductor device utilizing a thermo-chemical reaction; and a process controlling device which feeds back to the process carrying out section controlling device the measurement data obtained by measuring a state function of an atmosphere associated with the thermo-chemical reaction and the state of the atmosphere and a change thereof based on the measurement data.

According to a further aspect of the present invention, there is provided a method of simulating a process of manufacturing a semiconductor device comprising:

measuring a state function of an atmosphere associated with the thermo-chemical reaction, relevant to a process of manufacturing a semiconductor device utilizing the thermo-chemical reaction started based on predetermined initial settings, analyzing the state of the atmosphere and a change thereof based on measurement data obtained by the measurement; and carrying out simulation of the manufacturing process based on at least one of the analysis data obtained by the analysis and the measurement data.

According to a still further aspect of the present invention, there is provided an apparatus for simulating a process of manufacturing a semiconductor device comprising a simulator main body for carrying out simulation of the manufacturing process based on at least one of the measurement data obtained by measuring a state function of an atmosphere associated with the thermo-chemical reaction and analysis data obtained by analyzing the state of the atmosphere and a change thereof based on the measurement data, relevant to a process of manufacturing the semiconductor device utilizing the thermo-chemical reaction started based on preset initial settings.

DETAILED DESCRIPTION OF THE INVENTION

Hereinafter, preferred embodiments of the present invention will be described with reference to the accompanying drawings.

First Embodiment

Figure 1:
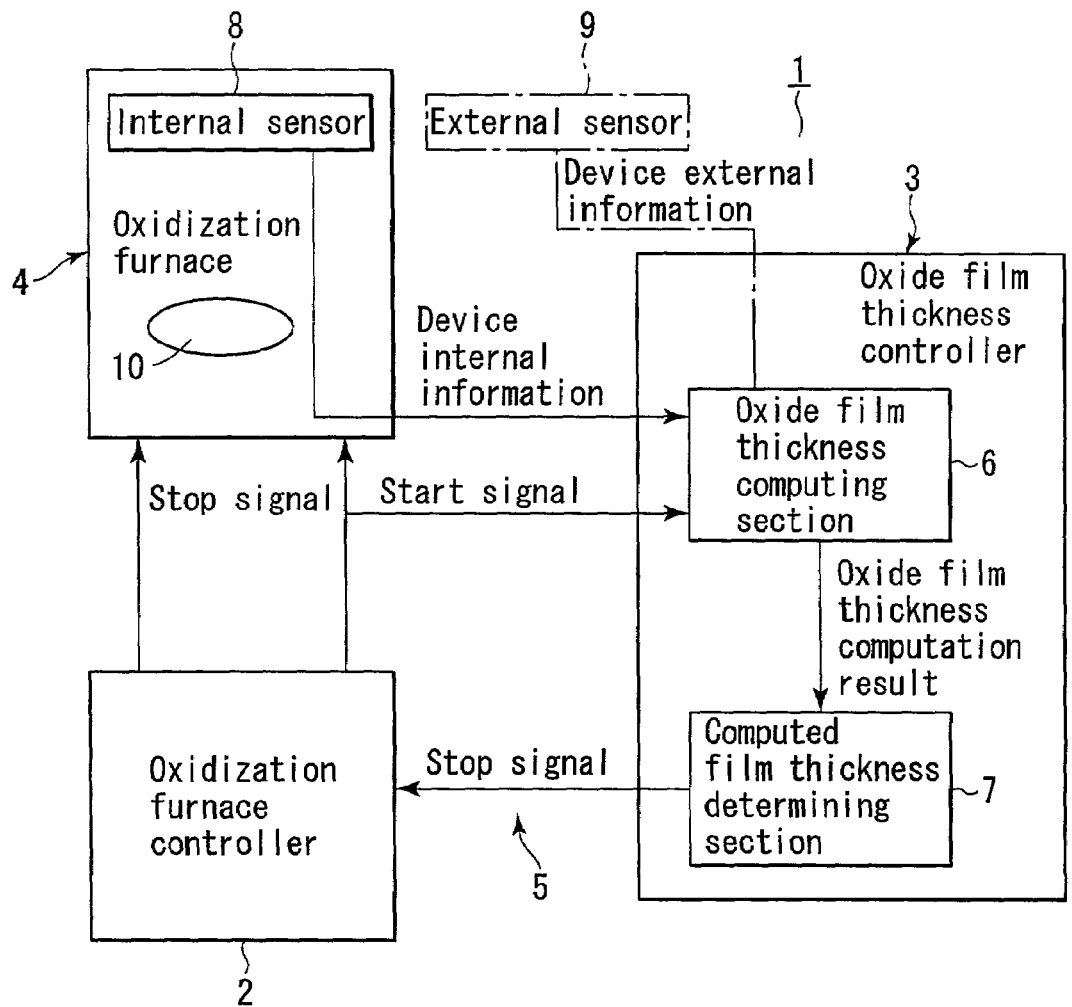
FIG. 1 is a block diagram schematically depicting essential constituent elements of a semiconductor device manufacturing apparatus according to a first embodiment.
Figure 2:
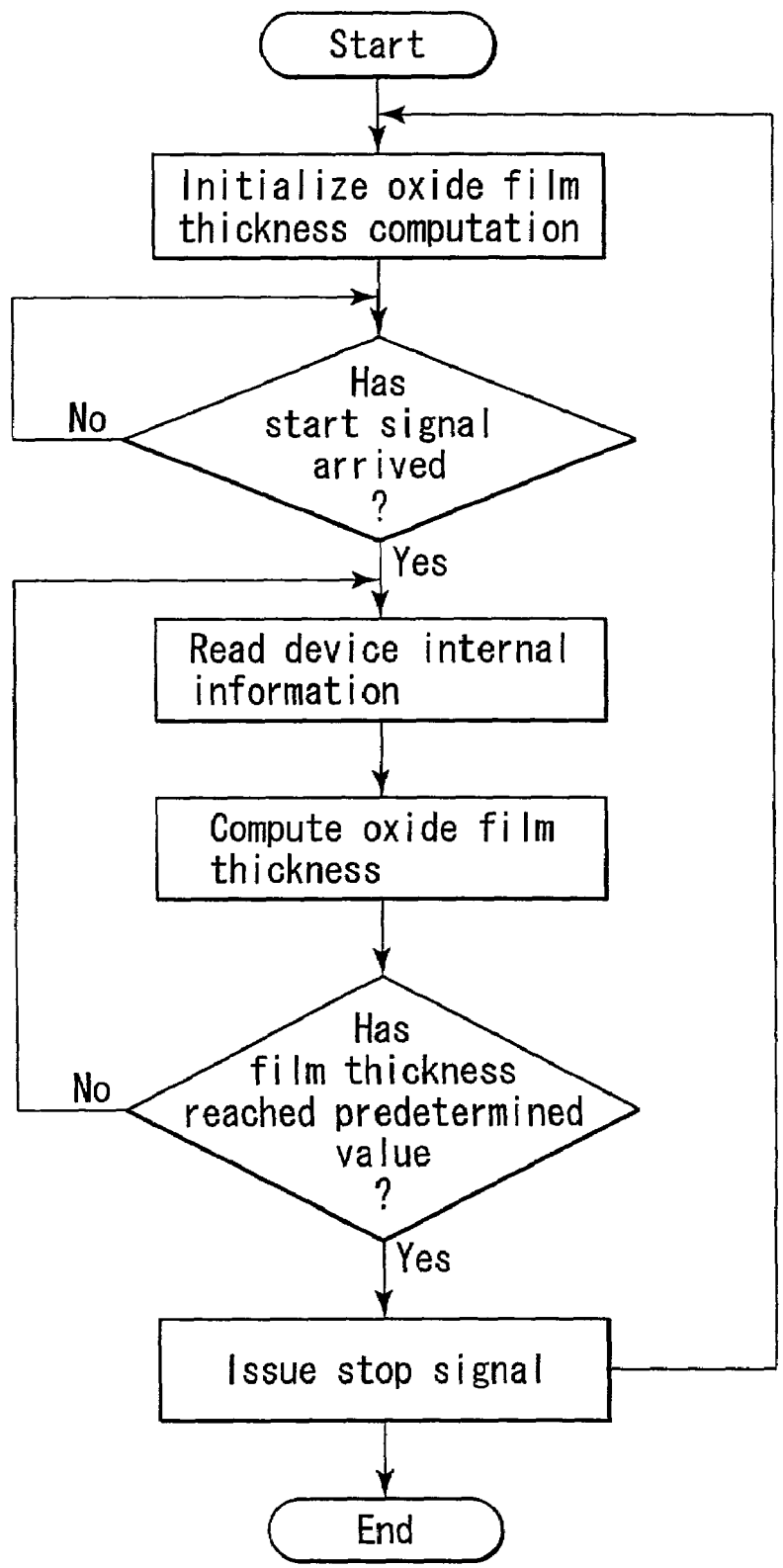
FIG. 2 is a flow chart showing a control procedure carried out by a process controlling device that the manufacturing apparatus of FIG. 1 comprises.

FIG. 1 is a block diagram schematically depicting essential constituent elements of an oxidization processing device 1 that serves as a semiconductor device manufacturing apparatus according to a first embodiment. FIG. 2 is a flow chart showing procedures for controlling an oxidization process carried out by a second oxidization film thickness controller 3 that serves as a process controlling device that the oxidization processing device 1 of FIG. 1 comprises.

As shown in FIG. 1, the oxidization processing device 1 comprises a process carrying out section 4 for carrying out a process of manufacturing a semiconductor device utilizing a thermo-chemical reaction, which is a so called hot process. The hot process of the present embodiment is provided as a film forming process of forming an oxide film (not shown) on a surface of a wafer 10 that serves as a target element to be processed. Therefore, the process carrying out section is provided as a so-called oxidization furnace 4. In addition, the oxidization processing device 1 comprises an oxidizing process controlling device 5 that serves as a controlling device of a semiconductor device manufacturing apparatus.

The oxidizing process controlling device 5 is composed of: an oxide film thickness controller 3; and an oxidization furnace controller 2 that serves as a process carrying out section controlling device that controls an operational state of the oxidization furnace 4. The oxide film thickness controller 3 has: an oxide film thickness computing section 6 having an oxide film thickness computing function and a computed film thickness determining section 7 having a computed film thickness determining function. In the present embodiment, although the oxide film thickness controller 3 is configured independently of the oxidization furnace controller 2, this controller 3 may be integrally configured by being incorporated thereinto as a part of its function.

In addition, in the present embodiment, a control for a hot process is described by showing an example of oxide film thickness control. However, the semiconductor device manufacturing apparatus 1 and its controlling device 5 can be applied to almost all of the semiconductor device manufacturing processes utilizing a thermo-chemical reaction, such as control for scattering length of impurities, deposited film thickness of a thin film due to CVD, nitriding quantity, melt quantity of, for example, a BPSG film (insulating film), density quantity of, for example, a CVD oxide film, and thickness of a silicide film (electrode). In addition, the semiconductor device manufacturing apparatus 1 and its controlling device 5 can be applied to either of a batch type apparatus and a sheet-fed type apparatus. This applies to all the embodiments of the present invention.

The oxidization furnace 4 is actuated under the control of the oxidization furnace controller 2. Preset oxidizing process sequences are incorporated in the oxidization furnace controller 2. At a predetermined timing set in the oxidizing process sequences, a start signal for starting oxidization processing is delivered from the oxidization furnace controller 2 to the oxide film thickness controller 3. The oxide film thickness controller 3 starts oxide film thickness computation by receiving this starting signal. Now, the above process will be described here in more detail.

The oxidization furnace controller 2 causes a computer to execute a series of oxide film forming processes such as carrying a wafer 10 into the oxidization furnace 4, increasing the temperature inside the oxidization furnace 4, and maintaining the set temperature in accordance with the preset oxidization process sequence. Then, the oxidization furnace controller 2 instructs a computer to introduce oxidizing gas into the oxidization furnace 4, and delivers the start signal to the oxide film thickness controller 3. In general, a time of introducing oxidizing gas is defined as a start timing. However, a timing of delivering the start signal can be set by changing it to a variety of states such as a time when the wafer 10 is carried into the oxidization furnace 4, a time before a temperature rises, or a time when the furnace internal temperature reaches a predetermined temperature.

The oxide film thickness controller 3 having received the start signal starts oxide film thickness computation. For this computation, measurement data measured by an internal sensor 8 that serves as a measuring instrument mounted in the oxidization furnace 4, i.e., various state functions of an atmosphere associated with the thermal reaction occurred in the oxidization furnace 4 is used as computational information. The internal sensor 8 is composed of: a thermometer composed, for example, of a plurality of thermocouples for measuring the temperature in the oxidization furnace 4, or alternatively, a flow meter for measuring a flow rate of gas introduced into the oxidization furnace 4 and the like. A state of the inside the oxidization furnace 4 is computed in accordance with a general computation model shown in formula (1) below, for example.

$$(T_{ox}^2 - \tau^2)/B = t - (B/A)(T_{ox} - \tau) \qquad (1)$$

In formula (1), Tox is an oxide film thickness, $\tau$ is an initial film thickness, "t" is a time, A is a primary coefficient ($\mu$m), B is a secondary coefficient ($\mu m^2$/min), and B/A is a primary coefficient ($\mu$m/min). For example, $\tau$ is 15 nm, B/A is $5 \times 10^{-6}$ $\mu$m/min, and B is $8 \times 10^{-6}$ $\mu m^2$/min.

Items of information such as internal temperature and gas flow rate inside the oxidization furnace 4 that change from time to time are stored (read) in a storage device (not shown) by carrying out measurement with a predetermined interval preset in the oxidization process sequence, for example, with an interval of 1 second. An increase in oxide film thickness per second is computed by using these values each, and the computed increase is accumulated, thereby making it possible to compute the film thickness of the oxide film formed on the wafer 10 in a predetermined time. In this manner, while the present internal temperature and gas flow rate of the oxidization furnace 4 are defined as presumed conditions, a change in these conditions, i.e., a change in oxide film thickness caused by disturbance can be considered. This change has not been considered in an oxidization process in the method of manufacturing a semiconductor device that has been carried out in the prior art.

An interval with which information on the atmosphere in the oxidization furnace 4 is measured and stored has been defined as 1 second in the foregoing description for the following reason. For example, when an attempt is made to control oxide film thickness to be formed within a tolerance of $\pm 0.2$ nm, at least a time interval of $\pm 2$ seconds is substantially required for forming the oxide film within such a range in a general oxide film forming process. Namely, when an attempt is made to form oxide film thickness with a precision of $\pm 0.2$ nm, it is required to control an operational state of the oxidization furnace 4 within $\pm 2$ seconds. In addition, as described previously, an interval (sampling rate) with which information on the atmosphere in the oxidization furnace 4 is measured and stored has been defined as 1 second. This is because a shorter sampling rate has been set considering a time required for transmission of the information on the inside the apparatus in order to provide a margin so as not to degrade computational precision.

The computation result of oxide film thickness, i.e., analysis data is delivered to the computed film thickness determining section 7. At a time when the computed film thickness has reached the preset normalized film thickness for the oxidization process sequence, for example, 60 nm, a stop signal is delivered from the oxide film thickness controller 3 to the oxidization furnace controller 2 in order to stop the oxidization process of the oxidization furnace 4. The oxidization furnace controller 2 having received this stop signal delivers the stop signal to the oxidization furnace 4, and stops the oxidization process.

More specifically, the oxidization furnace controller 2 issues to the oxidization furnace 4 an interrupt instruction for "terminating a process sequence for supplying oxidizing gas, and then, changing the process to a next process sequence for supplying inert gas". This timing can be set before the computed film thickness reaches the normalized film thickness. In reality, after the stop signal has been issued, the gas is not switched momentously until oxidization has terminated. Thus, the wafer 10 is oxidized slightly more significantly than the set value. Considering this excessive oxidization, a value slightly smaller than target film thickness (normalized film thickness) is set as the film thickness when oxidization terminates.

After oxidizing gas has been changed to inert gas, the oxidization furnace controller 2 delivers to the oxidization furnace 4 a variety of signals for instructions for reducing a temperature and bringing the wafer 10 out in accordance with preset oxidization process sequence. The oxidization furnace 4 having received these signals each executes predetermined processing based on the signals each, and the oxidization process terminates.

As described previously, a change in oxide film thickness on the basis of a series of oxidization processes (run and batch processing) is computed considering a change or fluctuation of the atmosphere in the oxidization furnace 4 such as a temperature or gas flow rate in the furnace that has not been successfully controlled in the prior art. That is, the oxidization processing device 1 comprising the oxidization process controlling device 5 and the control method of the present embodiment are applied, thereby making it possible to carry out oxide film thickness computation considering a change in atmosphere. In addition, analysis data as the computation result is fed back to a next oxidization process, thereby enabling oxide film thickness control which is hardly affected by a change in atmosphere in the oxidization furnace 4, i.e., robust oxide film thickness control against disturbance.

Finally, an oxide film having a substantially uniform film thickness, of which the film thickness of an oxide film formed is almost equal to a desired film thickness whether in the presence or absence of disturbance, can be formed by this oxidization processing device 1.

Now, computation executed in the oxide film thickness controller 3 in the present embodiment will be described with the flow chart shown in FIG. 2.

First, initialization of oxide film thickness computation is carried out. In this case, a computation start time "t" is set to 0, and the initial film thickness τ is set to 15 nm. Next, a so-called ready state in which a computer waits for a start signal from the oxidization furnace controller 2 is established. When the start signal from the oxidization furnace controller 2 is received, device internal information is received together, and a first oxidization computation is carried out. At this time, it is determined whether or not the oxidization computation film thickness exceeds a normalized value, i.e., 60 nm. If it does not exceed, one second after the first internal information acquisition, internal information is acquired again, and a second oxidization computation is carried out. Subsequently, such processing is repeated. When the oxidization computation film thickness exceeds 60 nm, a stop signal is delivered from the oxide film thickness controller 3 to the oxidization furnace controller 2. Then, processing reverts to a state identical to the start of processing. In this case, assume that control is made with a time interval of 1 second. The information on the inside the oxidization furnace 4 is acquired with a time interval of 1 second for the reason stated previously. This interval will suffice in current apparatus technology when precise film thickness computation is carried out.

In the foregoing description, although oxide film thickness control has been exemplified, the present embodiment can be applied to control of a scattering length of impurities, for example. In this case, general scattering formula (2) shown below may be used instead of formula (1).

$$\frac{\partial c}{\partial t} = D \frac{\partial^2 c}{\partial x^2} \quad (2)$$

In formula (2), C is a concentration of impurities at a time "t" and a position "x", and D is a scattering coefficient having temperature dependency expressed by formula (3) shown below.

$$D = D_0 \cdot e^{-Ea/kt} \quad (3)$$

In formula (3), Ea is activation energy, and $D_0$ is a constant. Ea and $D_0$ vary depending on types of impurities. For example, as D0 of boron at 1000° C., a value of $3 \times 10^{-5}$ μm²/min is used.

In this way, as is the case with control of the previously-described oxide film thickness, or alternatively, control of the scattering length of impurities, the present embodiment can be applied to deposited thin film thickness due to CVD, a nitriding quantity, a melt quantity of a BPSG film (insulating film), densification quantity of a CVD oxide film or the like, or silicide film (electrode) thickness in all the semiconductor manufacturing processes utilizing a thermo-chemical reaction; and to control of a semiconductor device manufacturing apparatus used therein merely by changing computational algorithms.

As has been described above, according to the first embodiment, a change in atmosphere while a predetermined process is carried out is measured and analyzed from time to time in real time, and a progress in process can be determined based on the analysis result (analysis data). Then, the analysis data can be fed back to a next and subsequent semiconductor manufacturing processes. Therefore, a semiconductor manufacturing process can be carried out in a normal state whether in the presence or absence of disturbance.

In order to know a state of atmosphere or its change, in addition to the internal sensor 8 described previously, an external sensor 9 serving as a measuring instrument for measuring a variety of state functions of external atmosphere of the oxidization furnace 4 may be provided as indicated by a single dotted chain line in FIG. 1. In addition, the measurement data obtained from this external sensor 9 is used as control data for a film forming process, whereby the semiconductor manufacturing process can be carried out in a more normal state.

Second Embodiment

Figure 3:
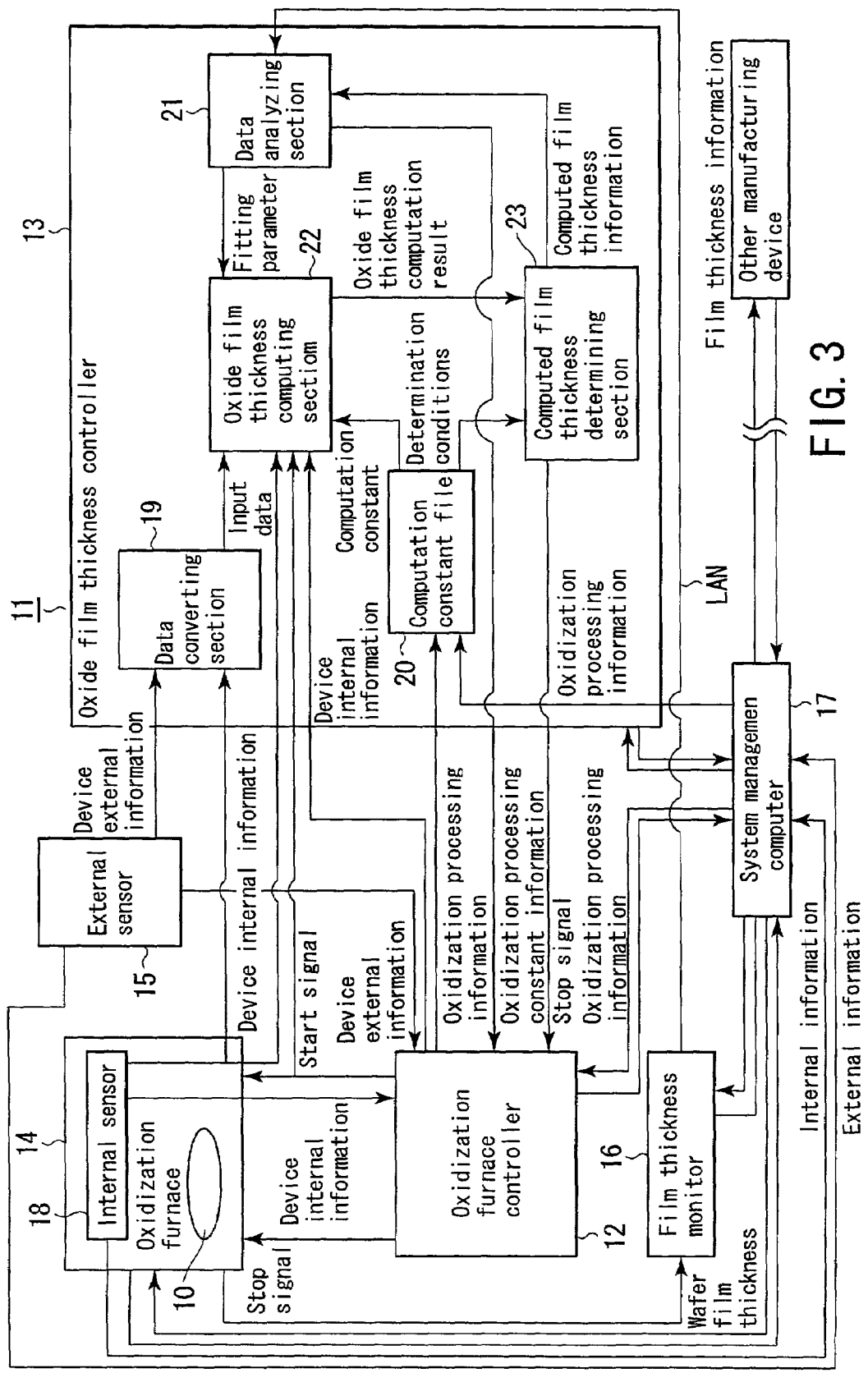
FIG. 3 is a block diagram schematically depicting essential constituent elements of a semiconductor device manufacturing apparatus according to a second embodiment.
Figure 4:
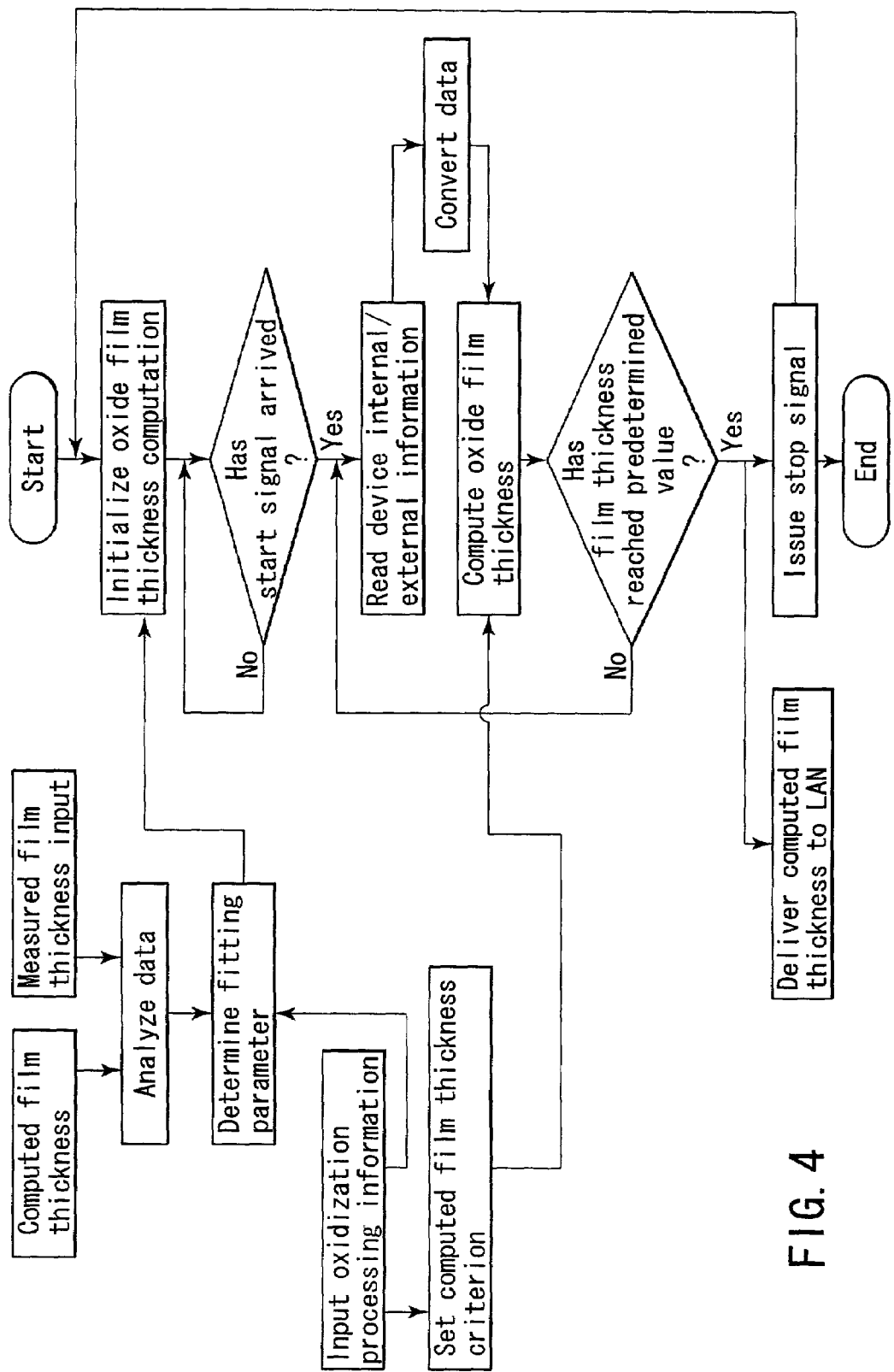
FIG. 4 is a flow chart showing a control procedure carried out by a process controlling device that the manufacturing apparatus of FIG. 3 comprises.

FIG. 3 is a block diagram schematically depicting essential constituent elements of an oxidization processing device 11 that serves as a semiconductor device manufacturing apparatus according to a second embodiment. FIG. 4 is a flow chart showing control procedures carried out by a second oxide film thickness controller 13 that the oxidization processing device 11 comprises. Like elements identical to those of the first embodiment are designated by like reference numerals. A detailed description thereof is omitted here.

In the above-described first embodiment, there was shown an example of a relatively simple configuration concerning a semiconductor device manufacturing method and apparatus and a control apparatus and method thereof. In the second embodiment, as shown in FIG. 3 and FIG. 4, an exemplary configuration enabling more complex and fine control will be described based on the previously-described first embodiment. As described later, a variety of information handled according to the present embodiment or a transmission route thereof can be executed by setting a variety of detailed states according to an object of process. Therefore, these setting states or setting variations will be described as well. These setting variations can be selectively used as required.

As shown in FIG. 3, an oxide film thickness controller 13 of the present embodiment comprises an oxide film thickness computing section 22 and a computed film thickness determining section 23 capable of carrying out higher level information processing than the oxide film thickness computing section 6 and computed film thickness determining section 7 that the oxide film thickness controller 3 of the first embodiment comprises. In addition, the oxide film thickness controller 13 comprises: a computation constant file 20 storing various computation constants therein, a data converting section 19 having a function for controlling data in a variety of states; and a data analyzing section 21 having a function for analyzing various items of data. In addition, like the oxide film thickness controller 3 of the previously-described first embodiment, the oxide film thickness controller 13 may be integrally configured as a part of its functions inside an oxidization furnace controller 12. In the oxidization furnace 14, its operation state is controlled by the oxidization furnace controller 12.

The computation constant file 20 receives from the oxidization furnace controller 12 a various types of information on an oxidization process to be processed. In accordance with these items of information to be processed, the computation constant file 20 passes to an oxide film thickness computing section 22 various types of information required for computing oxide film thickness, such as computation constants. In addition, the computation constant file 20 passes to a computed film thickness determining section 23 various types of information required for determining computed film thickness, such as determination conditions. The oxidization processing device 11 is set so that functional sections 22 and 23 of both of the oxide film thickness computing section 22 and computed film thickness determining section 23 can carry out parallel processing. By this setting, the oxidization processing device 11 can handle a plurality of oxidizing processes in parallel.

For example, assume that three oxide film thicknesses, 3 nm, 6 nm, and 10 nm are set; two oxidization processes, dry oxidization and wet oxidization, are set; and a total of six oxidizing processes are set. In this case, conditions for determining computed film thickness are variously changed according to the film thickness to be formed. Therefore, the oxide film thickness computing section 22 and computed film thickness determining section 23 receive normal computation constants and film thickness determination conditions as required from the computation constant file 20 according to determination conditions. Then, these sections compute oxide film thickness and determine computed film thickness based on these conditions in parallel.

In addition, various types of information used for oxidization computation (parameter 9 and initial film thickness τ, primary coefficient B/A, and second coefficient B of formula (1) illustrated in the first embodiment are different from each other in values according to oxidization process settings. Namely, the parameters are different from each other depending on whether the oxidization process is dry oxidization or wet oxidization. In accordance with oxidization processing information delivered from the oxide furnace controller 12, the computation constant file 20 selects parameters suitable for either dry oxidization or wet oxidization, and delivers them to the oxide film thickness computing section 22 and computed film thickness determining section 23.

In actuality, the above-described settings are each carried out before starting oxide film thickness computation. Processing information contains process sequence information having quantity and quality whose degree is essential and sufficient in carrying out oxidization processing. These items of information have a quantity and quality such that at least a target oxide film thickness and oxidization process can be specified. In addition, these items of oxidization processing information may not always be received from the oxidization furnace controller. For example, as shown in FIG. 3, information may be received from a system management computer 17 that serves as a higher-order host computer for controlling the entire semiconductor device production process. In this way, at least one of the parameters required for computing oxide film thickness and at least one of the values required for determining computed film thickness may each be determined prior to oxidization computation.

Now, a description will be given with respect to an external sensor 15 serving as a measuring instrument for detecting the state of the external atmosphere of the oxidization furnace 14 as external information and external information on the oxidization furnace 14 detected by the external sensor 15.

The oxidization processing device 1 of the first embodiment having received a start signal carried out oxide film thickness computation in real time by using the information on the inside the oxidization furnace 4 such as temperature or gas flow rate. In contrast, the oxidization processing device 11 of the present embodiment comprises the external sensor 15. Thus, external information on the oxide furnace 14 other than information thereon can be used. The external sensor 15 is mounted outside the oxidizing furnace 14. The external sensor 15 is composed of a thermometer such as thermocouple (not shown), or alternatively, an atmospheric pressure sensor (not shown). In this manner, for example, the state of the essential constituent factors of the external atmosphere of the oxidization furnace 14 such as external temperature, humidity, and atmospheric pressure of the oxidization furnace 14 can be measured and detected.

The atmospheric pressure is monitored by using this external sensor 15, and the information is used for oxidization computation. In this case, for example, in the case of an oxidization process carried out at a normal pressure or a pressure close thereto, it is deemed that an effect of an atmospheric pressure cannot be ignored. Thus, the precision of oxidization computation can be improved by using this information. In addition, it is hard to consider that the atmospheric pressure significantly changes within a time required for a normal oxidization process, in general, within about 2 to 4 hours. Therefore, when an oxidization process is executed in a normal state, the value of atmospheric pressure obtained immediately before starting the oxidization process is defined as a presumed condition, and processing information changes are made, by correcting the flow rate of oxidizing gas, or alternatively, by correcting the oxidization time so that the partial pressure of oxidizing gas is constant. In this manner, the oxidization process can be fully carried out in a normal state.

External information described above is presented as external information from the external sensor 15 to the oxidization furnace controller 12 in FIG. 3 and FIG. 4, but being limited thereto. For example, there may be used a scheme of inputting information to the host system management computer 17 which is more highly ranked than the oxidization furnace controller 12 or the like, rewriting the values of gas flow rate or oxidization time in the processing method, followed by transmitting oxidization processing information to the oxidization furnace controller 12. Namely, processing information may be changed according to external information.

Now, a data converting section 19 will be described here. This data converting section 19 having received internal and external information of the oxidization furnace 14 outputs input data used for computing oxide film thickness. In general, the internal and external information of the oxidization furnace 14 is acquired from the internal sensor 18 and external sensor 15. These items of measurement data are not obtained as numerically processed data that can be directly used for computing oxide film thickness. This makes it necessary to connect the data converting section 19 such as a general D/A converter that is capable of converting measurement analog data into numerically-processed digital data that can be directly used for computing oxide film thickness between each of the sensors 18 and 15 and the oxide film thickness computing section 22. Further, the data converting section 19 is set so as to process the numerically-processed information from each of the sensors 18 and 15. For example, the data converting section 19 has a function for converting a gas flow rate and atmospheric pressure data into information on partial pressures of a variety of gasses contained in the oxidization furnace 14, thereby making it possible to deliver the converted information to the oxide film thickness computing section 22.

Figure 5:
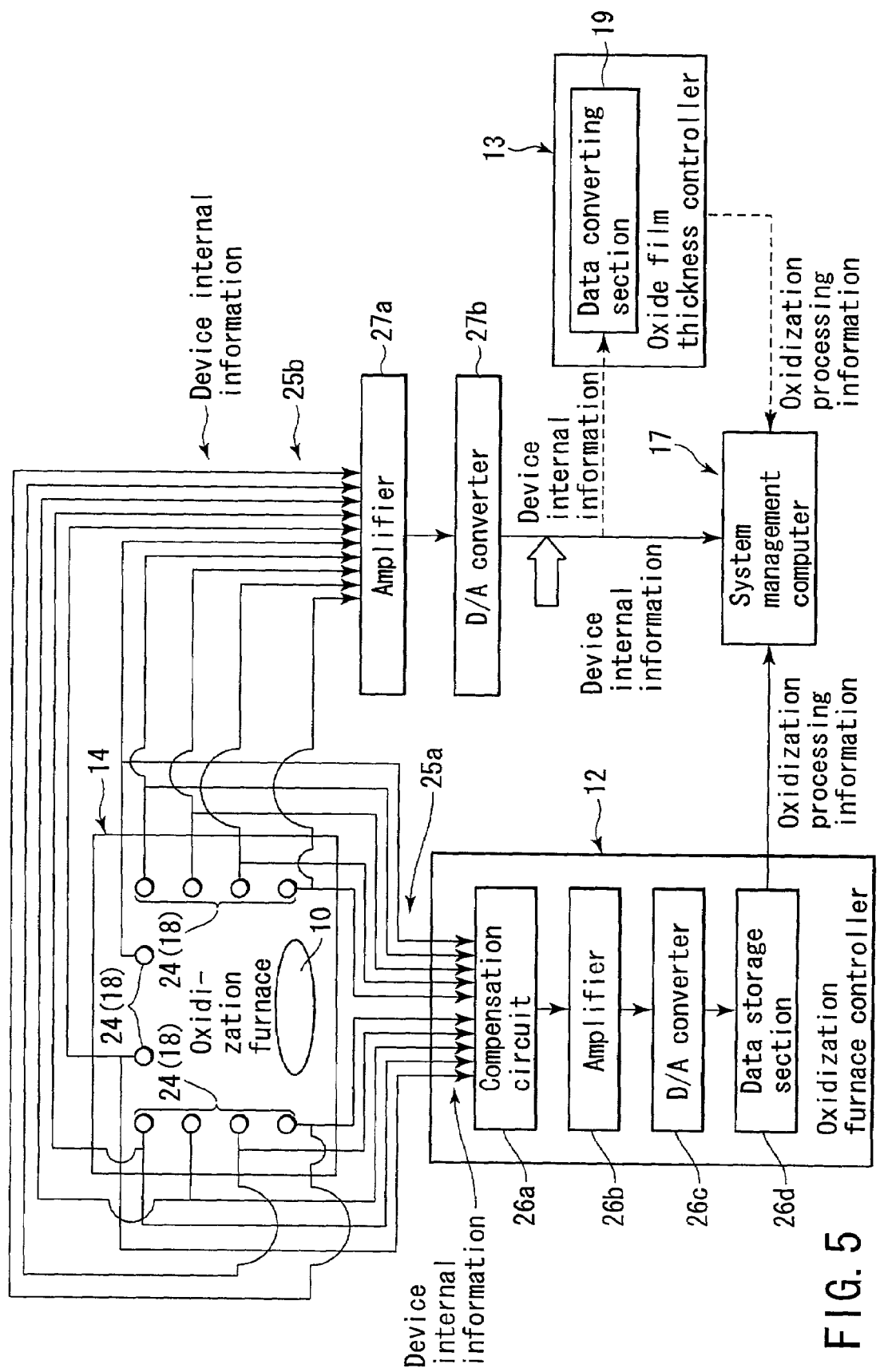
FIG. 5 is a view schematically depicting another transmission route of measurement data delivered from a measuring instrument that the manufacturing apparatus of FIG. 3 comprises.
Figure 8:
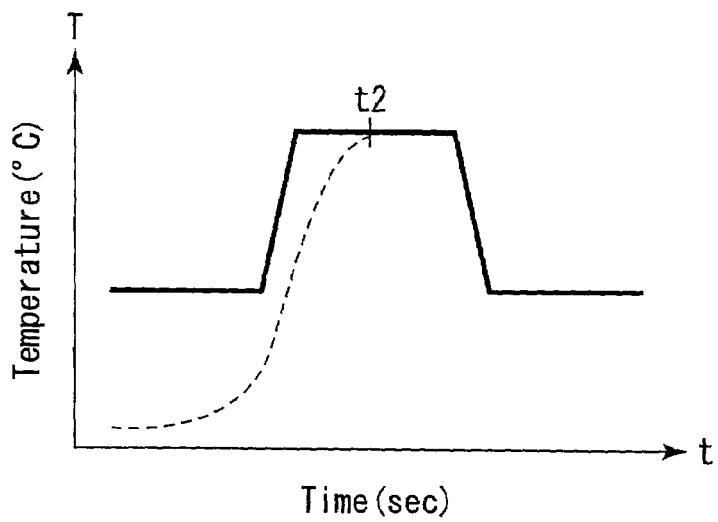
FIG. 8 is a view graphically depicting a respective one of temperatures of a gas and a target element to be processed in the process carrying out section that the manufacturing apparatus of FIG. 3 comprises.

In general, in the oxidization furnace 14, as shown in FIG. 5, about 10 thermocouples 24 are incorporated as constituent elements of the internal sensor 18 that serves as a measuring instrument. Strictly, a temperature of a wafer 10 is required for oxidization computation. The thermocouples 24 are each set at a location distant from the wafer 10, and thus, the temperature indicated by each thermocouple 24 does not always indicate an actual temperature of the wafer 10 faithfully. Such a temperature may include an error. Specifically, the temperature inside the oxidization furnace 14 indicated by the solid line shown in FIG. 8, for example, a temperature of gas forming the atmosphere inside the oxidization furnace 14 does not coincide with the temperature of the wafer 10 indicated by the broken line shown in FIG. 8 each other immediately after the gas has been introduced into the oxidization furnace 14. As shown in FIG. 8, after the gas and wafer 10 have been introduced into the oxidization furnace 14, the temperature of the wafer 10 changes so as to follow a change in gas temperature. For example, in FIG. 8, the temperature of the gas and the temperature of the wafer 10 substantially coincide with each other at time "t2", and then, these temperatures change while maintaining their substantially identical values.

In order to maximally eliminate a difference between the temperature indicated by such a thermocouple 24 and the actual temperature of the wafer 10, i.e., a measurement error during an oxidation process, for example, there is used a weighted average of the temperatures indicated by 10 thermocouples 24. Further, an experience-based offset is applied to the temperature inside the oxidization furnace 14, and this is defined as a wafer temperature. Alternatively, the result of ideal model-based thermal analysis simulation, or alternatively, its approximation formula is used. Otherwise, the measurement error caused by the thermocouples 24 is maximally eliminated by using a variety of methods as well, thereby the measurement precision can be eliminated.

In order to reflect the information on the inside the oxidization furnace 14 on oxidization computation, as described previously, a variety of methods can be applied as well as the method of the present embodiment for converting the internal information into available information via the data converting section 19, followed by using the converted information for computing oxide film thickness. For example, as described in the first embodiment, it is possible to apply a method of directly using the internal information from the internal sensor 18 for computing oxide film thickness, or alternatively, a method of using the information from the internal sensor 18 for computing oxide film thickness temporarily via the oxidization furnace controller 12. These methods each can be selectively executed as required.

In general, the information on the inside the oxidization furnace 14 is monitored by the oxidization furnace controller 12. Namely, the internal sensor 18 of the oxidization furnace 14 is connected to the oxidization furnace controller 12. In addition, when the internal sensor 18 and the oxide film thickness controller 13 are further connected to each other, there is a possibility that a problem such as malfunction or sensitivity change of the internal sensor 18 occurs. Therefore, it is desirable that the information on the inside the oxidization furnace 14 be obtained via the oxidization furnace controller 12, as described previously. In this case, for example, it is preferable that the oxidization furnace controller 12 comprises a fast (about 1 second) sampling function and a fast data transfer function.

Now, a data analyzing section 21 will be described here. For example, when oxidization processing for a total of 75 runs is carried out, the data analyzing section 21 uses data for the first 25 runs, thereby integrating the parameters in the oxidization of formula (1), namely, initial film thickness τ, primary coefficient B/A, and secondary coefficient B from the internal temperature of the oxidization furnace 14. That is, the data analyzing section 21 carries out so called parameter fitting for newly correcting (changing) parameters used for oxidization processing. Next, oxidization computation is carried out by using these parameters and the monitored furnace internal temperature. According to experiments carried out by the Inventors, it was verified that the actually-measured value and computed value of the oxide film thickness are very well coincident with each other up to the first 25 runs. In addition, it was verified that good coincidence with a fine change tendency of oxide film thickness is obtained after the 26-th run and subsequent runs. As the number of runs increases, the initial film thickness τ, primary coefficient B/A, and secondary coefficient B change gradually as well. This change can be corrected by the data analyzing section 21 anytime.

The main roles of the data analyzing section 21 are described below. The computed film thickness when a stop signal is generated is inputted at the computed film thickness determining section 23. Further, there is inputted data obtained by actually measuring the oxide film thickness by the film thickness monitor 16, the data being delivered from the film thickness monitor 16 via a LAN. These items of data are accumulated by about first 10 runs, and parameters in oxidization, namely, initial film thickness τ, primary coefficient B/A, and secondary coefficient B are integrated into each other. The result is delivered to the oxide film thickness computing section 22 before carrying out an oxidization process, and the delivered result is used as a fitting parameter for oxidization computation. This function is featured in that a change in fitting parameters is made in one unit every time each run, i.e., each batch process terminates. During a next computation of intra-oxidization film thickness, this change is handled as a constant. Namely, unlike the internal temperature of the oxidization furnace 14, the temperature is not updated per second. Therefore, this constant can be used as oxidization processing information, and the oxidization temperature during oxidization processing can be changed so as to obtain desired film thickness from the parameters in oxidization, namely, initial film thickness τ, primary coefficient B/A, and secondary coefficient B.

An advantage of such a use method is that, during oxidization processing, an oxidization speed is maintained to be constant before there occurs dissociation between the actually measure value and computed value of oxide film thickness, a so-called drift phenomenon, and the oxide film thickness or oxide film quality can be maintained to be constant. This signal may be transmitted via a LAN because there is no need to transmit it at a high speed. In addition, for a reason similar to the above, there is no need that the data analyzing section 21 is not always inside the oxide film thickness controller 13. This data analyzing function may be imparted to the system management computer 17.

Now, computation in the oxide film thickness controller 13 according to the present embodiment will be described with reference to a flow chart shown in FIG. 4.

First, initialization of oxide film thickness computation is carried out. Average value operation, heavy regression analysis, self-correlation analysis or the like is carried out based on the computed oxide film thickness and measured oxide film thickness of the first 10 runs. Then, it is determined that that type of process is, for example, dry oxidization, based on information on the oxidization processing method. Then, as fitting parameters, τ is set to 15.1 nm, B/A is set to $5.02 \times 10^{-6}$ μm/min, and B is set to $7.99 \times 10^{-6}$ μm$^2$/min. If no fitting parameters are used, τ, B/A, and B are determined based on only the information on the oxidization processing method. In addition, although the target film thickness is 60 nm, and the determination film thickness is set to 58 nm, for example. The time "t" is set to 0. Then, initialization terminates.

Next, a start signal from the oxidization furnace controller 12 is monitored. When the start signal is generated, the information on the inside the oxidization furnace 14 is received.

Then, the internal temperature of the oxidization furnace 14 is converted into the wafer temperature. Data conversion such as computing an oxygen partial pressure is carried out based on the atmospheric pressure and gas flow rate, and oxidization computation is carried out once. It is determined whether or not the computed oxide film thickness exceeds the normalized value, in this case, 58 nm. If the thickness does not exceed the value, internal information is acquired again, and oxidization computation is carried out one second after the previous internal information acquisition. This processing is repeated, and it is verified that the computed oxide film thickness exceeds 58 nm. Then, a stop signal is delivered to the oxidization furnace controller 12, and the final computed film thickness, for example, 58.3 nm is delivered to the system management computer 17 on a LAN. Then, processing reverts to Start.

The oxide furnace controller 12 delivers a stop signal to the oxidization furnace 14, and stops oxidization. More specifically, the oxidization furnace controller 12 issues to the oxidization furnace 14 an interrupt instruction for "terminating the process sequence of supplying oxidizing gas, followed by changing the sequence to a next process sequence of supplying inert gas". Here, slightly redundant oxidization occurs for a reason that the gas is not changed immediately from issuance of the stop signal to the end of oxidization. Such redundant oxidization is expected to be 2 nm in this example. Then, assume that the actual oxide film thickness of the wafer 10 is evaluated as 59.7 nm. The target value is 60.0 nm, and thus, the evaluated film thickness is smaller than the target value by 0.3 nm. During next oxidization, film thickness control with higher precision can be carried out by setting the criterion film thickness to 58.3 nm. In this way, the criterion film thickness as well as τ, B/A, and B can be used as a fitting parameter. Namely, the final computed film thickness is used for further computing a fitting parameter of the parameters required for computing the next oxide film thickness and subsequent ones.

As has been described above, according to the second embodiment, a hot process under a variety of setting conditions can be carried out in a system with the same configuration merely by changing settings of a program for use in control of the oxidization process sequence. In addition, the oxide film thickness can be formed with higher precision.

In addition, of the constituent elements of the internal sensor 18, the transmission route for the temperature information on the inside the oxidization furnace 14 delivered from thermocouples 24 each, for example, may be provided to be branched into a plurality of ways for the thermocouples 24 each. For example, as shown in FIG. 5, the transmission route for temperature information on the inside the oxidization furnace 14 delivered from the thermocouples 24 each is provided to be branched into two ways, i.e., a route 25a going through the oxidization controller 12 that serves as a process carrying out section controlling device and a route 25b that is free of going through the oxidization furnace controller 12. Here, a route passing through the oxidization furnace controller 12 is referred to as a first route 25a, and a route that is free of going through the oxidization furnace controller 12 is referred to as a second route 25b.

Figure 6:
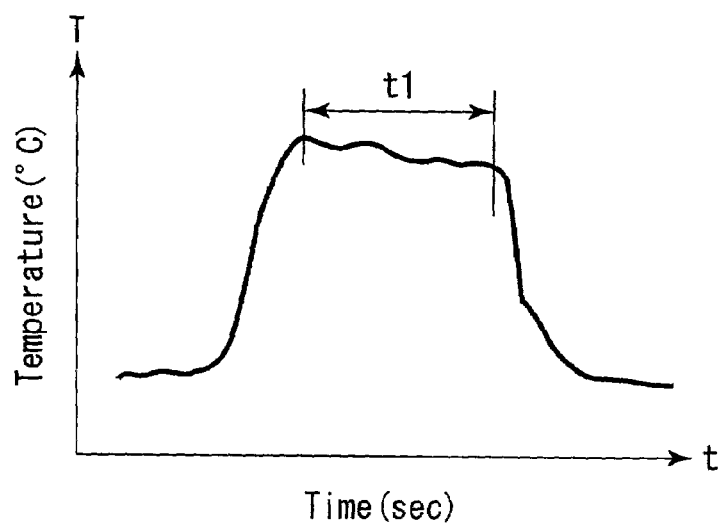
FIG. 6 is a view showing a measured portion of an internal temperature of a process carrying out section that the manufacturing apparatus of FIG. 2 comprises.

The device internal information passing through the first route 25a, i.e., the temperature information on the inside the oxidization furnace 14 passes through a compensation circuit 26a, an amplifier 26b, a D/A converter 26c, and a data storage section 26d or the like that are mounted in the oxidization furnace controller 12 sequentially, as shown in FIG. 5, for example, and then, is delivered to the system management computer 17 as the oxidization processing information. On the other hand, the temperature information on the inside the oxidization furnace 14 passing through the second route 25b passes through an external amplifier 27a and a D/A converter 27b or the like sequentially, and then, as the device internal information, is delivered to the oxide film thickness controller 13 and system management computer 17. In general, the internal temperature of the oxidization furnace 14 is measured when the furnace internal temperature reaches a substantially desired temperature, and a change in such temperature is small, as shown in FIG. 6. At this time, the averages of measurement times each should be substantially constant at "t1", for example. Then, the temperature information on the inside the oxidization furnace 14 measured at this measurement time "t1" is recorded as measurement data for one time.

Figure 7:
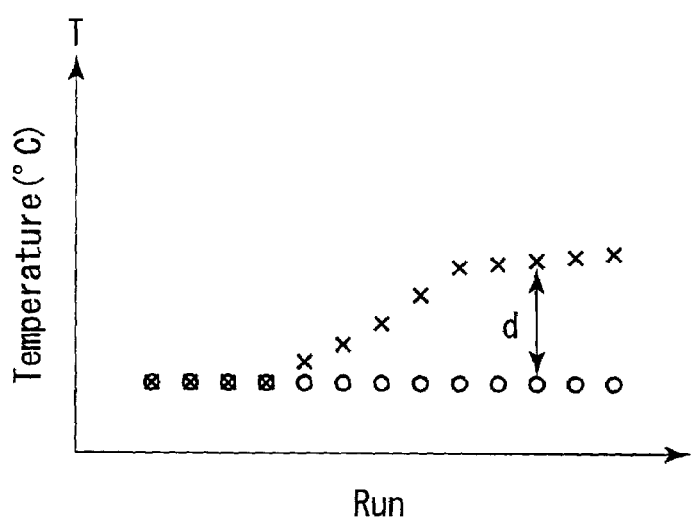
FIG. 7 is a view showing plotted measurement data delivered via the transmission route of FIG. 5.

In general, machines or analogous cannot be exempted from a change with an elapse of time. If this change with an elapse of time is left as is, the precision of measurement, control, and processing or the like is degraded. Specifically, the internal original temperature of the oxidization furnace 14 measured by the thermocouples 24 each, which is indicated by X shown in FIG. 7, is dissociated from the furnace internal temperature which is oxidization processing information passing through the oxidization furnace controller 12 indicated by ○ shown in FIG. 7 every time oxidization processing is repeatedly carried out. That is, there occurs a so-called drift phenomenon that a difference "d" between measurement data which is not processed at all and data processed to be readily available for film thickness computation deviates out of the range of a tolerance. In general, the compensation circuit 26a, amplifier 26b, D/A converter 26c, and data storage section 26d or the like provided in the oxidization furnace controller 12 are not set so as to adjust their operational states in real time while oxidization processing is executed. These operational states are generally adjusted in advance before starting each run or each batch process.

Here, assume that measurement data processed as oxidization processing information, the data passing through the first route 25a and oxidization furnace controller 12, is adjusted to match measurement data which is not processed at all, the data merely passing through the second route 25b. In this case, the measurement data which is not processed is acquired at a portion indicated by an open arrow shown in FIG. 5 before the data is delivered to the data converting section 19 of the oxide film thickness controller 13, as indicated by a broken-line arrow shown in FIG. 5. In this manner, disturbance caused by noise is reduced, and measurement data which hardly includes an error substantially coincident with the actual furnace internal temperature can be acquired. Unlike the devices in the oxidization furnace controller 12, an amplifier 27a and a D/A converter 27b serving as external devices are assumed to have been adjusted in a normal state as required irrespective of whether or not a change with an elapse of time occurs.

The compensation circuit 26a, amplifier 26b, D/A converter 26c, and data storage section 26d or the like are adjusted so that values of measurement data processed as oxidization processing information, the data passing through the oxidization furnace controller 12, coincide with those of measurement data acquired at the portion indicated by the open arrow shown in FIG. 5. In this manner, oxidization processing can be carried out while the data contained in the first route 25a and second route 26d substantially coincide with each other. In addition, film thickness computation data which substantially properly reflects the temperature information on the inside the oxidization furnace 14 can be obtained. Therefore, an oxide film can be formed in a more normal state.

As has been described above, the data passing through the first route 25a and second route 25b is correlated with each other as required, thereby making it possible to diagnose an operational state of the oxidization furnace controller 12. This ensures earlier fault finding of the oxidization furnace controller 12, and makes it possible to prevent a problem that oxidization processing is executed in an abnormal state. That is, maintenance of the oxidization furnace controller 12 can be easily carried out. Finally, the service life of the entire oxidization processing device 11 can be extended.

In addition, a function for comparing measurement data contained in the first route 25a with that contained in the second route 25b may be imparted to the system management computer 17. That is, the system management computer 17 also serves as a data comparator. In this case, it is preferable that the system management computer 17 automatically compares the previously-described data as required, and, if a drift quantity "d" is out of the range of a tolerance, settings be provided so as to automatically sense and correct such drift quantity. In this manner, more precise film thickness computation and oxidization processing in a more normal state can be easily carried out.

Further, a function of the data comparator is imparted to the system management computer 17, whereby, as indicated by a broken-line arrow shown in FIG. 5, the precision of oxidization processing information delivered to the system management computer 17 via the oxide film thickness controller 13 can be improved in the same way as in the precision of oxidization processing information delivered to the system management computer 17 via the oxidization furnace controller 12. In this manner, the precision of comparison work of these two types of oxidization processing information can be improved as well. Finally, more precise film thickness computation and oxidization processing in a more normal state can be carried out more easily.

Third Embodiment

Figure 9:
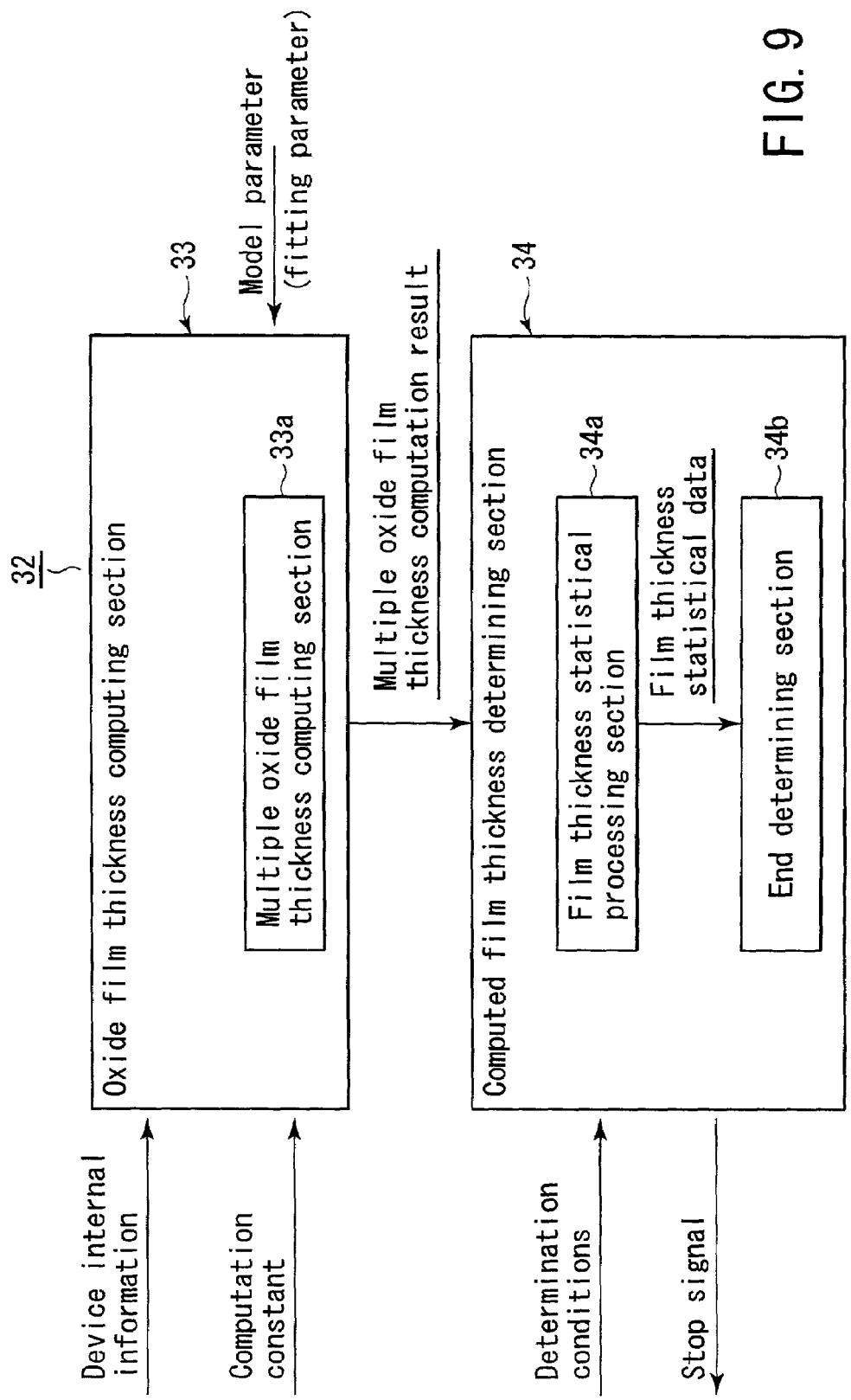
FIG. 9 is a block diagram schematically depicting essential constituent elements inside a process controlling device that a semiconductor device manufacturing apparatus according to a third embodiment comprises.
Figure 10:
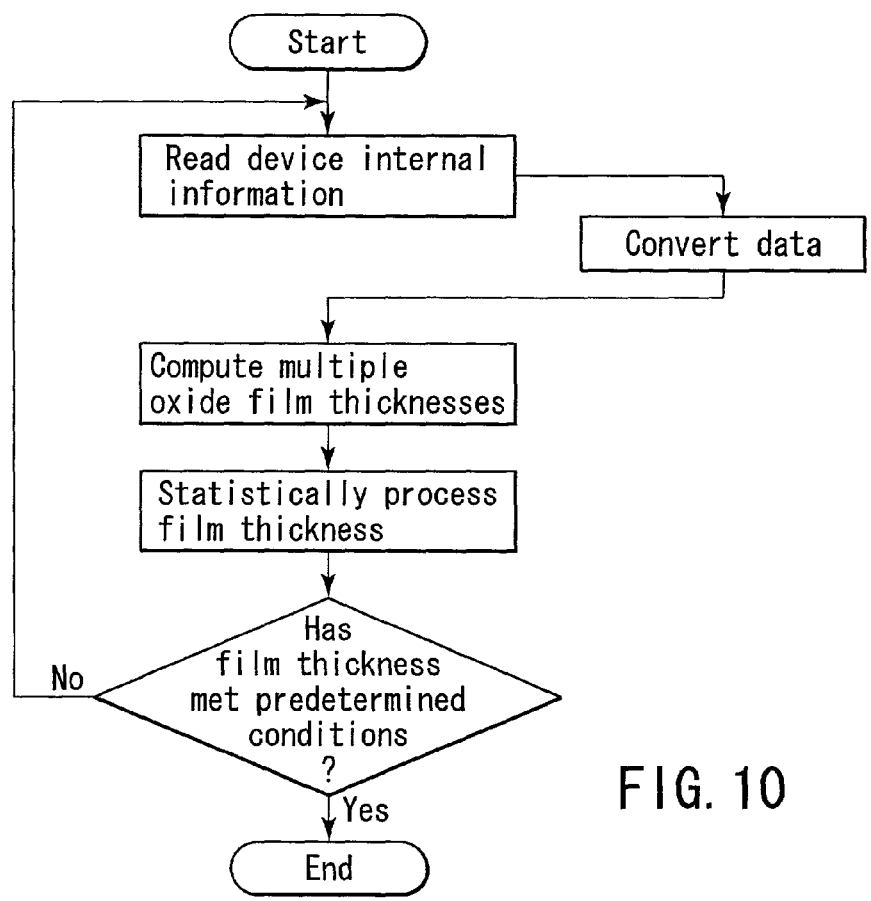
FIG. 10 is a flow chart showing essential portions of control procedures carried out by the process controlling device of FIG. 9.
Figure 11:
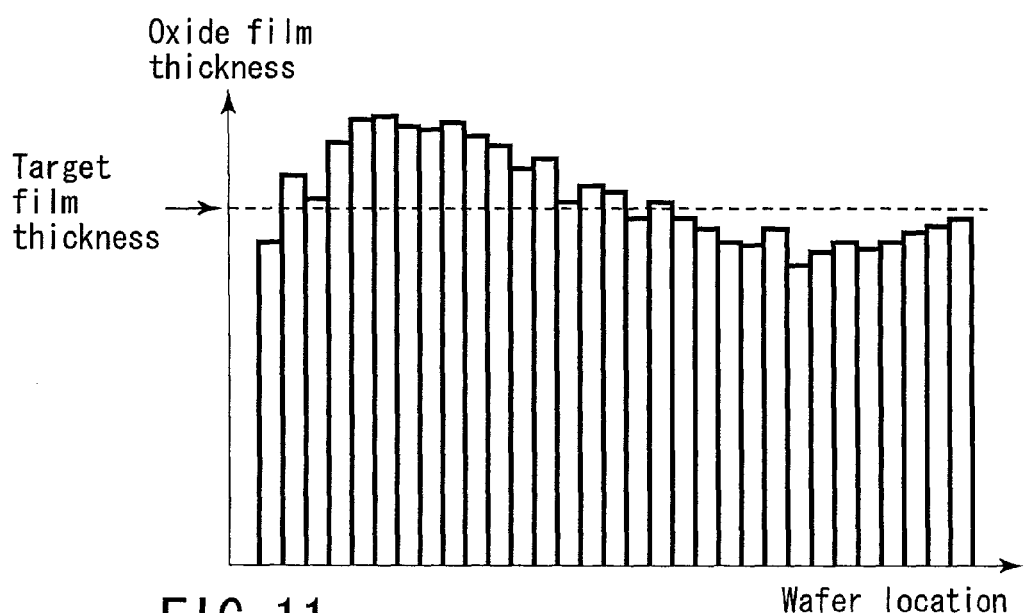
FIG. 11 is a view graphically depicting a distribution of film thickness of a target element to be processed by the manufacturing apparatus of FIG. 9.

FIG. 9 is a block diagram schematically depicting essential constituent elements inside the oxide film thickness controller 32 that an oxidization processing apparatus according to a third embodiment comprises. FIG. 10 is a flow chart showing essential portions of the control procedures carried out by an oxide film thickness controller 32. FIG. 11 is a view graphically depicting a distribution of film thickness of a target element to be film-formed by the oxidization processing device of the present embodiment. Like elements identical to those of the first embodiment are designated by like reference numerals. A detailed description thereof is omitted here.

Like the oxide film thickness controllers 3 and 13 according to the previously-described first and second embodiments, the oxide film thickness controller 32 is assumed to be configured independently of an oxidization furnace controller (not shown). However, the oxide film thickness controller 32 may be integrally configured inside the oxidization furnace as a part of its functions.

In the oxide film thickness controller 32, an oxide film thickness computing section 33 that the controller comprises has a function for receiving a start signal, information on the inside the oxidization furnace (not shown), a computation constant, and a model parameter or the like. In addition, the oxide film thickness computing section 33 has a function for computing the oxide film thickness at a time substantially simultaneous to measurement time, i.e., in real time, at a predetermined arbitrary location on a wafer. The predetermined wafer location can be specified in plurality. In the case of batch processing, the location in a plurality of wafers introduced into the oxidization furnace can be specified. In addition, although the specified location is generally received as a computation constant, a function for receiving the location as information other than such computation constant may be provided. For example, a location is predetermined, whereby, as information, the predetermined location may be provided inside the oxide film thickness computing section 33. In this way, the oxide film thickness computing section 33 has a so-called multiple oxide film thickness computing section 33a capable of computing a plurality of oxide film thicknesses.

In addition, in the oxide film thickness controller 32, a computed film thickness determining section 34 that the controller comprises has a function for receiving both items of information such as stop determination conditions and oxide film thickness computed by the previously-described multiple oxide film thickness computing section 33a. That is, this computing section has: a function for receiving for, where a plurality of oxide film thicknesses are computed, carrying out statistical processing that corresponds to the stop determination conditions; and a function for, when the specified stop determination conditions are met, issuing a stop signal. In this way, the computation film thickness determining section 34 has a so-called multiple film thickness statistical processing section 34a and a so-called multiple film thickness end determining section 34b capable of determining a plurality of oxide film thicknesses.

Computation for oxide film thickness control is carried out at the oxide film thickness computing section 33 and computed film thickness determining section 34 that the oxide film thickness controller 32 comprises in accordance with the sequence of the flow chart shown in FIG. 10.

The oxide film thickness controller 32 having received the start signal from the oxidization furnace controller starts oxide film thickness computation. At the step of reading device internal information, the device internal information such as information on the inside the oxidization furnace and computation constant is read. Here, as the device internal information, there is read temperature information from a variety of thermocouples outside the furnace, the gas flow rate from the flow meter, the atmospheric pressure, humidity or the like as required. Next, at the data conversion step, the read information is converted into numeric data capable of oxidization computation by a D/A converter or the like.

Next, at the multiple oxide film computation step, the oxide film thicknesses are computed in real time based on a plurality of temperature information acquired as device internal information. As a computation model, for example, a general formula such as formula (4) shown below may be used as is.

$$T_{ox}^2 + AT_{ox} = B(t+\tau) \quad (4)$$

Preferably, for a required computation speed or for the convenience of computation, it is desirable that formula (5) shown below be used, where formula (4) is time-differentiated, and τ is deleted.

$$\frac{dT_{ox}}{dt} = \frac{1}{2\frac{T_{ox}}{B} + \left(\frac{1}{B/A}\right)} + R_{Tox} \quad (5)$$

In formula (5), $T_{ox}$ is oxide film thickness, τ is initial oxide film thickness, "t" is a time, B is a secondary coefficient, B/A is a primary coefficient, and $R_{Tox}$ is a correction term. When formula (5) is used, the initial oxide film thickness is provided as an integral constant during integration. Although the secondary coefficient, primary coefficient, and correction term may be constants, it is desirable that computation be carried out by using required items from among the information read at the device internal information reading step, and it is desired that computation be carried out by using at least temperature information or atmospheric pressure information. For example, it is desirable that computation be carried out by using formulas (6) and (7) shown below.

$$\frac{B}{A} = K_l(P_{atom})^{n_l} \quad (6)$$

$$B = K_p(P_{atom})^{n_p} \quad (7)$$

In these formulas (6) and (7), $k_l$ and $k_p$ are intrinsic primary coefficient and intrinsic secondary coefficients that indicate functions of temperature, respectively, $P_{atom}$ is an atmospheric pressure, and $n_l$ and $n_p$ are constants.

Next, at the film thickness statistical processing step, statistical processing is carried out so as to produce required information under the stop determination conditions for the computation results each computed at the multiple oxide film thickness computation step. Then, at the end determination step, it is determined whether or not the end conditions are met. If the end conditions are not met, processing reverts to the device internal information reading step. The above steps are repeated until the conditions are met. After the conditions have been met, processing goes to the stop signal generating step.

Statistical processing corresponding to stop determination used here includes at least one of: processing using at least one moment regarding a distribution of average values or dispersions; processing using superimposition of a distribution function; processing using a range caused by the upper limit and lower limit; and processing using a frequency distribution. The end conditions must meet a required speed of computational processing. That is, processing must be terminated at a high speed within a sampling time of device internal information such as a temperature which changes from time to time. In addition, it is desirable that selection be made so that the highest yield is obtained. For example, the conditions should be established such that the largest number of wafers are within the range of the upper and lower limits obtained from the specified target film thickness and tolerated error.

For example, in the case of using processing that uses the range expressed by the upper limit $T_{upper}$ and the lower limit $T_{lower}$ of film thickness, processing of serially counting the number of film thicknesses that falls into the range of $T_{upper} \leq T \leq T_{lower}$ is carried out at the film thickness statistical processing section. In addition, at the end determination step, it is determined whether or not a value obtained by subtracting the number in processing time that precedes by one from the number in current processing time is negative. This method is capable of carrying out determination at a high speed if one peak is present so that film thickness distribution is expressed by one distribution function. At an initial time at which the number in processing time that precedes by one cannot be defined, the number of film thicknesses falling into the range of $T_{upper} \leq T \leq T_{lower}$ is set to zero.

As described previously, in the present embodiment, a plurality of oxide film thicknesses are computed by using a plurality of temperature information from thermocouples inside and outside the oxidization furnace, statistical processing is carried out, and then, end determination is carried out. In this manner, oxidization processing can be terminated under a condition in which higher yield is obtained. Therefore, the present invention is particularly effective when there is provided a device for directly monitoring a wafer temperature and a surface gas concentration or the like such as a thermocouple for directly monitoring a wafer temperature. Specifically, the actually measured values of the film thicknesses of the wafer which are dispersing in the vicinity of the target film thickness of the wafer indicated by a broken line shown in FIG. 11 can be converged into the target film thickness of the wafer with high precision. In addition, in order to handle a case of carrying out oxidization with the residual oxidizing gas after the stop signal has been generated, for example, the end determining section 34b may have a function for presuming a future state, followed by determining the end conditions. The specific end conditions may be externally provided, or alternatively, may be possessed by the end determining section 34b itself.

As has been described above, according to the third embodiment, an oxidization process can be carried out considering a dispersion in thickness of a wafer in-plane oxide film processed by a system having the same configuration in accordance with one oxidization process (run), i.e., a dispersion in wafer manufacturing, or alternatively, a dispersion in manufacturing between wafers when a plurality of wafers are processed by one run. For example, in oxidizing a wafer, if dispersion occurs at each wafer location, as shown in FIG. 11, such dispersion can be controlled so that the yield of semiconductor device products can be improved. According to the present embodiment, the film formed state of the oxide film thicknesses of a plurality of wafers is controlled with high precision, whereby the film thicknesses can be statistically computed and determined. Therefore, productivity can be improved while the performance of the semiconductor device manufactured is maintained at a high level.

Fourth Embodiment

Figure 12:
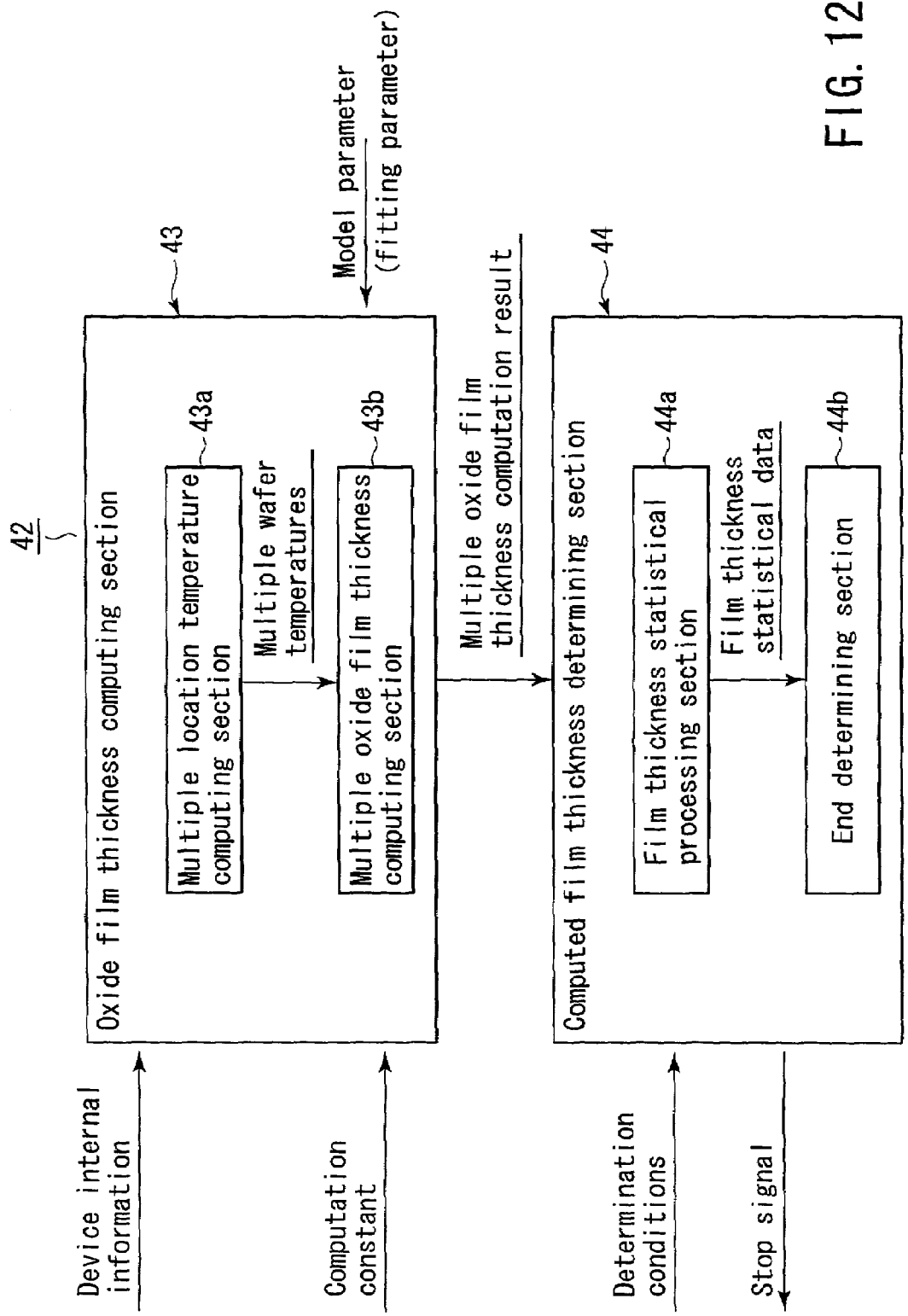
FIG. 12 is a block diagram schematically depicting essential constituent elements inside a process controlling device that a semiconductor device manufacturing apparatus according to a fourth embodiment comprises.
Figure 13:
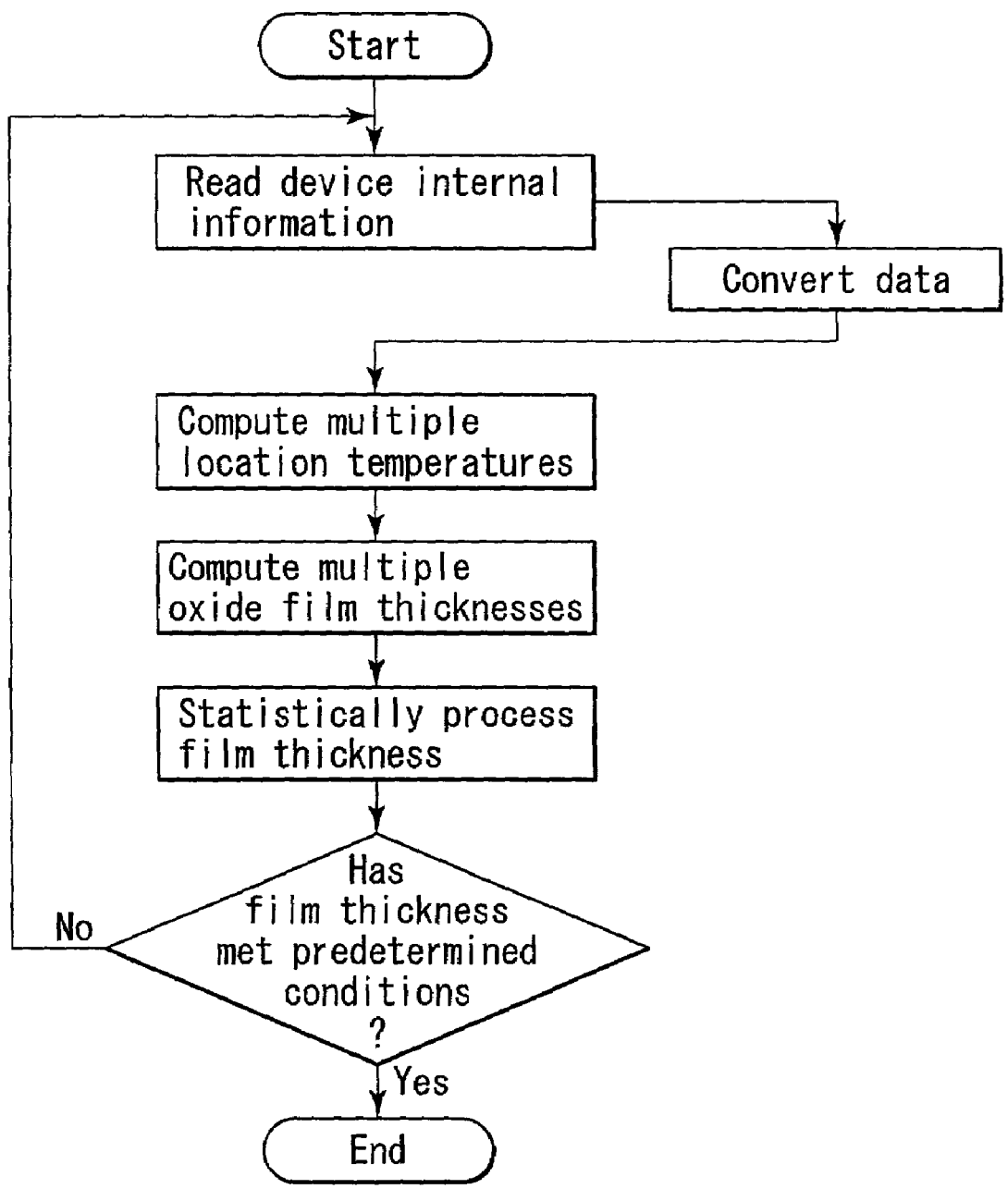
FIG. 13 is a flow chart showing essential portions of control procedures carried out by the process controlling device of FIG. 12.

FIG. 12 is a block diagram schematically depicting essential constituent elements of the inside an oxide film thickness controller 42 that an oxidization processing device according to a fourth embodiment comprises. FIG. 13 is a flow chart showing essential portions of the control procedures carried out by the oxide film thickness controller 42. Like elements identical to those of the first embodiment are designated by like reference numerals. A detailed description thereof is omitted here.

In the previously-described third embodiment, a description has been given with respect to a configuration and method which are effective when the oxidization processing device has a device for directly monitoring a wafer temperature. In the present embodiment, a description will be given with respect to a configuration and method which are effective when the oxidization processing device does not have a device for directly monitoring arbitrary temperatures at a plurality of locations such as a water temperature and a temperature at an arbitrary location on the wafer surface. For example, a description will be given with respect to a configuration and method which are effective when there is provided a device for indirectly monitoring a temperature in the vicinity of a wafer such as a thermocouple mounted on the side wall of the oxidization furnace.

Like the oxide film thickness controllers 3, 13, and 32 of the previously-described first to third embodiments, an oxide film thickness controller 42 is assumed to be configured independently of an oxidization furnace controller (not shown). However, the oxide film thickness controller 42 may be integrally configured inside the oxidization furnace controller as a part of its functions.

In the oxide film thickness controller 42, an oxide film thickness computing section 43 that the controller comprises has a function for receiving the start signal, internal information on the inside an oxidization furnace (not shown), computation constants, and model parameters. In addition, the oxide film thickness computing section 43 has a function for computing the oxide film thickness at a time substantially simultaneous to measurement time, i.e., in real time, at a predetermined arbitrary location on a wafer. A plurality of wafer locations can be specified. In the case of batch processing, the location in a plurality of wafers introduced into an oxidization furnace can be specified. In addition, although the specified location is generally received as a computation constant, a function for receiving it as information other than a computation constant may be provided. The oxide film thickness computing section 43 has a so-called multiple oxide film thickness computing section 43a capable of computing a plurality of oxide film thicknesses.

In addition, in the oxide film thickness controller 32, a computed film thickness determining section 34 that the controller comprises has a function for receiving both items of information such as stop determination conditions and oxide film thickness computed by the previously-described multiple oxide film computing section 33a. That is, this determining section has: a function for, when a plurality of oxide film thicknesses are computed, carrying out statistical processing that corresponds to the stop determination conditions; and a function for, when the specified stop determination conditions are met, generating a stop signal. The computed film thickness determining section 34 has a so-called multiple film thickness statistical processing section 34a and a multiple film thickness end determining section 34b capable of determining a plurality of oxide film thicknesses.

In comparison, the oxide film thickness controller 42 of the present embodiment is different from the oxide film thickness controller 32 of the previously-described third embodiment in that there is added a so-called multiple temperature computing section 43a having a function for computing temperatures at a plurality of locations in an oxidization furnace. This multiple temperature computing section 43 has a function for computing a temperature of a respective one of a plurality of wafers, or alternatively, a temperature at a predetermined location near each wafer from an furnace internal temperature measured (monitored) by a thermocouple mounted on the inside wall of the oxidization furnace, for example.

In addition, in the oxide film thickness controller 42, a computed film thickness determining section 44 that the controller comprises has a function for receiving both items of information such as the stop determination conditions and oxide film thickness computed by the previously-described multiple oxide film thickness computing section 43a. That is, this determining section has a function for, when a plurality of oxide film thicknesses are computed, carrying out statistical processing that corresponds to the stop determination conditions; and a function for, when the specified stop determination conditions are met, generating a stop signal. The computed film thickness determining section 44 has a so-called multiple film thickness statistical processing section 44a and a multiple film thickness end determining section 44b capable of determining a plurality of oxide film thicknesses.

The oxide film thickness controller 42 carries out computational processing in accordance with the sequence of the flow chart shown in FIG. 13. In comparison, computational processing carried out by the oxide film thickness controller 42 is different from that carried out by the oxide film thickness controller 32 of the third embodiment in that the multiple position temperature computation step precedes the multiple oxide film thickness computation step. In the case where the multiple position temperature computation step precedes the multiple oxide film thickness computation step, temperatures of the portions at which film thickness computation is carried out is computed in accordance with formula (8) shown below, where a temperature monitored by a thermocouple mounted on the inside wall of the oxidization furnace is defined as $T_M$, and a temperature of a portion at which film thickness computation is carried out is defined as $T_W$, a constant is defined as "a", and a correction term $R(T_M)$ being a function of $T_M$ is used.

$$T_W = aT_M + R(T_M) \quad (8)$$

Formula (8) is computed by only the number of film thickness computations. In addition, it is desirable that the correction term $R(T_M)$ be set to zero because the information on the inside the oxidization furnace must be processed at a higher speed within a sampling time. However, the correction term $R(T_M)$ may be added in order to improve the precision of computation by reflecting a high order effect. That is, processing is carried out at a high speed with a shorter interval, thereby increasing the processing count, whereby the computation precision may be improved. Alternatively, the computation precision for each time is improved, whereby the entire computation precision may be improved. Either of these methods can be selectively executed as required.

In addition, there are a plurality of temperatures monitored by the thermocouple mounted on the inside wall of the oxidization furnace and temperatures at portions at which film thickness computation is carried out, respectively, the numbers of these temperatures are defined as $N_M$ and $N_W$, respectively. Then, computation may be carried out in accordance with formula (9) shown below by using column vectors $T_M$ and $T_W$ of $N_M$ column and matrix A of $N_W$ line and $N_M$ column, and correction term $R(T_M)$.

$$T_W = AT_M + R(T_M) \quad (9)$$

As has been described above, according to the fourth embodiment, even when there is not provided a device for directly monitoring temperatures at a plurality of locations such as a wafer temperature and a temperature at a predetermined location in the vicinity of the wafer, these temperatures at a plurality of locations can be measured substantially precisely. Therefore, the yield is improved while the performance of a semiconductor device manufactured is maintained at a higher level, whereby productivity can be improved.

Fifth Embodiment

Figure 14:
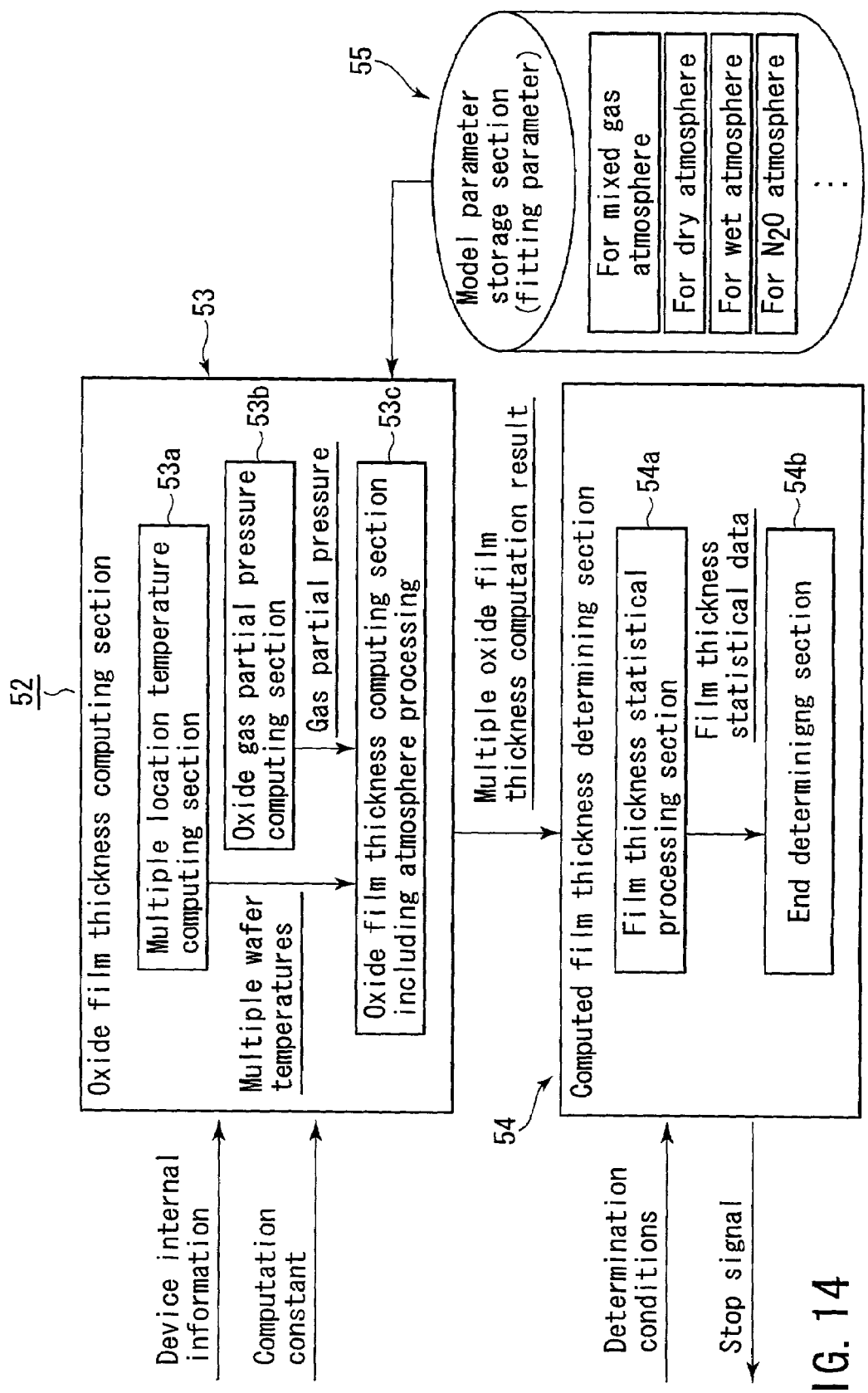
FIG. 14 is a block diagram schematically depicting essential constituent elements inside the process controlling device that a semiconductor device manufacturing apparatus according to a fifth embodiment comprises and an internal structure of model parameters.
Figure 15:
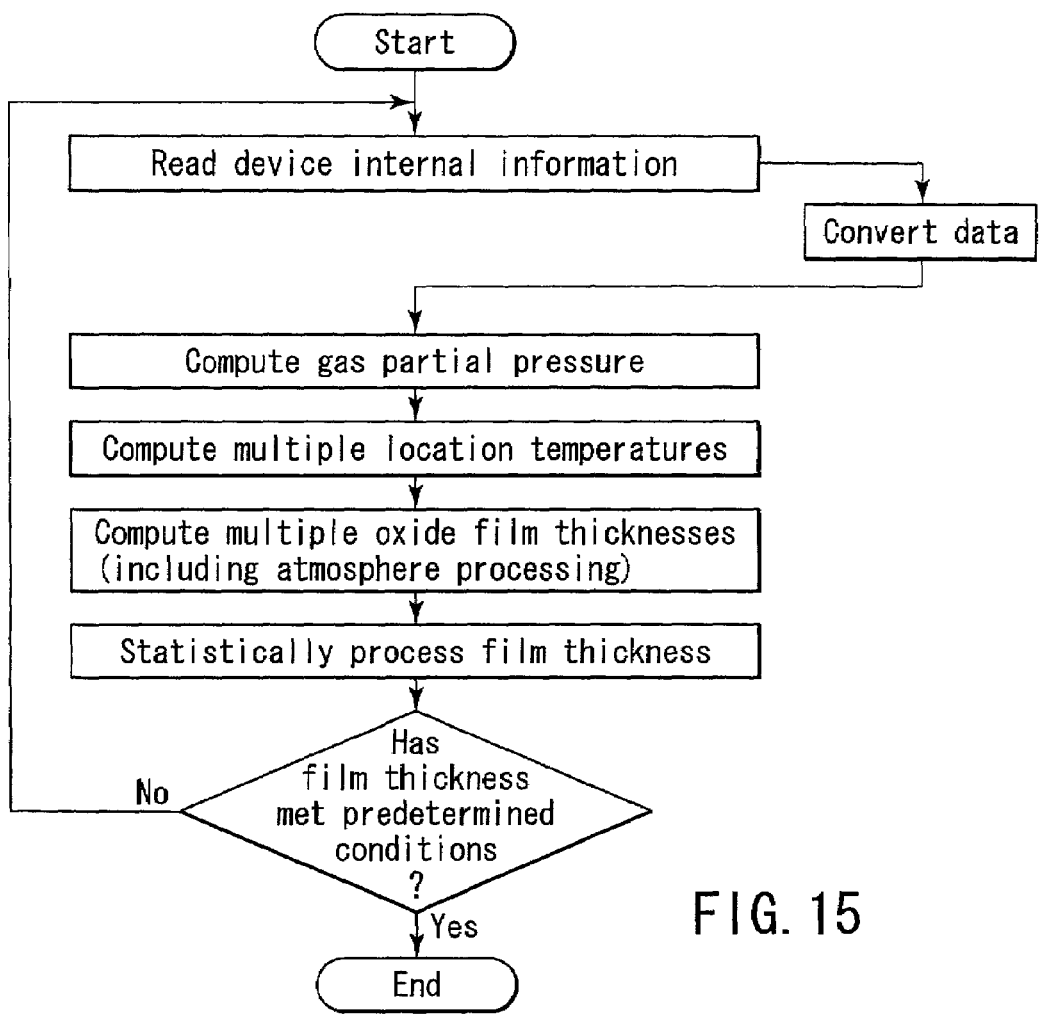
FIG. 15 is a flow chart showing essential portions of control procedures carried out by the process controlling device of FIG. 14.
Figure 16:
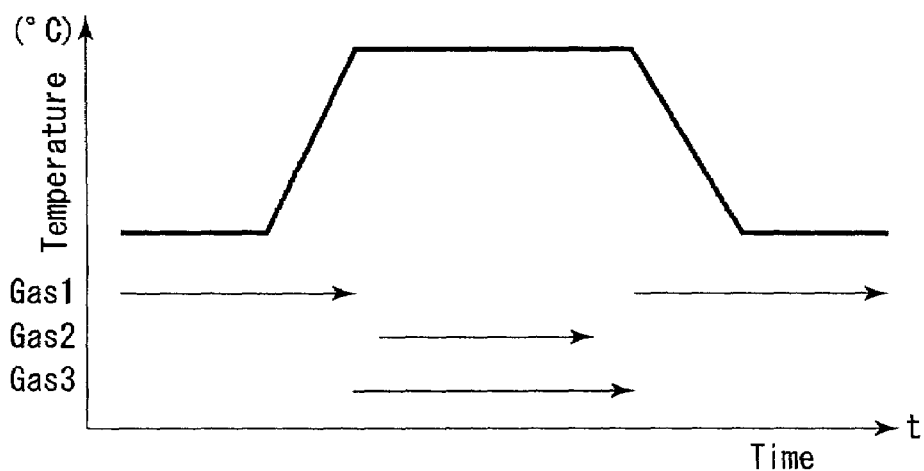
FIG. 16 is a view graphically depicting a sequence in a process of introducing a gas that configures the atmosphere in the process carrying out section that the manufacturing apparatus of FIG. 14 comprises.

FIG. 14 is a block diagram schematically depicting essential constituent elements of the inside an oxide film thickness controller 52 that an oxidization processing device according to a fifth embodiment comprises and an internal structure of model parameter. FIG. 15 is a flow chart showing essential portions of the control procedures carried out by the oxide film thickness controller 52. FIG. 16 is a view graphically depicting the sequence of a process of introducing gas that configures the atmosphere in the oxidization furnace. Like elements identical to those of the first embodiment are designated by like reference numerals. A detailed description thereof is omitted here.

Like the oxide film thickness controllers 3, 13, 32, and 42 of the previously-described first to fourth embodiments, the oxide film thickness controller 52 is assumed to be configured independently of an oxide furnace controller (not shown).

However, the oxide film thickness controller 52 may be integrally configured inside the oxidization furnace controller as a part of its function.

In the previously-described first to fourth embodiments, a description has been given, presuming that one type of gas is introduced into the oxidization furnace. In the fifth embodiment, a description will be given with respect to a case in which plural types of gases, for example, a three types of gases, Gas 1 to Gas 3, are introduced into the oxidization furnace sequentially or substantially at the same time as schematically depicted in FIG. 16. Further, a description will be given with respect to a method capable of, even when these three types of gases react with each other in the oxidization furnace, and then, a gas different from Gas 1 to Gas 3 occurs in the oxidization furnace, carrying out film thickness control with high precision considering such a circumstance.

In a general semiconductor device manufacturing apparatus, from the viewpoints of safety and quality assurance, it is necessary to execute a process sequence in which a series of processes such as bringing a wafer into the oxidization furnace, increasing a temperature, maintaining a temperature, gas introduction, gas change, reducing a temperature, and bringing a wafer out of the furnace are set. The oxidization furnace can be controlled with high precision by considering such a constant process sequence in advance. In addition, if a change in process sequence or a time change in each process occurs, adequate action is taken for such a change, whereby the oxidization furnace can be controlled with high precision, or alternatively, the count of trials carried out until such a model for carrying out control with high precision has been obtained can be reduced significantly. This action is very effective when a change of gas is made such that the film growth velocities are significantly different from each other before and after changing the gas introduced in the oxidization furnace, or alternatively, when a drastic temperature change occurs due to a temperature rise or fall. A detailed description will be given below.

In comparison, the oxide film thickness controller 52 of the present embodiment is different from the oxide film thickness controller 42 of the fourth embodiment in that there is provided means for determining the flow rate of the gas introduced into the oxidization furnace, or alternatively, the internal atmosphere of the oxidization furnace or a method of processing gases from the atmospheric pressure of the outside the oxidization furnace, as shown in FIG. 14. In addition, these controllers are different from each other in that settings are provided so as to compute a plurality of oxide film thicknesses considering processing according to the internal atmosphere of the oxide furnace. Further, the oxide film thickness controller 52 is assumed as comprising model parameters (fitting parameters) for film thickness computation according to the different oxidization processing atmosphere such as those for dry atmosphere, wet atmosphere, or alternatively, mixed atmosphere thereof, the parameters being data which corresponds to Gas 1 to Gas 3.

As shown in FIG. 15, in comparison, computational processing carried out by the oxide film thickness controller 52 of the present embodiment is different from that carried out by the oxide film thickness controller 42 of the fourth embodiment in that the gas partial pressure computation step precedes the multiple location temperature computation step; and, when a plurality of oxidizing gases are mixed in the multiple oxide film pressure computation step, available processing is included. Similarly, in comparison, computational processing carried out by the oxide film thickness controller 42 of the present embodiment is different from that carried out by the oxide film thickness controller 32 of the third embodiment in that the multiple location temperature computation step precedes the multiple oxide film thickness computation step. In this case, for example, a temperature at a portion at which film thickness computation is carried out in accordance with formula (10) shown below, where a temperature monitored by a thermocouple mounted on the inside wall of the oxidization furnace is defined as $T_M$, and a temperature of a portion at which film thickness computation is carried out is defined as $T_W$, a constant is defined as "a", and a correction term $R(T_M)$ being a function of $T_M$ is used.

Specifically, at the gas partial pressure computation step, for example, a gas partial pressure is computed based on the gas flow rate and atmospheric pressure by using formula (10) shown below, for example.

$$P_i = \frac{F_i}{\sum_i F_i} P_{atom} \qquad (10)$$

In formula (10), with respect to a plurality of gases introduced into the oxidization furnace, the partial pressure of an i-th gas is defined as $P_i$, the gas flow rate is $F_i$, and the atmospheric pressure is defined as $P_{atom}$. In addition, where a gas reaction occurs, for example, where hydrogen gas and oxygen gas are included, and these gases react with each other, computation may be carried out by using formulas (11) to (17) shown below.

$$F_{H_2O} = \min(F_{H_2}, 2F_{O_2}) \qquad (11)$$

$$F'_{H_2} = \max(F_{H_2} - F_{H_2O}, 0) \qquad (12)$$

$$F'_{O_2} = \max\left(F_{O_2} - \frac{F_{H_2O}}{2}, 0\right) \qquad (13)$$

$$P_i = \frac{F_i}{(F'_{H_2} + F'_{O_2}) + (F_{H_2O}) + \sum_{\substack{i \neq H_2 \\ i \neq O_2 \\ i \neq H_2O}} F_i} P_{atom}, \qquad (14)$$

$(i \neq H_2, i \neq O_2, i \neq H_2O)$ $$P_{H_2O} = \frac{F_{H_2O}}{(F'_{H_2} + F'_{O_2}) + (F_{H_2O}) + \sum_{\substack{i \neq H_2 \\ i \neq O_2 \\ i \neq H_2O}} F_i} P_{atom} \qquad (15)$$

$$P_{H_2} = \frac{F'_{H_2}}{(F'_{H_2} + F'_{O_2}) + (F_{H_2O}) + \sum_{\substack{i \neq H_2 \\ i \neq O_2 \\ i \neq H_2O}} F_i} P_{atom} \qquad (16)$$

$$P_{O_2} = \frac{F'_{O_2}}{(F'_{H_2} + F'_{O_2}) + (F_{H_2O}) + \sum_{\substack{i \neq H_2 \\ i \neq O_2 \\ i \neq H_2O}} F_i} P_{atom} \qquad (17)$$

In these formulas (11) to (17), when a plurality of reactions between gases each occur, as in the previously-described idea, $F_{H2}$ and $F_{O2}$ may be taken respectively as a hydrogen gas flow rate and an oxygen gas flow rate before such reactions; $F_{H2O}$ may be taken as a flow rate of water generated by the reaction; $F'_{H2}$ and $F'_{O2}$ may be taken respectively as a hydrogen gas flow rate and an oxygen gas flow rate after reaction. In addition, $P_{H2}$, $P_{O2}$, and $P_{H2O}$ are defined as a hydrogen gas partial pressure, an oxygen gas partial pressure, and a water partial pressure, respectively.

When a plurality of reactions occur, formulas established by extending the above formulas in the similar idea each may be merely used. A detailed description thereof is omitted here. In addition, in order to consider an incomplete reaction, in formulas (11) to (13) each, a normal correction term may be added, subtracted, multiplied, or divided. Any of these formulas may be selectively set as required so that a target oxide film is formed substantially uniformly in a state close to desired film thickness.

Next, at the multiple oxide film pressure computation step including processing if a plurality of oxidizing gases are mixed, formulas (6) and (7) shown in the third embodiment are changed to formulas (18) and (19), whereby computation may be carried out.

$$\frac{B}{A} = k_l (P_G)^{n_l} \times R_l \quad (18)$$

$$B = k_p (P_G)^{n_p} \times R_p \quad (19)$$

In these formulas (18) and (19) each, $P_G$ is a partial pressure of gas oxidizing a wafer, and $R_l$ and $R_p$ are correction terms of primary and secondary coefficients, respectively. If a plurality of gases oxidizing a wafer exist and if an interaction thereof occurs, it is desirable that this correction term be used. If a plurality of gases oxidizing a wafer exist and if an interaction thereof can be ignored, computation is carried out by using formula (20) shown below, for example, instead of formula (5) shown in the third embodiment.

$$\frac{dT_{ox}}{dt} = \sum_i a_i \left( \frac{1}{2\frac{T_{ox}}{B_i} + \frac{1}{(B/A)_i}} (RT_{ox})_i \right) \quad (20)$$

In formula (20), $B_i$, $(B/A)_i$, and $(R_{Tox})_i$ are: secondary and primary coefficients of an i-th gas in a plurality of gases oxidizing a wafer, respectively; and a correction term, and "$a_i$" is a constant.

In addition, coefficients of gases described previously and coefficients for mixed gas are stored as a variety of model parameters in a model parameter storage section 55 for storing each of these model parameters, as shown in FIG. 14. These model parameters are each selected and read as those suitable to types of oxidization processing to be executed at the oxide film thickness initialization step described in the second embodiment prior to entering the computation steps shown in FIG. 15. In addition, these model parameters each are processed into values optimized as fitting parameters at the data analysis step similarly described in the second embodiment before entering the computation steps shown in FIG. 15, and are stored in the model parameter storage section 55.

As has been described above, according to the fifth embodiment, there is provided an apparatus and method of, when plural types of gases are introduced into the oxidization furnace substantially at the same time, and further, when different gases are generated after being reacted with each other, determining the internal atmosphere of the oxidization furnace or processing of the gases each based on the flow rate of such a gas, or alternatively, external atmospheric pressure of the oxidization furnace. In addition, a plurality of oxide film thicknesses can be statistically computed considering the internal atmosphere of the oxidization furnace. Therefore, even if the internal atmosphere of the oxidization furnace enters a more complicated state, it is possible to form an oxide film consisting of desired film thickness with high precision. Therefore, according to the present embodiment, the performance and quality of a semiconductor device manufactured can be maintained at a higher level, the yield can be improved, and productivity can be further improved.

Sixth Embodiment

Figure 17:
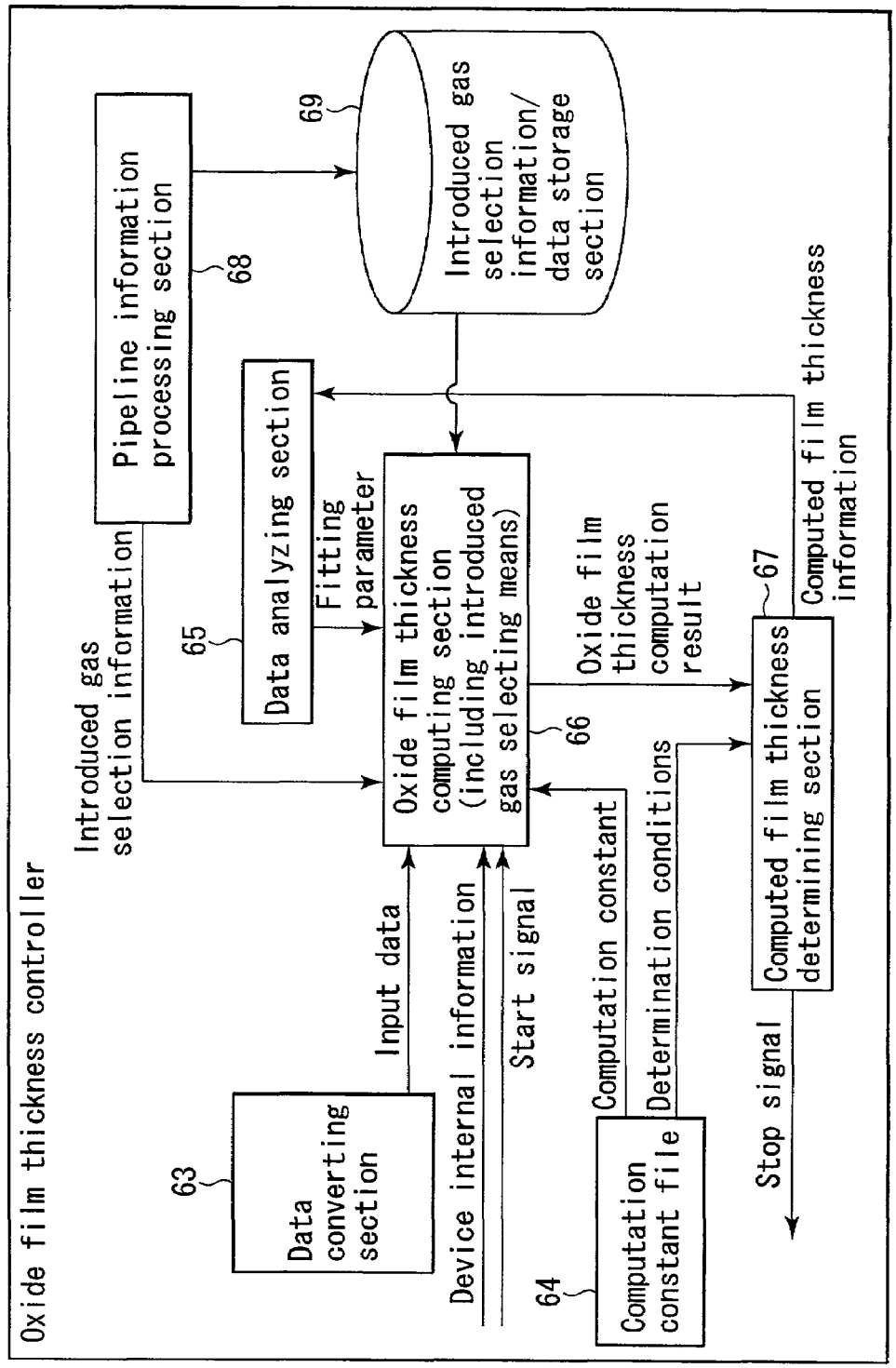
FIG. 17 is a block diagram schematically depicting essential constituent elements inside the process controlling device that a semiconductor device manufacturing apparatus according to a sixth embodiment comprises.
Figure 18:
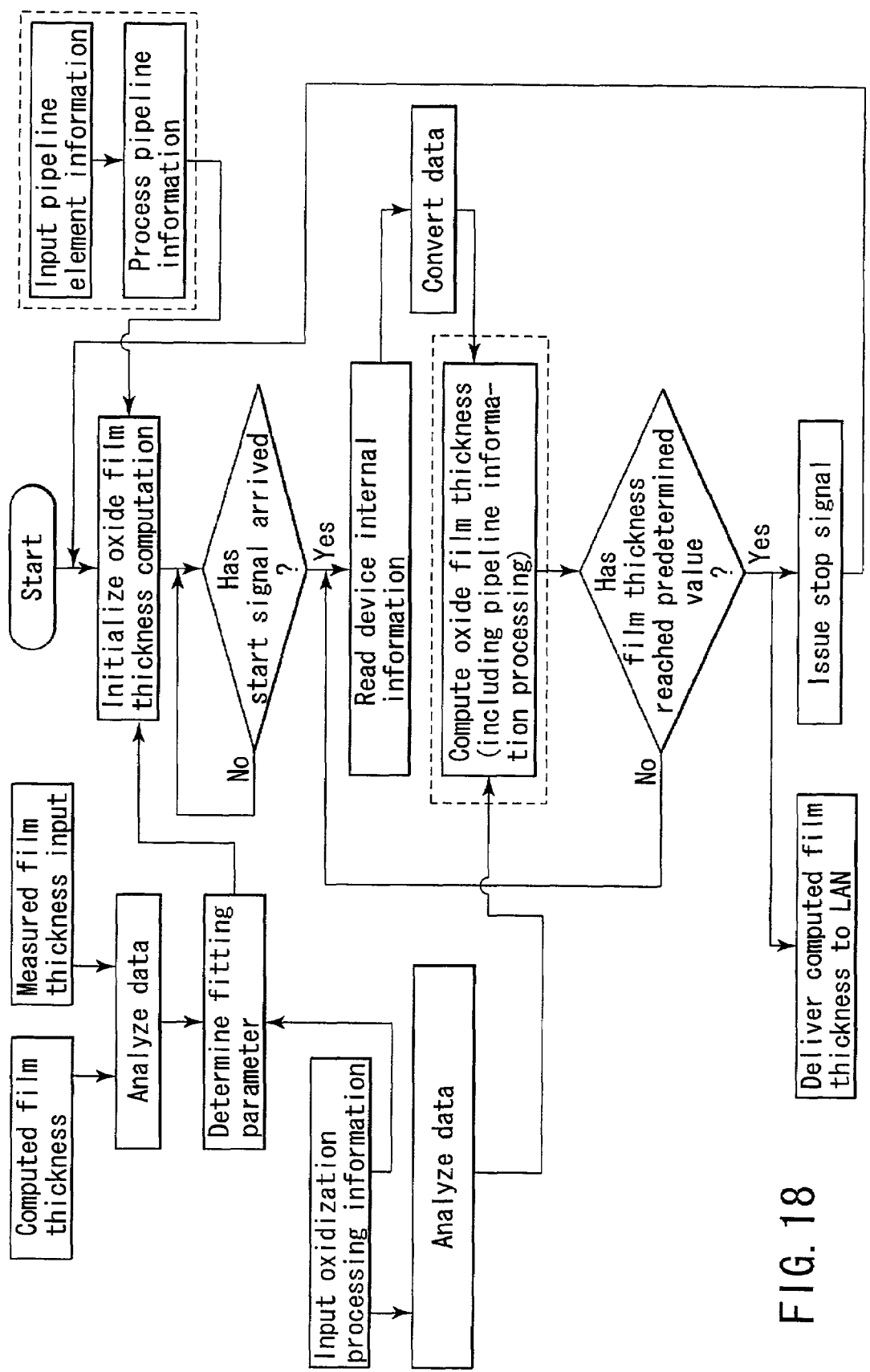
FIG. 18 is a flow chart showing essential portions of the control procedures carried out by the process controlling device of FIG. 17.

FIG. 17 is a block diagram schematically depicting essential constituent elements of the inside an oxide film thickness controller 62 that an oxidization processing device according to a sixth embodiment comprises. FIG. 18 is a flow chart showing essential portions of the control procedures carried out by the oxide film thickness controller 62. Elements identical to those of the first embodiment are designated by like reference numbers. A detailed description thereof is omitted here.

Like the oxide film thickness controllers 3, 13, 32, 42, and 52 according to the previously-described first to fifth embodiments, the oxide film thickness controller 62 is assumed to be configured independently of an oxidization furnace controller (not shown). However, the oxide film thickness controller 62 may be integrally configured inside the oxidization furnace as a part of its functions.

Figure 21:
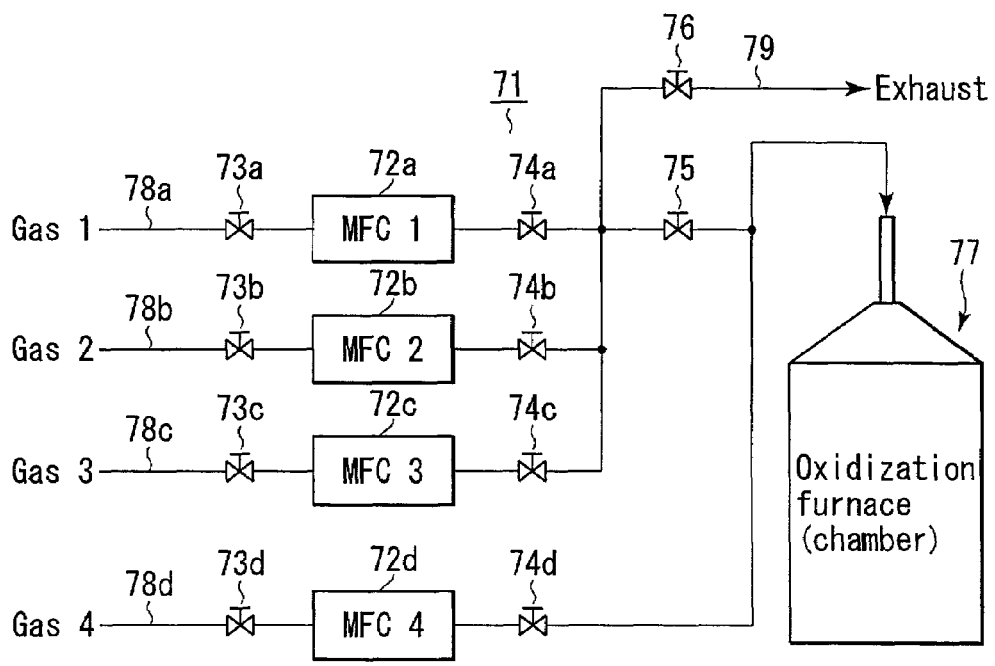
FIG. 21 is a block diagram schematically depicting a pipeline configuration connected to a process carrying out section that the manufacturing apparatus of FIG. 17 comprises.

In the sixth embodiment, a description will be given with respect to a method, configuration, and means for executing oxide film thickness computation when plural types of gases pass through a plurality of pipelines, and are introduced into a chamber 77, as shown in FIG. 21. Specifically, in the present embodiment, settings are provided such that four types of gases, Gas 1 to Gas 4, are introduced into the chamber 77. In such settings, a description will be given with respect to functions of the oxide film thickness controller 62 for easily specifying (determining) the internal atmosphere of the chamber 77 composed of the gases, Gas 1 to Gas 4, introduced into the chamber 77 in computing the oxide film thickness. In addition, a description will be given with respect to a method, configuration, and means for easily resetting a variety of functions of the oxide film thickness controller 62 when there has been made a change in the entire oxidization processing device or in pipelines due to modification of the entire plant facility (not shown) including such an oxidization processing device, or alternatively, a pipeline reconnection.

A general oxidization processing device introduces plural types of gases into the oxidization furnace sequentially or substantially at the same time. However, in the conventional oxidization processing device, a device handling information on pipelines of such plural types of gases is not provided. Thus, when plural types of gases are introduced into the oxidization furnace, the flow rate or partial pressure of such a gas or the like cannot be handled after being controlled with high precision. Most of the pipelines provided adjunct to the conventional oxidization processing device have complicated structure such that an additional air exhaust route is provided so as to ensure sufficient safety even if an abnormality occurs. However, in such a complicated pipeline structure, when film thickness computation is carried out while plural types of gases are introduced into the oxidization furnace, it is very difficult to specify the gases introduced in the oxidization furnace. If a large number of gas types exist or if a reaction takes place frequently among these gases, it may be eventually impossible to specify the gases that constitute the atmosphere contained in the oxidization furnace. Thus, it may be impossible to properly compute the film thickness of an oxide film to be formed.

The oxidization processing device of the present embodiment is configured so as to solve such a problem. Hereinafter, a detailed description will be given focusing on the functions of the oxide film thickness controller 62 that this oxidization processing device comprises.

In the oxidization processing device of the present embodiment, there is provided a pipeline facility 71 that consists of constituent elements as shown in FIG. 21. This pipeline facility 71 is primarily composed of four pipelines, i.e., first to fourth pipelines 78a to 78d for introducing Gas 1 to Gas 4 into the chamber 77. On these pipelines 78a to 78d each, four gas flow meters, i.e., first to fourth gas flow meters (MFC) 72a to 72d each for measuring the flow rates of the gases flowing inside the pipelines 78a to 78d are mounted at the upstream side of the chamber 77. In addition, at the pipelines 78a to 78d each, upstream side solenoid valves 73a to 73d and downstream side solenoid valves 74a to 74d for adjusting the flow rates of gases flowing inside the pipelines 78a to 78d each, are mounted at their upstream side and downstream side so as to sandwich the gas flow meters 72a to 72d each. In addition, a single common solenoid valve 75 for adjusting the flow rates of all the three types of Gases 1 to 3 to be introduced into the chamber 77 is mounted on a pipeline going through the inside the chamber 77 collectively from the first to third pipelines 78a to 78c each. Further, at the three pipelines, the first to third pipelines 78a to 78c, an exhaust pipe 79 for exhausting Gas 1 to Gas 3 is provided between the downstream side solenoid valves 74a to 74c each and the common solenoid valve 75. In addition, a single exhaust solenoid valve 76 for adjusting the exhaust quantity of exhaust gas flowing the inside thereof is mounted on this exhaust pipe 79.

In comparison, the oxide film thickness controller 62 included in the oxidization processing device of the present embodiment comprising the pipeline facility 71 that consists of such constituent elements is different from the oxide film thickness controller 32 of the third embodiment as follows. The oxide film thickness controller 62 comprises a pipeline information processing section 68 for carrying out logic computation concerning an opening/closing operation state of a respective one of the solenoid valves 73a to 73d, 74a to 74d, 75, and 76. In addition, the oxide film thickness controller 62 comprises an introduced gas selection information/data storage section 69 in which pipeline information is simplified so as to understand the type and flow rate of the gas introduced into the chamber 77. Further, the oxide film thickness computing section 66 provided inside the oxide film thickness controller 62 has a function capable of specifying the type and flow rate of the gas introduced into the chamber 77 by using the gas selection information/data.

In addition, as shown in a flow chart of FIG. 18, in comparison, computational processing carried out by the oxide film thickness controller 62 of the present embodiment is different from that carried out by the oxide film thickness controller 13 of the second embodiment in that the pipeline information input step and pipeline information processing step are added. In addition, as shown in a flow chart of FIG. 19, in comparison, the computational processing carried out by the oxide film thickness controller 62 is different from that carried out by the oxide film thickness controller 32 of the third embodiment in that the oxide film thickness computation step includes the pipeline information processing step of specifying the type and flow rate of the gas introduced in the oxidization furnace.

The introduced gas selection information produced at the pipeline information processing step is acquired at the oxide film thickness computation/initialization step. This pipeline information processing may be carried out when the oxidization processing device and pipeline facility 71 are started up, for example, i.e., during initial setting or the like. In general, the oxide film thickness computing section 66 carries out a process of reading the simplified and stored introduced gas selection information. In addition, of course, it is preferable that the pipeline information processing be carried out together when the oxidization processing device and pipeline facility 71 are modified, i.e., during change or resetting. The oxide film thickness computing section 66 may be set so as to directly acquire the introduced gas information possessed by the pipeline information processing section 68 when the oxidization processing device and pipeline facility 71 are started up, or alternatively, during modification or the like. As the settings of information acquisition by the oxide film thickness computing section 66, normal settings can be selected as required according to the configuration of the oxidization processing device or pipeline facility 71.

Figure 19:
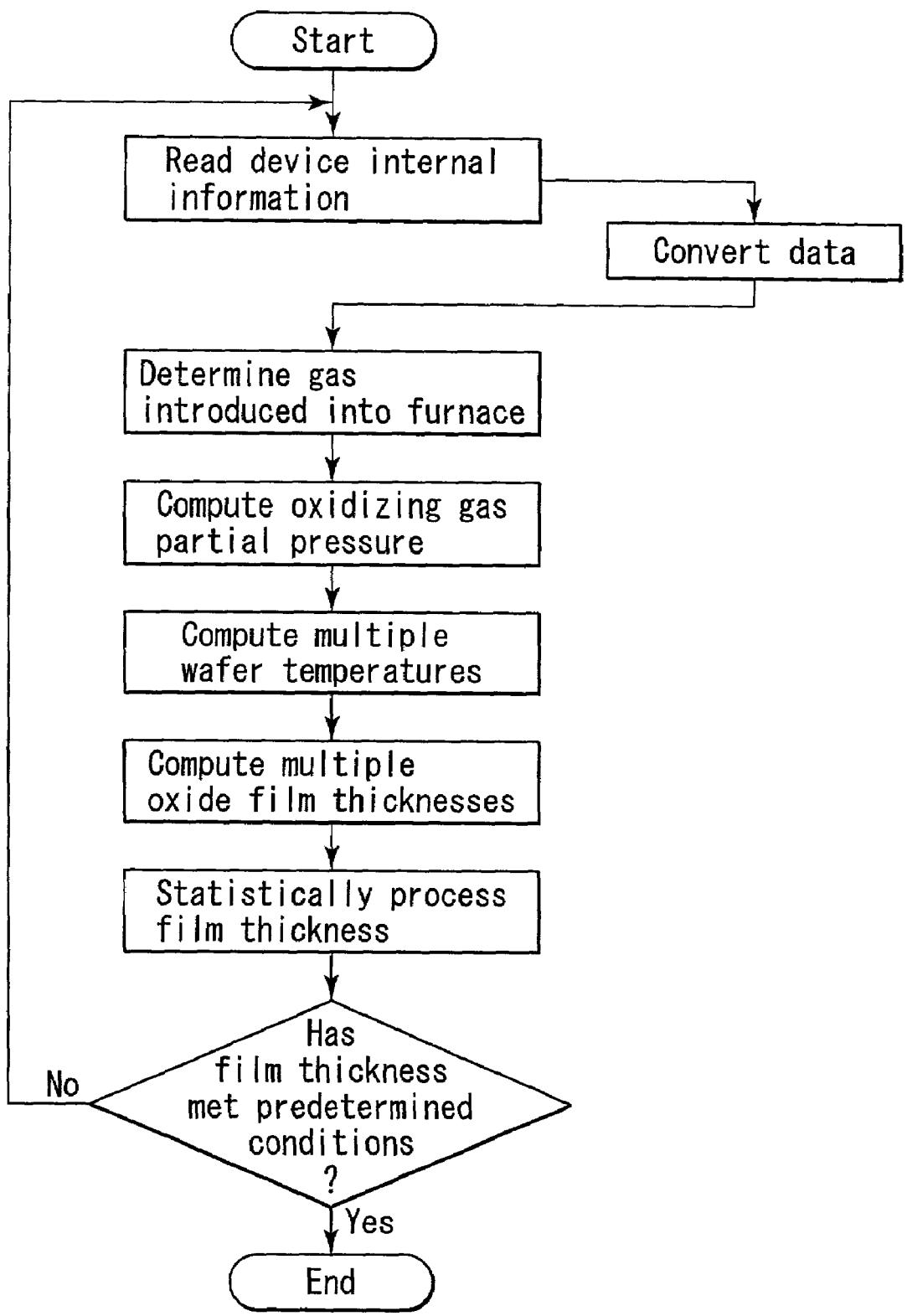
FIG. 19 is a flow chart showing computational procedures carried out by an oxide film thickness computing section in the flow chart of FIG. 18.

As shown in a flow chart of FIG. 19, in comparison, computational processing of the oxide film thickness computation step carried out by the oxide film thickness controller 62 of the present embodiment is different from that carried out by the oxide film thickness controller 52 of the fifth embodiment in that the oxidizing gas determining step of determining the oxidizing gas introduced into the chamber 77 precedes the oxidizing gas partial pressure computation step. At the oxidizing gas determining step, the type and flow rate of the gas introduced into the chamber 77 are specified by using introduced gas determination information.

Figure 20:
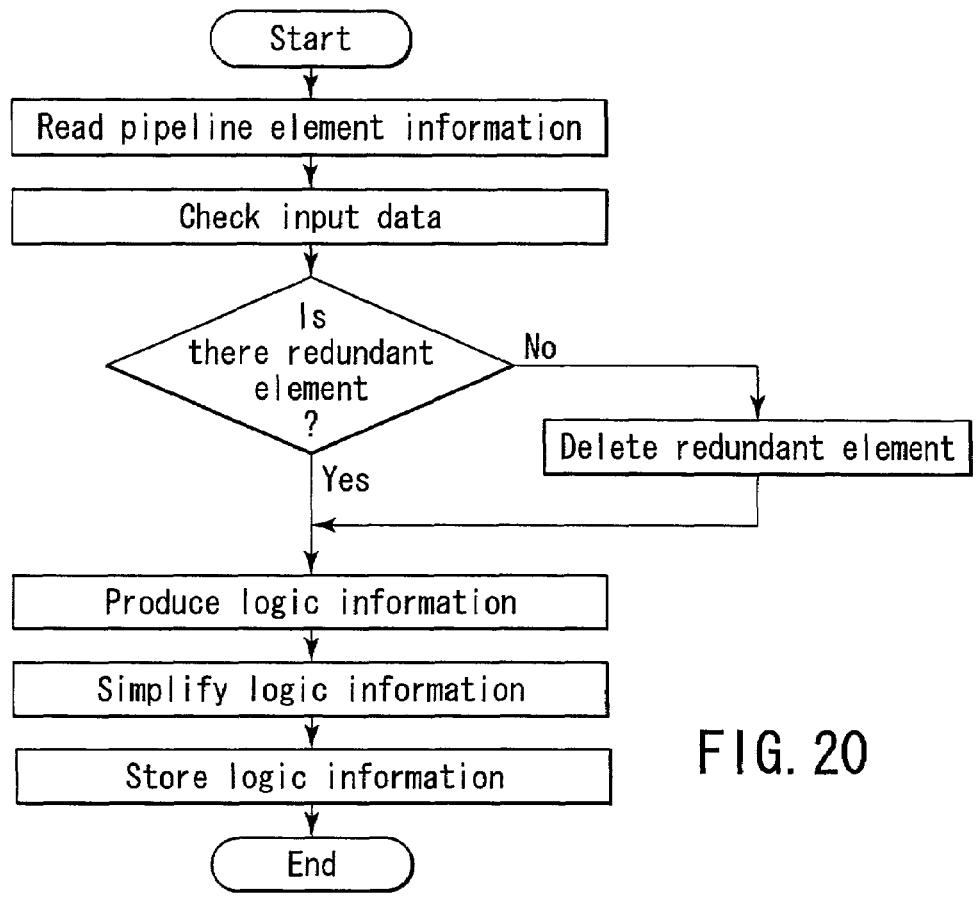
FIG. 20 is a flow chart showing computational procedures for pipeline element information input and pipeline information processing in the flow chart of FIG. 18.

The pipeline information processing section 68 provided at the oxide film thickness controller 62 carries out computational processing in accordance with the sequence of a flow chart shown in FIG. 20.

First, at the pipeline element information reading step, there is read pipeline data including connection information on constituent elements such as a gas source (not shown), the solenoid valves 73a to 73d, 74a to 74d, 75, and 76 each, the gas flow meters (MFC) 72a to 72d each, and an oxidization furnace (chamber) 77 or the like. The pipeline data represents the pipelines 78a to 78d and 79 as nodes, like element connection data inputted to a circuit simulator (not shown), for example. The gas source and solenoid valves 73a to 73d, 74a to 74d, 75, and 76 may each be set to be handled as elements connected to these pipelines 78a to 78d and 79 each. In this case, the pipeline data may be set to be read from at least one of an input/output terminal (not shown), a storage device (not shown) for storing data such as a file in which the information is stored, another input/output terminal (not shown) connected via a LAN, and another data storage device (not shown) connected via a LAN.

Next, at the input data checking step, it is checked whether or not inputted data is logically correct, or alternatively, whether or not the inputted data is described in accordance with a correct input format. This step may be omitted if it is guaranteed that no error occurs in the inputted data.

Next, it is determined whether or not the inputted pipeline information includes an excess pipeline which is not substantially associated with oxidization processing, i.e., a redundant pipeline (element). When the pipeline information does not include such a redundant element, processing goes to the next step of producing logic information. When it includes such a redundant element, processing for removing it is carried out. That is, processing goes to the step of deleting such a redundant element. The redundant element used here specifically denotes a pipeline through which no gas passes when the gas is introduced into the chamber 77, namely, an irrelevant pipeline.

At the step of producing logic information, logic data or logic formula is produced based on data on pipelines 78a to 78d and 79 each serving as nodes, a gas source serving as an element, and solenoid valves 73a to 73d, 74a to 74d, 75, and 76 each. The thus-produced logic data or logic formula is simplified at the next step of simplifying logic information so that computational processing is speeded up at the oxide film thickness computation step including the pipeline information processing in the flow chart shown in FIG. 19. Then, at the last logic information storage step, the simplified logic data, or alternatively, logic information being a logic formula, is stored in an introduced gas selection information/data storage section 69 shown in FIG. 17.

When the simplified logic information is directly inputted at the pipeline element information reading step, the logic information simplified at the logic information storage step may be directly stored in the introduced gas selection information/data storage section 69. In addition, when the data produced at the logic information producing step is directly inputted at the pipeline element information reading step, the step of processing redundant elements and the logic information producing step may be omitted.

As has been described above, according to the sixth embodiment, in addition to the advantageous effect of the previously-described fifth embodiment, the type or flow rate of the gas further introduced into the oxidization furnace 77 and the internal atmosphere of the oxidization furnace 77 can be easily specified. Therefore, the quantity and performance of a semiconductor device manufactured can be further improved, the yield is improved, and productivity can be further improved. In addition, even when startup, modification and the like of the oxidization processing device and pipeline facility 71 are carried out, normal data is selected from among the introduced gas selection information/data stored in the introduced gas selection information/data storage section 69 without replacing the oxide film thickness controller 62 or oxidization processing device, and computational processing suitable therefor is merely carried out, thereby making it possible to cope well with a pipeline change. Further, when startup, modification and the like of the oxidization processing device and pipeline facility 71 are carried out, these items of new information are acquired as new introduced gas selection information/data, and the acquired information/data can be easily stored in the introduced gas selection information/data storage section 69.

Seventh Embodiment

Figure 22:
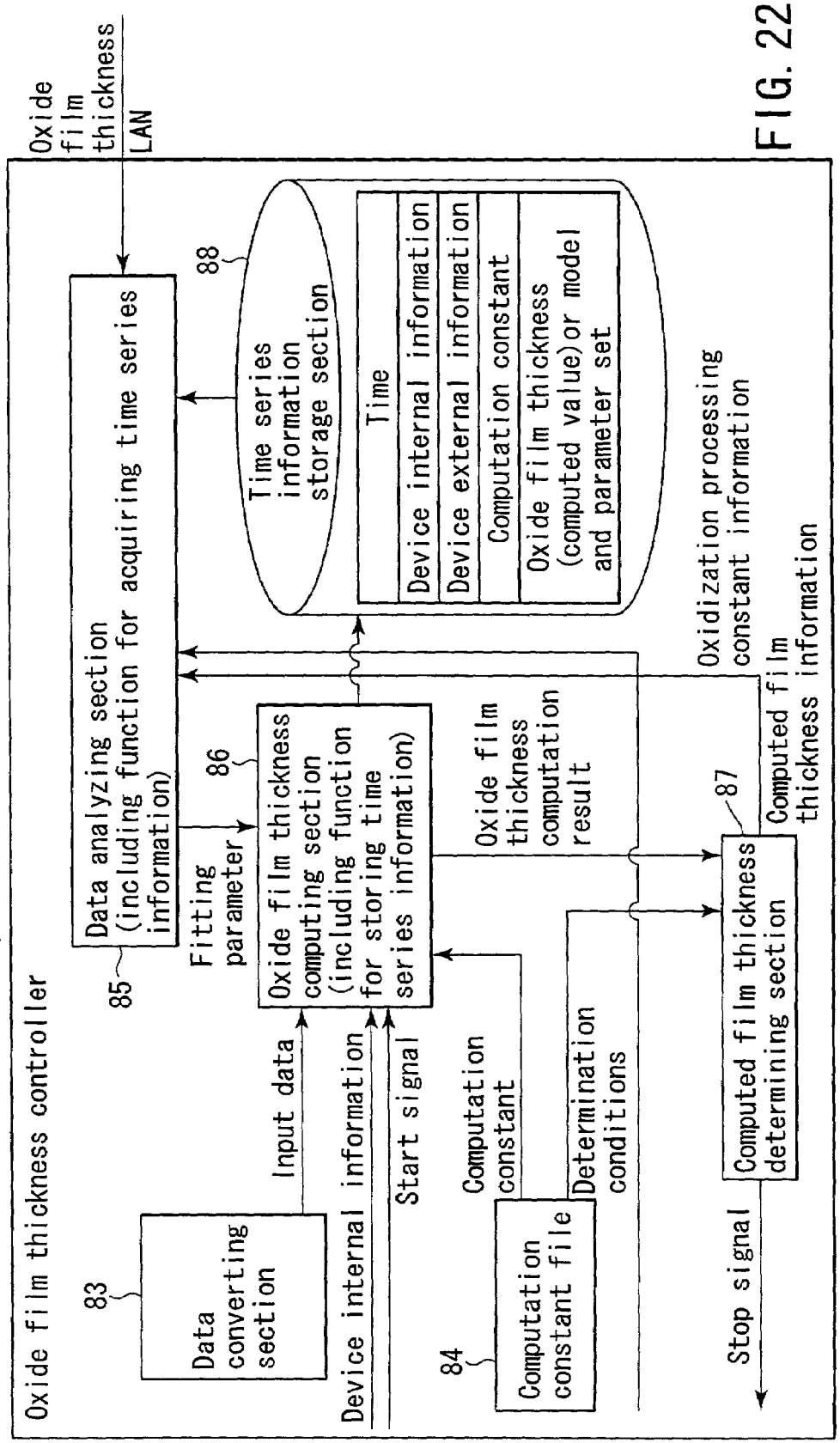
FIG. 22 is a block diagram schematically depicting essential constituent elements inside the process controlling device that a semiconductor device manufacturing apparatus according to a seventh embodiment comprises.
Figure 23:
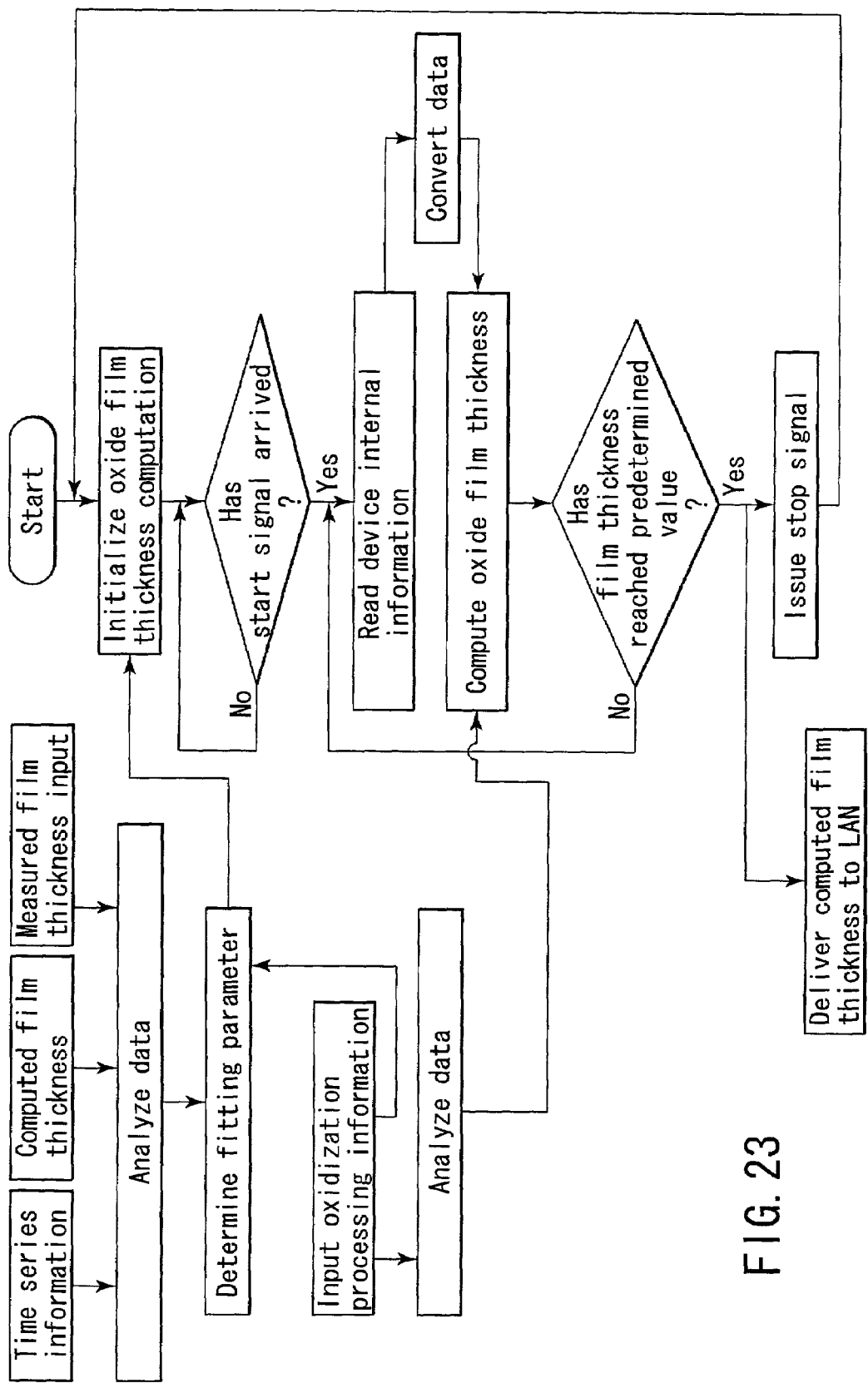
FIG. 23 is a flow chart showing essential portions of the control procedures carried out by the process controlling device of FIG. 22.

FIG. 22 is a block diagram schematically depicting essential constituent elements of the inside an oxide film thickness controller 82 that an oxidization processing device according to a seventh embodiment comprises. FIG. 23 is a flow chart showing essential portions of the control procedures carried out by an oxide film thickness controller 82. Elements identical to those of the first embodiment are designated by like reference numerals. A detailed description thereof is omitted here.

Like the oxide film controllers 3, 13, 32, 42, 52, and 62 of the previously-described first to sixth embodiments, the oxide film thickness controller 82 is assumed to be configured independently of an oxidization furnace controller (not shown). However, the oxide film thickness controller 82 may be integrally configured at the inside the oxidization furnace controller as a part of its function.

In the seventh embodiment, a description will be given with respect to a configuration for, when plural types of gases with a change in flow rate are handled or when film thickness computation is carried out by using temperatures at plural locations, carrying out control with high precision relevant to a dissociation tendency of a difference in film thickness between the computational film thickness that occurs when a plurality of oxidizing processes are carried out and the film thickness of an oxide film actually formed. That is, in the present embodiment, a description will be given with respect to a configuration for substantially correcting a film thickness drift phenomenon, thereby forming an oxide film with a normal film thickness.

In a general oxidization processing device, there is not provided a device for sequentially acquiring and analyzing the internal information and external information on the oxidization furnace while actually measuring them. That is, in such a general oxidization processing device, there is not provided a device which can use the measurement data on internal and external atmospheres of the oxidization furnace by analyzing the data in so called real time. Thus, it has been substantially almost impossible to serially and speedily adapt to a disturbance generated inside and outside the oxidization furnace or oxidization processing by comprising plural types of gases described in the sixth embodiment in combination. Namely, it has been almost impossible to control the oxidization processing device with high precision, thereby speedily correcting an effect caused by a disturbance or gas change so that an oxide film with a normal film thickness is formed.

The oxidization processing device of the present embodiment has a configuration such that such a problem can be solved. Hereinafter, a detailed description will be given focusing on the functions of the oxide film thickness controller 82 that this oxidization processing device comprises.

Figure 24:
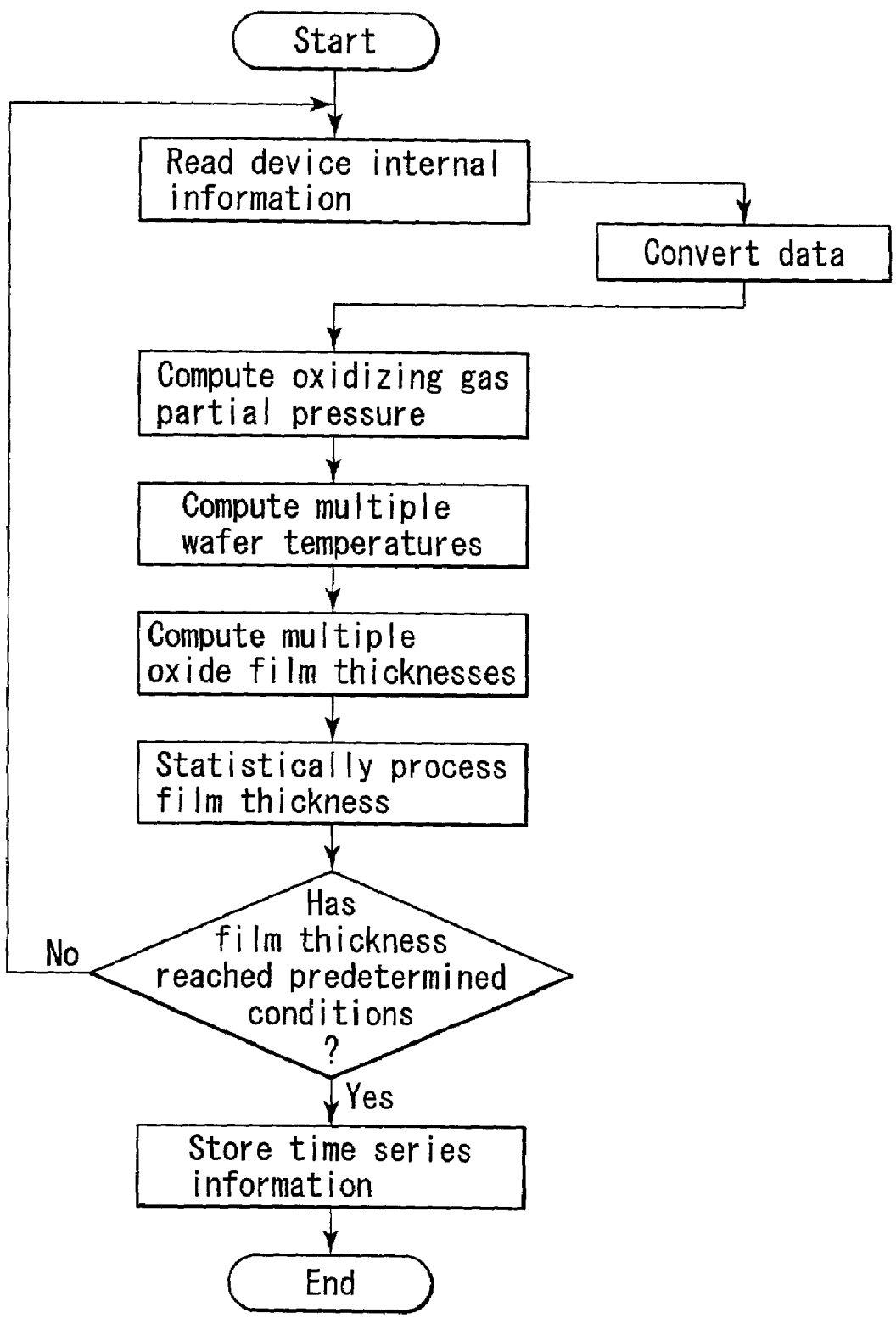
FIG. 24 is a flow chart showing computational procedures for time series information contained in the flow chart of FIG. 23.

As shown in FIG. 24, in comparison, the oxide film thickness controller 82 is different from the oxide film thickness controller 32 of the third embodiment as follows. An oxide film thickness computing section 86 provided inside the oxide film thickness controller 82 has a function for storing information on the inside and outside the monitored oxidization furnace as time series information, i.e., time series data together with the monitored time. In addition, a data analyzing section 85 provided inside the oxide film thickness controller 82 has a function for acquiring these items of time series data. These items of time series data are configured to include the monitored time, information on the inside the oxidization furnace, external information on the outside the oxidization furnace, a computation constant, computed value of oxide film thickness, and predetermined model parameters or the like. In addition, all of these items of information are set to be collectively stored at substantially the same time as when they are monitored every monitoring.

As shown in a flow chart of FIG. 23, in comparison, computational processing carried out by the oxide film thickness controller 82 of the present embodiment is different from that carried out by the oxide film thickness controller 13 of the second embodiment and carried out by the oxide film thickness controller 32 of the third embodiment in that time series data is set to be acquired at the data analyzing section 85.

In addition, the oxide film thickness computing section 86 provided inside the oxide film thickness controller 82 carries out computational processing in accordance with the sequence of a flow chart shown in FIG. 24. In comparison, computational processing carried out by the oxide film thickness computing section 86 is different from that carried out by the oxide film thickness computing section 86 that the oxide film thickness controller 32 of the third embodiment comprises in that the step of storing time series information is added between the step of determining whether or not the film thickness reaches a predetermined value and the step of issuing the step signal. At the step of storing the time series information, for example, time series information is outputted to a system management computer or the like over a LAN (not shown), and is stored therein.

The step of storing time series information is set prior to the step of determining film thickness, for example. In addition, while information on the atmosphere of the inside and outside the oxidization furnace is monitored, the time series information obtained by this monitoring may be set to be stored in a time series information storage section 88 every time oxide film thickness computation is carried out. Because of such a setting, an advantageous effect similar to the above setting can also be obtained. For setting of the step of storing time series information, normal settings may be provided as required in consideration of a predetermined time required for determining the end of the task in advance after monitoring information on the inside and outside the oxidization furnace, and computing the oxide film thickness.

As has been described above, according to the seventh embodiment, a configuration is provided so that time series information required for computing the film thickness of an oxide film can be stored collectively every time oxidization processing is carried out and these items of time series information can be used as required. In this manner, when plural types of gases are handled due to a change in flow rate or when temperatures at a plurality of locations are handled, it is possible to analyze these gases and temperatures serially in detail. Then, parameter fitting can be carried out with high precision. Therefore, it is possible to control the oxidization processing device with high precision so as to speedily correct an effect caused by disturbance or gas change. In this manner, a drift in film thickness generated in oxidization processing of the semiconductor device over a plurality of times can be included within an allowable tolerance, and an oxide film with a normal film thickness can be formed. Finally, the quality and performance of a semiconductor device manufactured can be further improved, the yield is improved, and productivity can be further improved.

Eighth Embodiment

Figure 25:
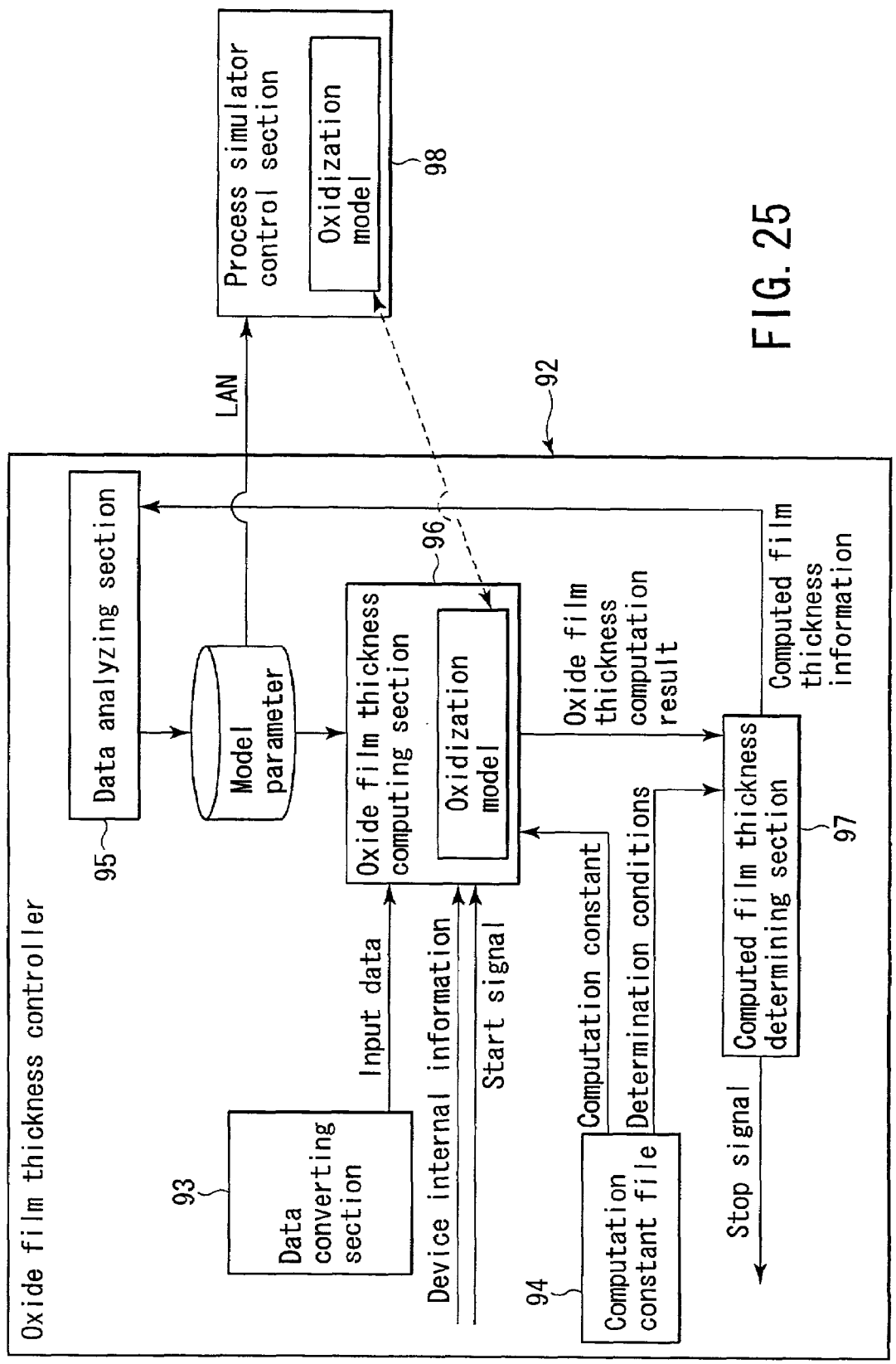
FIG. 25 is a block diagram schematically depicting essential constituent elements inside the process controlling device that a semiconductor device manufacturing apparatus according to an eighth embodiment comprises, and a simulation apparatus.
Figure 26:
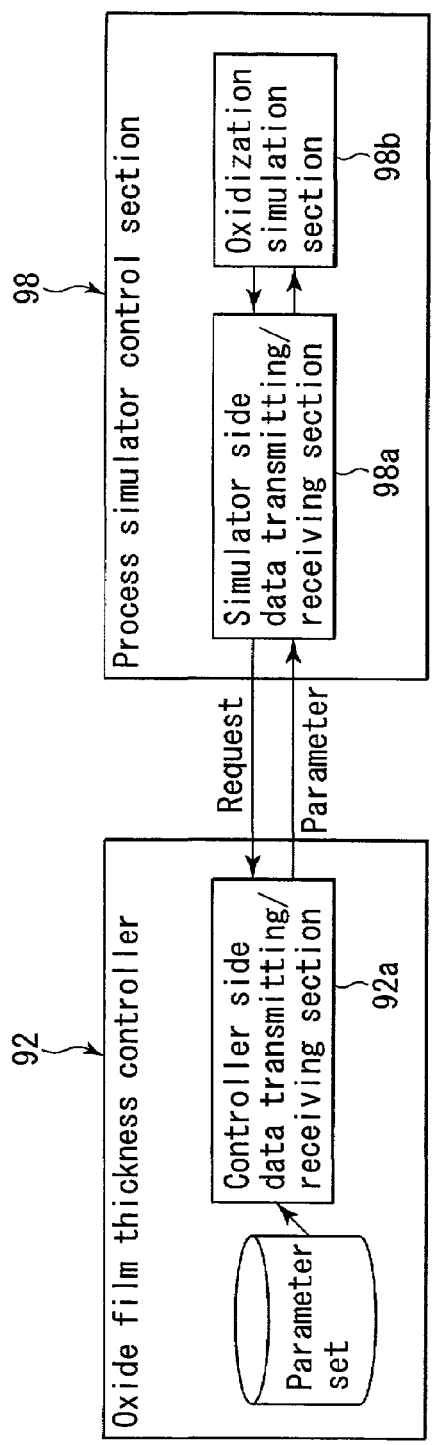
FIG. 26 is a block diagram schematically depicting an example of data transmission/reception between the process controlling device and simulation apparatus of FIG. 25.
Figure 27:
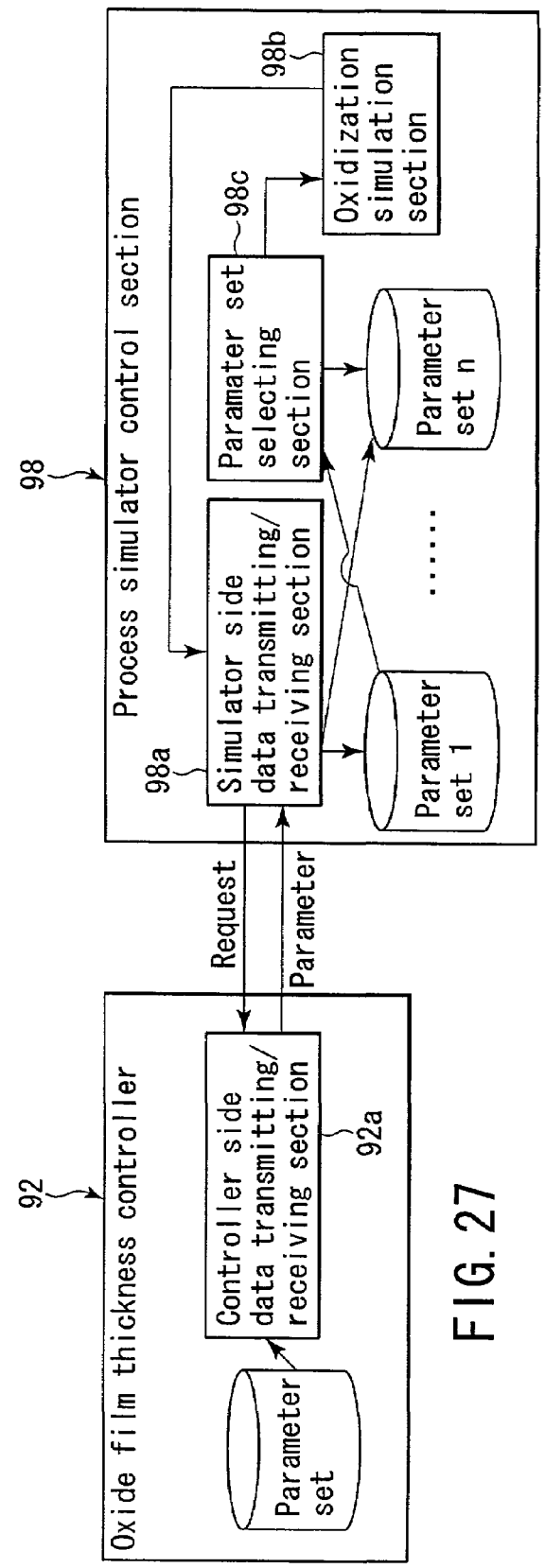
FIG. 27 is a block diagram schematically depicting another example of data transmission/reception between the process controlling device and simulation apparatus of FIG. 25.
Figure 28:
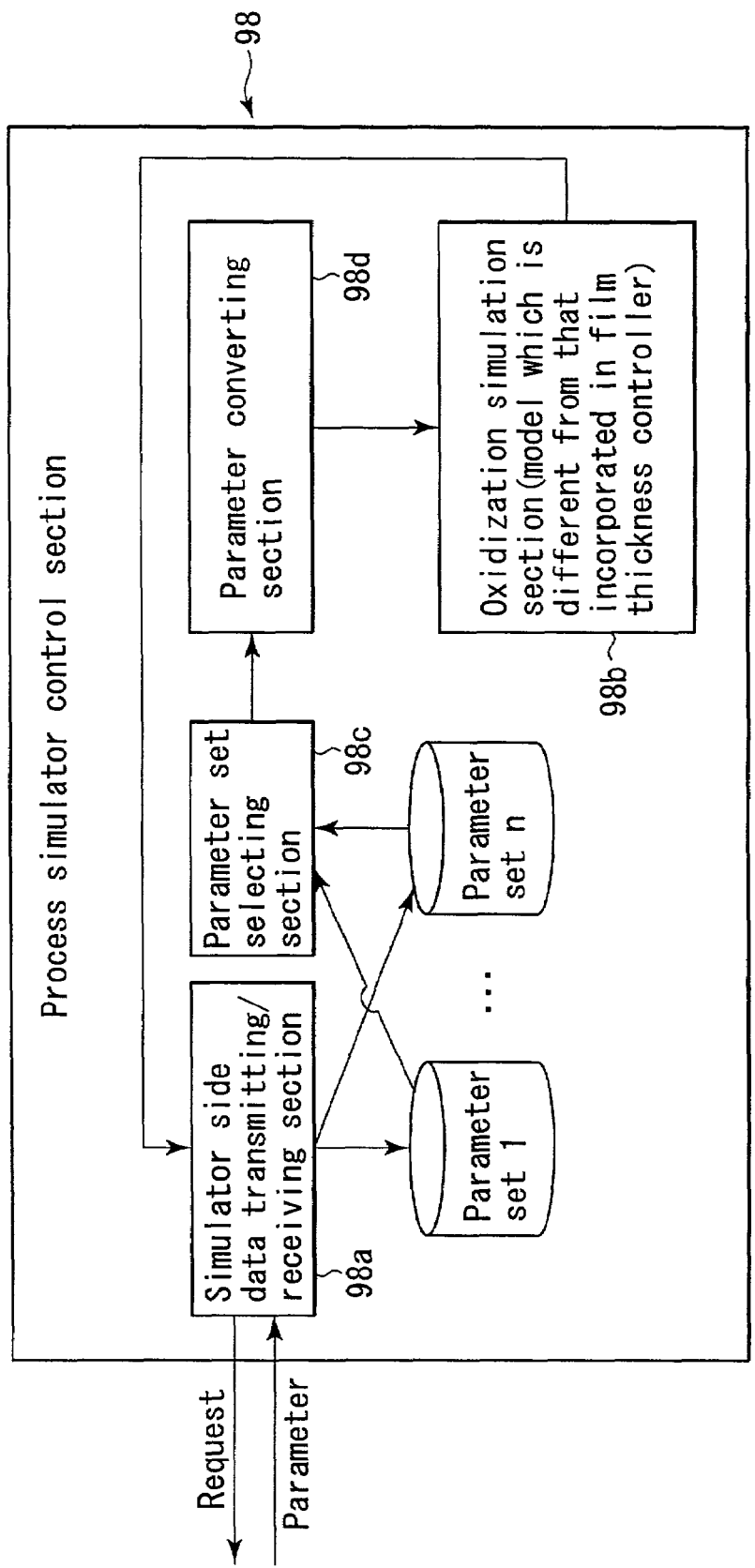
FIG. 28 is a block diagram schematically depicting a still another example of data transmission/reception between the process controlling device and simulation apparatus of FIG. 25.

FIG. 25 is a block diagram schematically depicting essential constituent elements of the inside an oxide film thickness controller 92 that an oxidization processing device according to an eighth embodiment comprises, and a simulation device 98. FIG. 26 to FIG. 28 are block diagrams schematically depicting three typical examples of data transmission/reception between an oxide film thickness controller 92 and the simulation device 98. Elements identical to those of the first embodiment are designated by like reference numerals. A detailed description thereof is omitted here.

Like the oxide film controllers 3, 13, 32, 42, 52, 62, and 82 of the previously-described first to seventh embodiments, the oxide film thickness controller 92 is assumed to be configured independently of an oxidization furnace controller (not shown). However, the oxide film thickness controller 92 may be integrally configured inside the oxidization furnace controller as a part of its function.

In general, at the semiconductor device design stage, computer-assisted simulation of the impurity distribution or shape, electrical characteristics, and circuit actuation state of the semiconductor device, i.e., computer simulation is carried out for the purpose of quality evaluation or structural analysis, and prediction of finish. With downsizing of the semiconductor device, there is a growing need for high precision control of an apparatus for manufacturing a variety of semiconductor devices. Similarly, in computer simulation as well, there is a growing need for simulation precision which is much higher than conventional. For example, in an invention disclosed in Jpn. Pat. Appln. KOKAI Publication No. 8-55145, there is disclosed a method of changing an oxidization speed until an actually measured value and a simulation value have coincided with each other in order to simulate the oxide film thickness with high precision.

However, no consideration is taken into information on the inside and outside the oxidization furnace in real time which includes disturbance described in the first to seventh embodiments, or alternatively, a process sequence such as gas change or increasing and reducing a temperature. Therefore, even if simulation under a very limited condition is achieved with high precision, it is substantially impossible to achieve a wide range of simulation handled by an actual semiconductor device manufacturing apparatus with high precision.

The oxidization processing device of the present embodiment has a configuration such that such a problem can be solved. Hereinafter, a detailed description will be given focusing on the function of the oxidizing film thickness controller 92 that the oxidization processing device comprises and a simulation device 98 of a process for manufacturing a semiconductor device connected to the oxide film thickness controller 92. However, in FIG. 25 to FIG. 28, there is illustrated only a process simulator control section serving as a simulator main body which substantially controls essential elements of the simulation function that the simulation device 98 comprises. In the following description, this process simulator control section 98 is represented as a simulation device. The process simulator control section 98 substantially controls essential portions of the simulation function that the simulation device comprises. In such a description as well, the spirit of the present invention and understanding thereof are not prevented.

In the previously-described first to seventh embodiments each, a description has been given with respect to the oxidization processing device and control method thereof, and a control device and oxidization processing method. In contrast, in the eighth embodiment, a description will be given with respect to functions of the process simulator control section 98 including: a function for acquiring plural types of fitting parameters described previously; a function for selecting a plurality of fitting parameters; and a function for converting parameters. In the present embodiment, an oxidization process simulation is taken up as simulation carried out by the process simulator control section 98. However, of course, a semiconductor device manufacturing process that can be simulated by this process simulator control section 98 can be applied to all the manufacturing processes utilizing a thermo-chemical reaction, such as control of scattering length of impurities, deposited film thickness of a thin film due to CVD, nitriding quantity, a melt quantity of a BPSG film or the like, densification quantity of a CVD oxide film or the like, or silicide film thickness. A description thereof is omitted here.

The oxide film thickness controller 92 and process simulator control section 98 are connected to each other via a LAN, as shown in FIG. 25. The process simulator control section 98 has a function for acquiring model parameters stored in a data analyzing section 95 that the oxide film thickness controller 92 comprises. In addition, an oxidization model possessed by the oxide film thickness computing section 96 of the oxide film thickness controller 92 and an oxidization model possessed by the process simulator control section 98 are set and configured as having compatibility.

The functions of the oxide film thickness controller 92 and the functions of the process simulator control section 98 are specifically set and configured to be associated with each other as shown in FIG. 26. The oxide film thickness controller 92 comprises a controller side data transmitting/receiving section 92a. On the other hand, the process simulator control section 98 comprises a simulator side data transmitting/receiving section 98a and an oxidization simulation section 98b. The process simulator control section 98 transmits a request via a LAN to the controller side data transmitting/receiving section 92a as required. The oxide film thickness controller 92 transmits a model parameter set suitable for such a request to the simulator side data transmitting/receiving section 98a via a LAN. The simulator side data transmitting/receiving section 98a receives the model parameter set transmitted from the oxide film thickness controller 92. Then, the simulator side data transmitting/receiving section 98a delivers the received model parameter set to the oxidization simulation section 98b, and causes the simulation section to execute predetermined simulation.

Another configuration of the process simulator control section 98 is shown in FIG. 27. This process simulator control section 98 has a function for storing one or plural model parameter sets that have been received. The model parameter sets are stored in time series in accordance with its time sequence when the parameter sets are fitted. In addition, the process simulator control section 98 comprises a parameter set selecting section 98c having a function for selectively acquiring a desired one from among plural model parameter sets. The thus-selected model parameter set is delivered from the parameter set selecting section 98c to the oxidization simulation section 98b in the process simulator control section 98. The oxidization simulation section 98b executes oxidization simulation based on the model parameter set delivered from the parameter set selecting section 98c. As a method of identifying the model parameter sets each, for example, the date and time of fitting or a name including a device name may be used. However, with respect to the name of each model parameter set, it is basically sufficient if a difference among the model parameter sets each can be discriminated. Thus, a name of its arbitrary format can be used unless the name has been duplicated with another one.

In transmitting/receiving information between the process simulator control section 98 and the oxide film thickness controller 92, it is not always necessary to provide settings carried out by transmitting a request from the process simulator control section 98 to the oxide film thickness controller 92. For example, the oxide film thickness controller 92 may be set to automatically transmit latest model parameter sets to the process simulator control section 98 every time the parameter sets are fitted. In this case, the process simulator control section 98 may be set to receive and store in time series and automatically its latest model parameter sets in transmission order.

Still another configuration of the process simulator control section 98 is shown in FIG. 28. The process simulator control section 98 is configured as comprising a parameter converting section 98d having a function for converting model parameter sets of the oxidization model stored in an oxidization film thickness controller (not shown) to model parameter sets of the oxidization model with a larger amount of information than the former. The oxidization model with a larger amount of information than that stored in the oxide film thickness controller specifically denotes an oxidization model having an amount of information capable of carrying out numeric computation at a higher level than that incorporated in the oxide film thickness controller. Namely, this model denotes an oxidization model including a rich amount of information, the model being capable of simulating phenomena that includes a phenomenon that can be simulated by the oxidization model stored in the oxide film thickness controller.

However, the oxidization model converted by the parameter converting section 98d includes a larger amount of information than that stored in the oxide film thickness controller. Thus, data compatibility between these oxidization models is degraded. For an oxidization model capable of carrying out numeric computation at a higher level than that stored in the oxide film thickness controller, there may be used a model parameter set other than that converted at the parameter converting section 98d.

As has been described above, according to the eighth embodiment, the process simulator control section 98 is connected to the oxide film thickness controller 92. Thus, simulation is carried out prior to carrying out oxidization processing, whereby more normal and higher precise model parameter set can be used for controlling the oxidization processing device. This makes it possible to compute the oxide film thickness with higher precision and to improve the predicted precision of oxidization characteristics of the oxidization processing device. In particular, at the process simulator control section 98, a model parameter set with its high precision in accordance with a drift phenomenon of the oxide film thickness described in the seventh embodiment, for example, in time series can be used as a simulation model parameter set, thus enabling simulation with its very high precision considering the latest state of an oxidization furnace (not shown).

In addition, the process simulator control section 98 is configured as comprising a parameter set selecting section 98c having a function for selecting a plurality of model parameter sets. This enables simulation considering a state of an oxidization furnace immediately after oxidization processing has been applied to a semiconductor device (not shown), for example. For example, a semiconductor device immediately after oxidization processing has been applied thereto can be analyzed with higher precision. In particular, where a configuration is provided such that time series information possessed by the oxide film thickness controller 92 is also transferred to the process simulator control section 98, analysis with higher precision is possible. Such settings are particularly effective when an oxide film is formed in accordance with batch processing.

Further, the process simulator control section 98 is configured as comprising a parameter converting section 98d having a function for converting a model parameter set to that having a larger amount of information. In this manner, the model parameter set of the oxidization model incorporated in the oxide film thickness controller 92 can be converted into that which can be used for numeric computation at a higher level. Therefore, more complicated, more precise simulation can be carried out.

As has been described above, according to the present embodiment, simulation can be carried out prior to actual oxidization processing. Thus, the quality and performance of a semiconductor device manufactured can be significantly improved. In addition, the yield is significantly improved, and productivity can be significantly improved.

Ninth Embodiment

Figure 29:
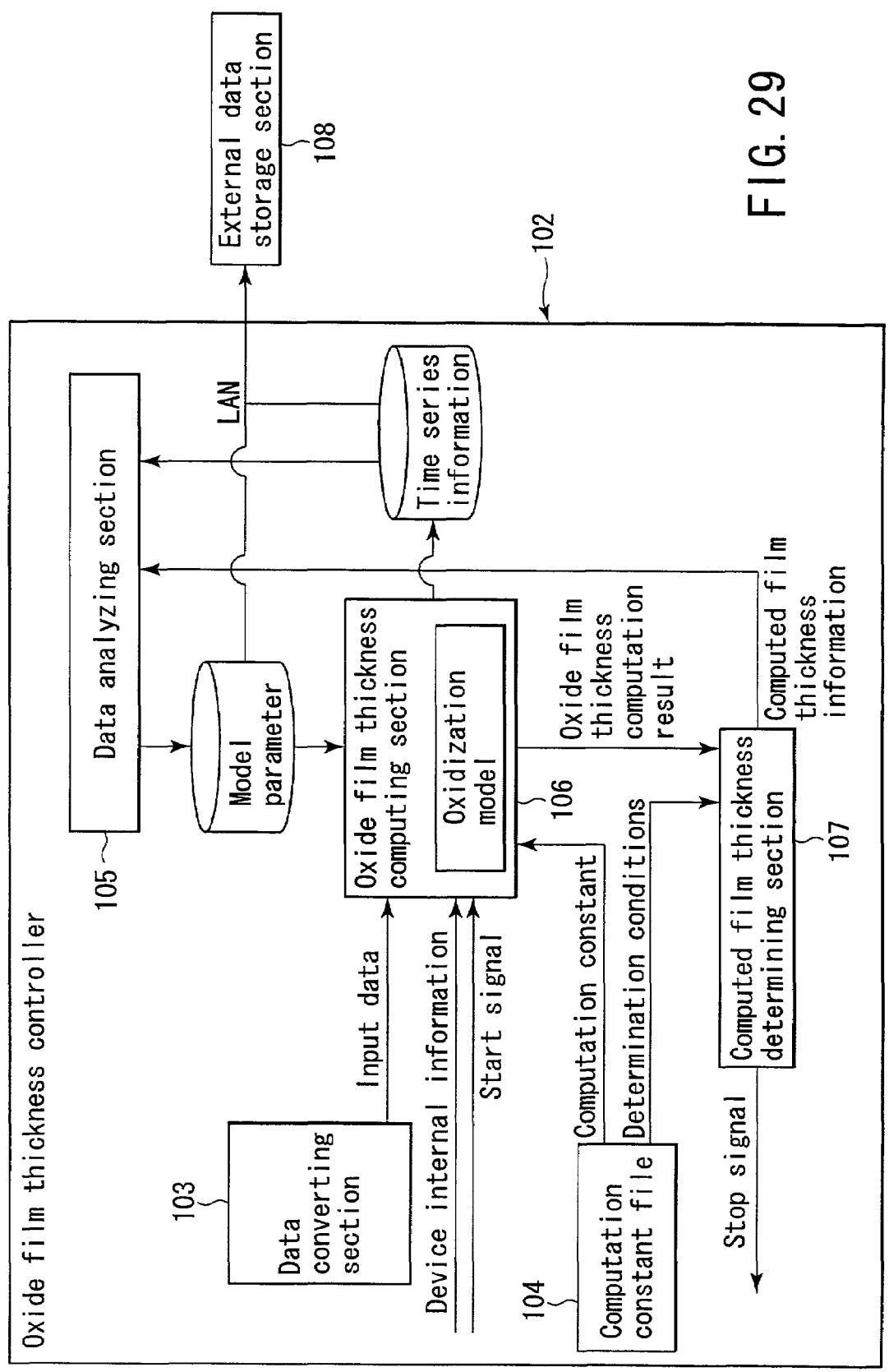
FIG. 29 is a block diagram schematically depicting essential constituent elements inside a process controlling device that a semiconductor device manufacturing apparatus according to a ninth embodiment comprises, and an external data storage device.
Figure 30:
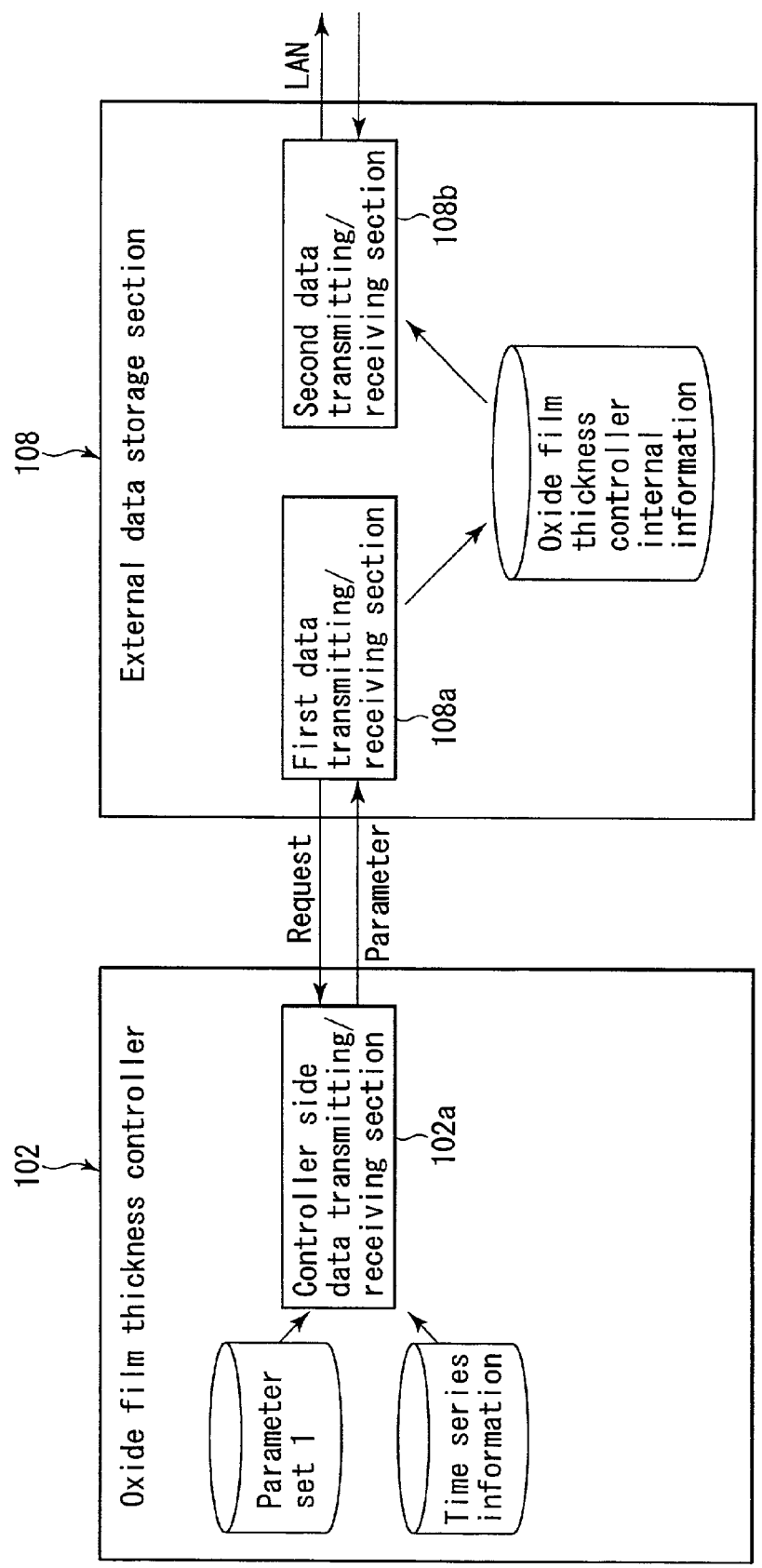
FIG. 30 is a block diagram schematically depicting an example of data transmission/reception between the process controlling device and external data storage device of FIG. 29.
Figure 31:
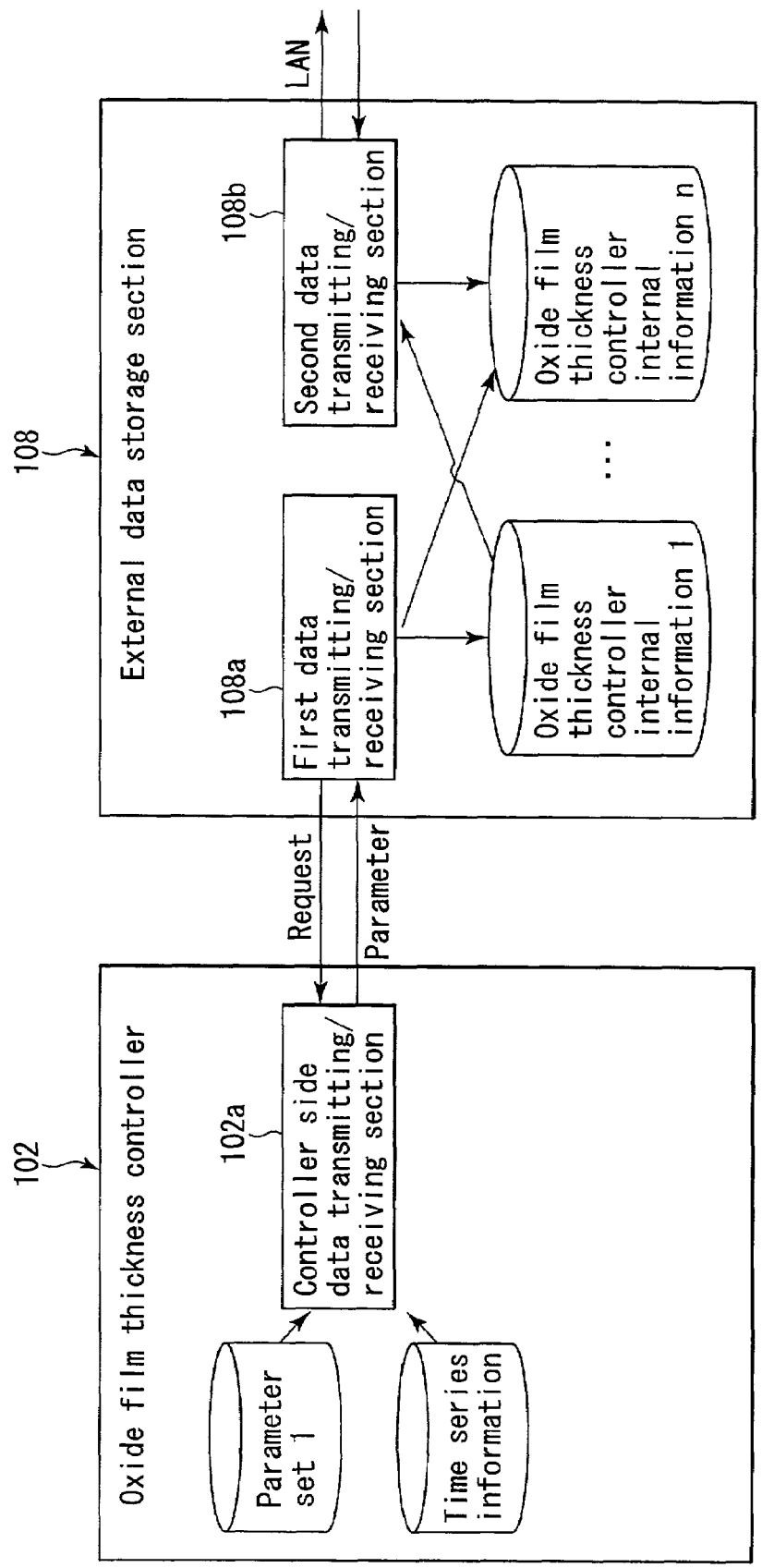
FIG. 31 is a block diagram schematically depicting another example of data transmission/reception between the process controlling device and external data storage device of FIG. 29.
Figure 32:
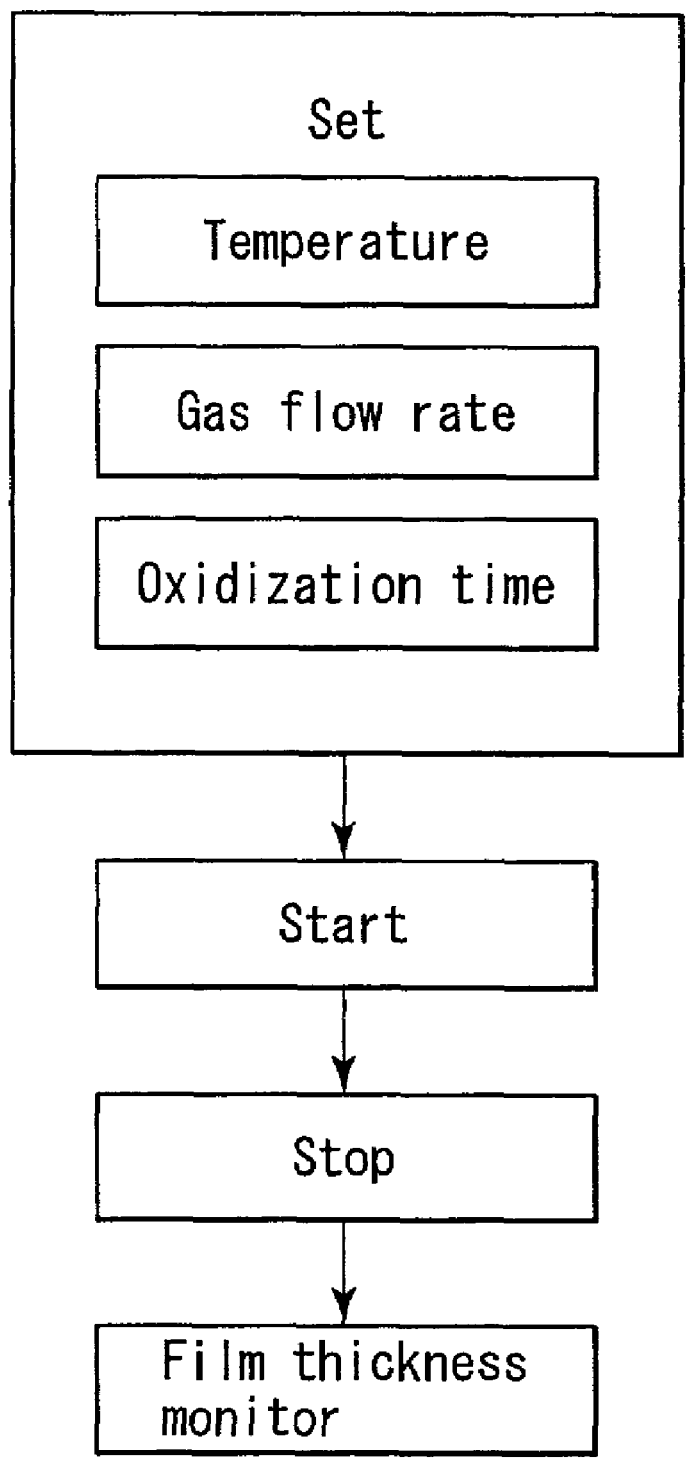
FIG. 32 is a flow chart showing an oxidizing process carried out by a semiconductor device manufacturing apparatus and a control apparatus thereof according to the prior art.

FIG. 29 is a block diagram schematically depicting essential constituent elements of the inside the oxide film thickness controller 102 that an oxidization processing device according to a ninth embodiment comprises, and an external data storage device 108. FIG. 30 and FIG. 31 are block diagrams schematically depicting two typical examples of data transmission/reception between an oxide film thickness controller 102 and the external data storage device 108. Elements identical to those of the first embodiment are designated by like reference numerals. A detailed description thereof is omitted here.

Like the oxide film thickness controllers 3, 13, 32, 42, 52, 62, 82, and 92 of the previously-described first to eighth embodiments, the oxide film thickness controller 102 is assumed to be configured independently of an oxidization furnace controller (not shown). However, the oxide film thickness controller 102 may be integrally configured inside an oxidization furnace controller as a part of its functions.

In the previously-described eighth embodiment, a description has been given with respect to the simulation device 98 having a function for acquiring the information contained in the oxide film thickness controller 92 composed of at least one of fitted parameters and time series information as a simulation model parameter set. In the ninth embodiment, as shown in FIG. 29, at least one of the fitted model parameters and time series information is set to be stored in the external data storage device 108 externally connected to the oxide film thickness controller 102.

In this case, for example, as shown in FIG. 30, data transmission/reception between the oxide film thickness controller 102 and the external data storage device 108 may be set to be carried out in the same way as data transmission/reception between the oxide film thickness controller 92 and the process simulator control section 98 of the eighth embodiment. Specifically, a first data transmitting/receiving section 108a provided at the external data storage device 108 transmits a request to a controller side data transmitting/receiving section 102a provided at the oxide film thickness controller 102. The controller side data transmitting/receiving section 102a having received the above request transmits a model parameter set suitable for such a request to the first data transmitting/receiving section 108a. The first data transmitting/receiving section 108a having received the model parameter set stores it in the external data storage device 108.

In addition, the model parameter set stored in the external data storage device 108 may be set to be used as processing conditions for another external device (not shown). In this case, as shown in FIG. 30, the model parameter set stored in the external data storage device 108 may be set to be transmitted to another external device via a LAN from a second data transmitting/receiving section 108b provided at the external data storage device 108. Specifically, the second data transmitting/receiving section 108b receives a request from another external device via a LAN or the like. The 108b having received such a request selects a model parameter set suitable for the request from the model parameter sets stored in the external data storage device 108, and transmits the thus-selected parameter set to another external device.

According to such settings, the model parameter sets stored in the external data storage device 108 can be used as shared data of the entire of a series of a semiconductor device manufacturing process including thermal oxidization processing. For example, the model parameter sets stored in the external data storage device 108 can be used as processing data for the semiconductor device manufacturing process without thermo-chemical reaction carried out before and after thermal oxidization processing to be carried out to be smoothly linked with the thermal oxidization processing. In this manner, in the entire series of semiconductor device manufacturing processes including thermal oxidization processing, a load on wafer or the like is reduced, and the quality and performance of the semiconductor device can be improved. In addition, the yield of the semiconductor device is improved, and the productivity of the semiconductor device can be improved.

Transmission of model parameter sets from the external data storage device 108 to another external device may be set to be automatically carried out toward another external device based on a predetermined interval, for example, as well as to respond to a request from another external device. In addition, the model parameter sets stored in the external data storage device 108 may be set to be transmitted to a system management computer (not shown), for example, as well as to be individually transmitted to another external device. In this manner, batch management of model parameter sets can be carried out by the system management computer, thus making it possible to simplify information transmission/reception between devices in the entire of a series of a semiconductor device manufacturing process. Finally, transmission/reception of incorrect information between devices in the entire of a series of a semiconductor device manufacturing system is reduced, and the possibility of system down of the entire semiconductor device manufacturing system can be prevented in advance.

In addition, as shown in FIG. 31, the external data storage device 108 may be set to store a plurality of information possessed by the oxide film thickness controller 102 therein, select normal information as required or in response to an external request from among these items of information, and transmit the selected information to the oxide film thickness controller 102 or another external device. In this case, such information selection may be set to be made by the oxide film thickness controller 102. Alternatively, such information selection may be set to be made by the system management computer which is more highly ranked than the oxide film thickness controller 102.

As has been described above, according to the ninth embodiment, various types of information that the oxide film thickness controller 102 possesses is stored in the external data storage device 108. In this manner, a device other than an oxidization processing device requiring the information contained in the oxide film thickness controller 102 easily uses only required information of these various items of stored information by acquiring it at a required time. Namely, the information contained in the oxide film thickness controller 102 can be easily used as control data for a manufacturing device for carrying out a semiconductor device manufacturing process other than hot process, i.e., a manufacturing device for carrying out a semiconductor device manufacturing process free of using thermo-chemical reaction.

For example, in a series of semiconductor device manufacturing processes, wafer washing or polishing is carried out as preprocessing of the hot process, and the sputtering or lithography steps or the like is carried out as postprocessing of the hot process. In this case, according to the previously-described settings, each process can be adjusted as required in a normal state so as to reduce a load on the wafer during each process, or alternatively, a load on the wafer during interaction between the processes. In addition, the hot process and non-hot process can be carried out to be smoothly linked with each other so as to reduce a load on the wafer. In this manner, in the entire of a series of a semiconductor device manufacturing process including hot process, a load upon the water or the like is reduced, and the quantity and performance of the semiconductor device can be provided. In addition, the yield of the semiconductor device is improved, and the productivity of the entire manufacturing plant facility of semiconductor devices (not shown) can be improved.

A method and apparatus for manufacturing a semiconductor device, a method and apparatus for controlling the same, and a method and apparatus for simulating a semiconductor device manufacturing process according to the present invention are not limited to the previously-described first to ninth embodiments. Parts of configurations or steps of these methods and apparatuses can be variously changed, or alternatively, a variety of settings can be provided by changing a configuration thereof, or alternatively, a part of the step into various settings using a variety of settings to be properly combined as required within deviating from the spirit of the present invention.

For example, the fifth embodiment is applicable to the third embodiment consisting of a configuration in which an oxidizing apparatus has a device capable of directly monitoring a wafer temperature. In this case, the functions and steps of the fourth embodiment, which are added to those of the third embodiment, may be eliminated. In addition, the gas partial pressure and the temperatures at a plurality of locations are independent of each other, the gas partial pressure computation step and the multiple location temperature computation step can be exchanged with each other. In addition, a correlation exists between the gas partial pressure and each of the temperatures at plural locations, the gas partial pressure computation step and the multiple location temperature computation step may be processed at the same time.

In addition, the data analyzing section 85 of the seventh embodiment may be set as having a function for sampling a parameter change tendency or parameter trend from the past to current time series information and generating parameters for predicting a future state.

In the eighth embodiment, for example, when a drift phenomenon of oxide film thickness occurs when the characteristics of a semiconductor device before prototyped is predicted, and the semiconductor device is prototyped after a new model parameter set has been generated, there occurs a problem as to what model parameter set is used to carry out simulation. In this case, for example, the data analyzing section 95 incorporated in the oxide film thickness controller 92 is incorporated in the process simulator control section 98 as well. Then, a configuration may be provided so as to carry out simulation by using a model parameter set suitable for past data on average, or alternatively, a model parameter set fitted to oxidization processing information. Alternatively, a function for predicting and computing a model parameter set for prototyping a semiconductor device from the trend of change in past model parameter set, is imparted to the process simulator control section 98. Then, settings may be provided such that simulation is carried out in accordance with this newly computed model parameter set.

In addition, in the eighth embodiment, although the model parameter set of the oxide film thickness controller 92 is transferred to the process simulator control section 98, the time series information possessed by the oxide film thickness controller 92 may be set to be transferred to the process simulator control section 98 instead of such a model simulator set. Alternatively, both of the model parameter set and time series data are set to be transferred to the process simulator control section 98.

Further, in the ninth embodiment, of course, various types of information stored in the oxide film thickness controller 102 may be directly transmitted to/received from a device requiring it.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    starting a process of manufacturing a semiconductor device utilizing a thermo-chemical reaction after receiving a start signal;
    measuring a plurality of process parameters defining a state function of an atmosphere associated with said thermo-chemical reaction in real time;
    analyzing a processing state of a target element associated with the thermo-chemical reaction in real time for each run, based on measurement data obtained by the measurement of the process parameters, which changes for each run; and
    predicting in real time whether or not the processing state of the target element reaches a target value associated with an end condition, based on analysis data obtained by the analysis at any time,
    wherein the manufacturing process is controlled so that the processing state of the target element reaches the target value from a start to an end of the manufacturing process without being bound by a predetermined proceeding schedule of the manufacturing process.

2. A method of manufacturing a semiconductor device according to claim 1, wherein said measurement is intermittently carried out with a predetermined interval and said analysis is carried out in an order in which said measurement data is obtained, and wherein, in carrying out said feedback, parameters associated with control of said manufacturing process are corrected in time series in the order in which said measurement data and said analysis data are obtained based on said analysis data.

3. A method of manufacturing a semiconductor device according to claim 1, wherein said measurement and analysis are carried out at a plurality of portions in said atmosphere.

4. A method of manufacturing a semiconductor device according to claim 1, wherein said measurement data and said analysis data are stored in time series in the order in which these items of data each are obtained, and said feedback is carried out in the order in which these items of data are stored.

5. A method of manufacturing a semiconductor device according to claim 1, wherein at least one of said measurement data and said analysis data is used as data for simulation of said manufacturing process.

6. A method of manufacturing a semiconductor device according to claim 1, wherein at least one of said measurement data and said analysis data is used as data for control of a process of manufacturing a semiconductor device without thermo-chemical reaction.

7. A method of manufacturing a semiconductor device according to claim 1, wherein said measurement data is acquired to be branched into a plurality of routes, the measurement data for each route is compared with each other, and said manufacturing process is carried out so that these items of measurement data coincide with each other.

8. A method of manufacturing a semiconductor device according to claim 1, wherein said manufacturing process is carried out so that a temperature of said atmosphere coincides with a temperature of a target element to be processed by said thermo-chemical reaction.

9. A method of manufacturing a semiconductor device according to claim 1, wherein
    the parameter for use in analysis is fitted for the every runs before starting the every runs.

10. A method of manufacturing a semiconductor device according to claim 1, wherein
the thermo-chemical reaction is one of a reaction among a making of an oxide film, a making of a silicide film, a scattering of impurities, a depositing of a thin film due to CVD, a nitriding of a film, a melting of an insulated film, and a densifying of a CVD oxide film.

11. The method of manufacturing a semiconductor device according to claim 1, further comprising:
stopping the process of manufacturing a semiconductor device when an expected final processing state of the target element reaches the target value, so that an actual finished processing state of the target element reaches the target value.

12. The method of manufacturing a semiconductor device according to claim 1, further comprising:
indirectly measuring the processing state of the target element by using the measurement data to compute the processing state.

13. The method of manufacturing a semiconductor device according to claim 1, wherein
the processing state is one of a scattering length of impurities, a thickness of a film, a nitriding quantity of a nitride film, a melt quantity of a film, and a density quantity of a film.

14. A method of manufacturing a semiconductor device according to claim 1, further comprising:
generating a stop signal to end the process when it is predicted that the processing state of the target element has reached the target value.

15. An apparatus for manufacturing a semiconductor device comprising:
a process carrying out section which carries out a process of manufacturing a semiconductor device utilizing a thermo-chemical reaction after receiving a start signal;
a process carrying out section controlling device which controls an operational state of this process carrying out section;
a measuring instrument which measures a plurality of process parameters defining a state function of an atmosphere associated with the thermo-chemical reaction in real time; and
a process controlling device which analyzes a processing state of a target element associated with the thermo-chemical reaction in real time for each run, based on measurement data obtained by the measurement of the process parameters, which changes for each run, and predicts in real time whether or not the processing state of the target element reaches a target value associated with an end condition based on analysis data obtained by the analysis at any time, and controls the manufacturing process so that the processing state of the target element reaches the target value from a start to an end of the manufacturing process without being bound by a predetermined proceeding schedule of the manufacturing process.

16. An apparatus for manufacturing a semiconductor device according to claim 15, comprising a simulation device for a process of manufacturing a semiconductor device which simulates said manufacturing process based on at least one of said measurement data and said analysis data.

17. An apparatus for manufacturing a semiconductor device according to claim 15, comprising an external data storage device which stores at least one of said measurement data and said analysis data as data for control of a process of manufacturing a semiconductor device without thermo-chemical reaction.

18. An apparatus for manufacturing a semiconductor device according to claim 15, comprising:
a route which collects said measurement data of said atmosphere in said process carrying out section via said process carrying out section controlling device; and
a route which collects said measurement data without passing through said process carrying out section controlling device, said apparatus comprising a data comparator which compares measurement data with each other, the measurement data being collected via each of these routes.

19. An apparatus for manufacturing a semiconductor device according to claim 15, wherein said process carrying out controlling device sets a temperature of said atmosphere in said process carrying out section so that the temperature of said atmosphere in said process carrying out section coincides with a temperature of a target element housed in said process carrying out section, and then, processed by said thermo-chemical reaction.

20. An apparatus for manufacturing a semiconductor device according to claim 15, wherein
the parameter for use in analysis is fitted for the every runs before starting the every runs.

21. An apparatus for manufacturing a semiconductor device according to claim 15, wherein
the thermo-chemical reaction is one of a reaction among a making of an oxide film, a making of a silicide film, a scattering of impurities, a depositing of a thin film due to CVD, a nitriding of a film, a melting of an insulated film, and a densifying of a CVD oxide film.

22. The apparatus for manufacturing a semiconductor device according to claim 15, wherein
the process controlling device stops the process of manufacturing a semiconductor device when an expected final processing state of the target element reaches the target value, so that an actual finished processing state of the target element reaches the target value.

23. The apparatus for manufacturing a semiconductor device according to claim 15, wherein
the process controlling device indirectly measures the processing state of the target element by using the measurement data to compute the processing state.

24. The apparatus for manufacturing a semiconductor device according to claim 15, wherein
the processing state is one of a scattering length of impurities, a thickness of a film, a nitriding quantity of a nitride film, a melt quantity of a film, and a density quantity of a film.

25. An apparatus for manufacturing a semiconductor device according to claim 15, further comprising:
the process controlling device generates a stop signal to end the process when the process controlling device predicts that the processing state of the target element has reached the target value.

26. An apparatus for manufacturing a semiconductor device according to claim 15, wherein said measuring instrument intermittently carries out said measurement with a predetermined interval and said process controlling device carries out said analysis in the order in which said measurement data is obtained, and wherein, when said feedback is carried out, parameters associated with control of said process of manufacturing a semiconductor are corrected in time series in the order in which said measurement data and said analysis data are obtained based on said analysis data.

27. An apparatus for manufacturing a semiconductor device according to claim 26, wherein said measuring instrument carries out said measurement at a plurality of portions in said atmosphere and said process controlling device can execute said analysis, said feedback, and said parameter correction at the same time.

28. An apparatus for manufacturing a semiconductor device according to claim 27, wherein said process controlling device arbitrarily sets said atmosphere in said process carrying out section and executes said analysis, said feedback, and said parameter correction so that said manufacturing process is carried out in accordance with the setting.

29. An apparatus for manufacturing a semiconductor device according to claim 28, wherein said process controlling device can execute said atmosphere setting in said process carrying out section and said analysis respectively in time series in the order in which said measurement data is obtained.

30. A method of controlling a semiconductor device manufacturing apparatus comprising:
controlling a process carrying out section which carries out a process of manufacturing a semiconductor device utilizing a thermo-chemical reaction, thereby starting the manufacturing process after receiving a start signal;
analyzing a processing state of a target element associated with the thermo-chemical reaction in real time for each run, based on measurement data obtained by measuring, in real time, a plurality of process parameters defining a state function of an atmosphere associated with the thermo-chemical reaction, and which changes for each run; and
predicting in real time whether or not the processing state of the target element reaches a target value associated with an end condition based on analysis data obtained by the analysis at any time,
wherein the manufacturing process is controlled so that the processing state of the target element reaches the target value from a start to an end of the manufacturing process without being bound by a predetermined proceeding schedule of the manufacturing process.

31. A method of controlling a semiconductor device manufacturing apparatus according to claim 30, wherein
the parameter for use in analysis is fitted for the every runs before starting the every runs.

32. A method of controlling a semiconductor device manufacturing apparatus according to claim 30, wherein
the thermo-chemical reaction is one of a reaction among a making of an oxide film, a making of a silicide film, a scattering of impurities, a depositing of a thin film due to CVD, a nitriding of a film, a melting of an insulating film, and a densifying of a CVD oxide film.

33. The method of controlling a semiconductor device manufacturing apparatus according to claim 30, further comprising:
stopping the process of manufacturing a semiconductor device when an expected final processing state of the target element reaches the target value, so that an actual finished processing state of the target element reaches the target value.

34. The method of controlling a semiconductor device manufacturing apparatus according to claim 30, further comprising:
indirectly measuring the processing state of the target element by using the measurement data to compute the processing state.

35. The method of controlling a semiconductor device manufacturing apparatus according to claim 30, wherein
the processing state is one of a scattering length of impurities, a thickness of a film, a nitriding quantity of a nitride film, a melt quantity of a film, and a density quantity of a film.

36. A method of controlling a semiconductor device manufacturing apparatus according to claim 30, further comprising:
generating a stop signal to end the process when it is predicted that the processing state of the target element has reached the target value.

37. An apparatus for controlling a semiconductor device manufacturing apparatus comprising:
a process carrying out section controlling device which controls an operational state of a process carrying out section which carries out a process of manufacturing the semiconductor device utilizing a thermo-chemical reaction after receiving a start signal; and
a process controlling device which analyzes a processing state of a target element associated with the thermo-chemical reaction in real time for each run, based on measurement data obtained by measuring, in real time, a plurality of process parameters defining a state function of an atmosphere associated with the thermo-chemical reaction, which changes for each run, and predicts in real time whether or not the processing state of the target element reaches a target value associated with an end condition, based on analysis data obtained by the analysis at any time, and controls the manufacturing process so that the processing state of the target element reaches the target value from a start to an end of the manufacturing process without being bound by a predetermined proceeding schedule of the manufacturing process.

38. An apparatus for controlling a semiconductor device manufacturing apparatus according to claim 37, wherein
the parameter for use in analysis is fitted for the every runs before starting the every runs.

39. An apparatus for controlling a semiconductor device manufacturing apparatus according to claim 37, wherein the thermo-chemical reaction is one of a reaction among a making of an oxide film, a making of a silicide film, a scattering of impurities, a depositing of a thin film due to CVD, a nitriding of a film, a melting of an insulating film, and a densifying of a CVD oxide film.

40. The apparatus for controlling a semiconductor device manufacturing apparatus according to claim 37, wherein
the process controlling device stops the process of manufacturing a semiconductor device when an expected final processing state of the target element reaches the target value, so that an actual finished processing state of the target element reaches the target value.

41. The apparatus for controlling a semiconductor device manufacturing apparatus according to claim 37, wherein
the process controlling device indirectly measures the processing state of the target element by using the measurement data to compute the processing state.

42. The apparatus for controlling a semiconductor device manufacturing apparatus according to claim 37, wherein
the processing state is one of a scattering length of impurities, a thickness of a film, a nitriding quantity of a nitride film, a melt quantity of a film, and a density quantity of a film.

43. An apparatus for controlling a semiconductor device manufacturing apparatus according to claim 37, further comprising:
the process controlling device generates a stop signal to end the process when the process controlling device predicts that the processing state of the target element has reached the target value.

44. A method of simulating a process of manufacturing a semiconductor device comprising:

carrying out in real time simulation of a manufacturing process of a semiconductor device utilizing a thermo-chemical reaction started after receiving a start signal, wherein said simulation is carried out based on at least one of measurement data obtained by measuring, in real time, a plurality of process parameters defining a state function of an atmosphere associated with the thermo-chemical reaction, and analysis data obtained by analyzing a processing state of a target element associated with the thermo-chemical reaction in real time for each run, based on the measurement data which changes for each run; and in said simulation, prediction is made in real time whether or not the processing of the target element reaches a target value associated with an end condition while the manufacturing process is being virtually proceeded based on at least one of the measurement data and analysis data at any time; and in said simulation, the manufacturing process is controlled so that the processing state of the target element reaches the target value from a start to an end of the manufacturing process without being bound by a predetermined proceeding schedule of the manufacturing process.

45. A method of simulating a process of manufacturing a semiconductor device according to claim 44, wherein the parameter for use in analysis is fitted for the every runs before starting the every runs.

46. A method of simulating a process of manufacturing a semiconductor device according to claim 44, wherein the thermo-chemical reaction is one of a reaction among a making of an oxide film, a making of a silicide film, a scattering of impurities, a depositing of a thin film due to CVD, a nitriding of a film, a melting of an insulating film, and a densifying of a CVD oxide film.

47. The method of simulating a process of manufacturing a semiconductor device according to claim 44, wherein the processing state is one of a scattering length of impurities, a thickness of a film, a nitriding quantity of a nitride film, a melt quantity of a film, and a density quantity of a film.

48. A method of simulating a process of manufacturing a semiconductor device according to claim 44, further comprising:

generating a stop signal to end the process when it is predicted that the processing state of the target element has reached the target value.

49. An apparatus for simulating a process of manufacturing a semiconductor device comprising:

a simulator main body which carries out in real time simulation of a manufacturing process of a semiconductor device utilizing a thermo-chemical reaction started after receiving a start signal, wherein said simulation is carried out based on at least one of measurement data obtained by measuring, in real time, a plurality of process parameters defining a state function of an atmosphere associated with the thermo-chemical reaction, and analysis data obtained by analyzing a processing state of a target element associated with the thermo-chemical reaction in real time for each run, based on the measurement data which changes for each run; and in said simulation, while the manufacturing process is being virtually proceeded based on at least one of the measurement data and the analysis data, prediction is made in real time whether the processing of the target element reaches a target value associated with an end condition, proceeding or not at any time; and in said simulation, the manufacturing process is controlled so that the processing state of the target element reaches the target value from a start to an end of the manufacturing process without being bound by a predetermined proceeding schedule of the manufacturing process.

50. An apparatus for simulating a process of manufacturing a semiconductor device according to claim 49, wherein the parameter for use in analysis is fitted for the every runs before starting the every runs.

51. An apparatus for simulating a process of manufacturing a semiconductor device according to claim 49, wherein the thermo-chemical reaction is one of a reaction among a making of an oxide film, a making of a silicide film, a scattering of impurities, a depositing of a thin film due to CVD, a nitriding of a film, a melting of an insulating film, and a densifying of a CVD oxide film.

52. The apparatus for simulating a process of manufacturing a semiconductor device according to claim 49, wherein the processing state is one of a scattering length of impurities, a thickness of a film, a nitriding quantity of a nitride film, a melt quantity of a film, and a density quantity of a film.

53. An apparatus for simulating a process of manufacturing a semiconductor device according to claim 49, further comprising:

a stop signal to end the process is generated when it is predicted that the processing state of the target element has reached the target value.

* * * * *

UNITED STATES PATENT AND TRADEMARK OFFICE
CERTIFICATE OF CORRECTION

PATENT NO.         : 7,413,914 B2                                    Page 1 of 1
APPLICATION NO. : 10/108790
DATED              : August 19, 2008
INVENTOR(S)       : Ushiku et al.

It is certified that error appears in the above-identified patent and that said Letters Patent is hereby corrected as shown below:

On the title page,

[*] Notice:     Subject to any disclaimer, the term of this patent is extended or adjusted under 35 USC 154(b) by 67 days Delete the phrase "by 67 days" and insert -- by 45 days --

Signed and Sealed this

Seventeenth Day of March, 2009

JOHN DOLL
*Acting Director of the United States Patent and Trademark Office*